(12) United States Patent
Choi et al.

(10) Patent No.: US 12,433,122 B2
(45) Date of Patent: Sep. 30, 2025

(54) DISPLAY DEVICE INCLUDING LIGHT EMITTING ELEMENTS SELECTIVELY ELECTRICALLY CONNECTED TO EMIT LIGHT

(71) Applicant: Samsung Display Co., LTD., Yongin-si (KR)

(72) Inventors: Jin Woo Choi, Seoul (KR); Sung Kook Park, Suwon-si (KR); Sung Eun Baek, Suwon-si (KR); Ki Seong Seo, Seoul (KR); So Yeon Yoon, Uijeongbu-si (KR); Hyung Il Jeon, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 486 days.

(21) Appl. No.: 17/856,445

(22) Filed: Jul. 1, 2022

(65) Prior Publication Data
US 2023/0118849 A1    Apr. 20, 2023

(30) Foreign Application Priority Data

Oct. 18, 2021    (KR) .................. 10-2021-0138084

(51) Int. Cl.
*H10K 59/30*       (2023.01)
*H10K 50/81*       (2023.01)
(Continued)

(52) U.S. Cl.
CPC .............. *H10K 59/30* (2023.02); *H10K 50/81* (2023.02); *H10K 50/82* (2023.02); *H10K 71/00* (2023.02)

(58) Field of Classification Search
CPC ........ H10K 59/30; H10K 50/81; H10K 50/82; H10K 71/00; H10K 59/122; H10K 59/173;
(Continued)

(56) References Cited

U.S. PATENT DOCUMENTS

| 2003/0044639 | A1* | 3/2003 | Fukuda | ................. | H10K 59/35 |
| | | | | | 428/917 |
| 2016/0072066 | A1* | 3/2016 | Lee | ....................... | H10K 71/00 |
| | | | | | 438/35 |

(Continued)

FOREIGN PATENT DOCUMENTS

KR           101196579 B1     11/2012
WO           2020/080603      4/2020

*Primary Examiner* — Jacob Y Choi
*Assistant Examiner* — Grace Cha
(74) *Attorney, Agent, or Firm* — CANTOR COLBURN LLP

(57) ABSTRACT

A display device includes anode electrodes spaced apart from each other on a substrate, light emitting elements on the anode electrodes, mask layers on some of the light emitting elements, an insulating layer on the substrate and the anode electrodes and surrounding the light emitting elements, and a cathode electrode on the insulating layer and contacting some of the light emitting elements and the mask layers, the light emitting elements include first light emitting elements on a first anode electrode and emitting light of a first color, and second light emitting elements on the first anode electrode and emitting light of a second color, and third light emitting elements on the first anode electrode and emitting light of a third color, and the mask layer includes a first mask layer on the second light emitting elements, and a second mask layer on the third light emitting elements.

14 Claims, 45 Drawing Sheets

(51) Int. Cl.
*H10K 50/82* (2023.01)
*H10K 71/00* (2023.01)

(58) Field of Classification Search
CPC .. H10K 71/80; H10K 59/353; H01L 25/0753; H10D 84/858; H10D 30/0295; A01N 1/146; A23B 2/40; H10H 29/24; H10H 29/32; H10H 29/34; H10H 29/362
See application file for complete search history.

(56) References Cited

U.S. PATENT DOCUMENTS

| | | | |
|---|---|---|---|
| 2016/0197123 A1* | 7/2016 | Sung | H10K 59/35 257/40 |
| 2018/0197844 A1 | 7/2018 | Higginson et al. | |
| 2020/0111846 A1* | 4/2020 | Takahara | H10K 71/00 |
| 2021/0202653 A1* | 7/2021 | Cho | H10K 59/131 |

* cited by examiner

DISPLAY DEVICE INCLUDING LIGHT EMITTING ELEMENTS SELECTIVELY ELECTRICALLY CONNECTED TO EMIT LIGHT

CROSS-REFERENCE TO RELATED APPLICATION(S)

This application claims priority to and benefits of Korean Patent Application No. 10-2021-0138084 under 35 U.S.C. § 119 filed on Oct. 18, 2021 in the Korean Intellectual Property Office, the entire contents of which are incorporated herein by reference.

BACKGROUND

1. Technical Field

The disclosure relates to a display device and a method for fabrication thereof.

2. Description of the Related Art

With the advancement of an information-oriented society, more and more demands are placed on display devices for displaying images in various ways. The display device may be a flat panel display device such as a liquid crystal display, a field emission display and a light emitting display. A light emitting display device may include an organic light emitting display device including an organic light emitting diode as a light emitting element or an inorganic light emitting display device including an inorganic semiconductor device as a light emitting element.

Recently, a head mounted display including the light emitting display device has been developed. The head mounted display (HMD) is a glasses type monitor device of virtual reality (VR) or augmented reality (AR), which is worn in the form of glasses or a helmet to form a focal point at a close distance in front of a user's eyes.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide an ultra-high resolution display device including inorganic light emitting elements and including a larger number of emission areas per unit area.

Aspects of the disclosure provide a display device in which the same type of light emitting elements are disposed in each area, but only some light emitting elements may selectively emit light.

Aspects of the disclosure provide a method for fabricating a display device in which a manufacturing process has been simplified by simplifying a process of transferring light emitting elements to different areas.

However, aspects of the disclosure are not restricted to those set forth herein. The above and other aspects of the disclosure will become more apparent to one of ordinary skill in the art to which the disclosure pertains by referencing the detailed description of the disclosure given below.

According to an embodiment, a display device may include anode electrodes spaced apart from each other on a substrate; light emitting elements disposed on the anode electrodes; mask layers disposed on some of the light emitting elements; an insulating layer disposed on the substrate and the anode electrodes and surrounding the light emitting elements; and a cathode electrode disposed on the insulating layer and contacting some of the light emitting elements and the mask layers, wherein the light emitting elements comprise first light emitting elements disposed on a first anode electrode and emitting light of a first color; and second light emitting elements disposed on the first anode electrode and emitting light of a second color; and third light emitting elements disposed on the first anode electrode and emitting light of a third color, and the mask layer comprises a first mask layer disposed on the second light emitting elements; and a second mask layer disposed on the third light emitting elements.

The first mask layer may comprise a first base layer; and a first upper layer disposed on the first base layer, and the second mask layer may comprise a second base layer having a thickness greater than a thickness of the first base layer; and a second upper layer disposed on the second base layer.

The first base layer and the second base layer may comprise a same material, and the first upper layer and the second upper layer may comprise a same material.

The first base layer and the second base layer may comprise at least one of silicon oxide, silicon nitride, and silicon oxynitride, and the first upper layer and the second upper layer may comprise a metal material.

The cathode electrode may directly contact the first light emitting elements and may not contact the second light emitting elements and the third light emitting elements, and the cathode electrode may be in direct contact each of the first mask layer and the second mask layer.

The anode electrode may comprise a second anode electrode spaced apart from the first anode electrode, the light emitting elements may comprise fourth light emitting elements disposed on the second anode electrode and emitting light of the first color; fifth light emitting elements disposed on the second anode electrode and emitting light of the second color; and sixth light emitting elements disposed on the second anode electrode and emitting light of the third color; and the mask layer may comprise a third mask layer disposed on the fourth light emitting elements; and a fourth mask layer disposed on the sixth light emitting elements.

A thickness of the third mask layer may be greater than a thickness of the fourth mask layer.

The third mask layer, the fourth mask layer, and the first base layer may comprise a same material.

A thickness of the second base layer may be greater than a thickness of the fourth mask layer.

An interval between any one of the first light emitting elements and any one of the second light emitting elements may be different from an interval between another one of the first light emitting elements and another one of the second light emitting elements.

An interval between any one of the fourth light emitting elements and any one of the fifth light emitting elements may be different from an interval between another one of the fourth light emitting elements and another one of the fifth light emitting elements, and may be equal to an interval between any one of the first light emitting elements and any one of the second light emitting elements.

The anode electrode may comprise a third anode electrode spaced apart from the first anode electrode, the light emitting elements may comprise seventh light emitting elements disposed on the third anode electrode and emitting light of the first color; eighth light emitting elements disposed on the third anode electrode and emitting light of the second color; and ninth light emitting elements disposed on the third anode electrode and emitting light of the third color, and the mask layer may comprise a fifth mask layer disposed on the seventh light emitting elements; and a sixth mask layer disposed on the eighth light emitting elements.

The sixth mask layer may comprise a third base layer having a thickness less than a thickness of the fifth mask layer; and a third upper layer disposed on the third base layer, and the third upper layer and the first upper layer may comprise a same material.

A thickness of the second base layer may be greater than a thickness of the third base layer.

According to an embodiment, a method for fabrication of a display device, may include forming first light emitting elements and forming a first hard mask layer on the first light emitting elements, and forming second light emitting elements and forming a second hard mask layer on the second light emitting elements; transferring the first light emitting elements and the second light emitting elements onto a substrate on which anode electrodes spaced apart from each other are formed; removing the first hard mask layer formed on the first light emitting elements transferred onto a first anode electrode and removing a part of the second hard mask layer formed on the second light emitting elements transferred onto the first anode electrode; and removing the second hard mask layer formed on the second light emitting elements transferred onto a second anode electrode spaced apart from the first anode electrode and removing a part of the first hard mask layer formed on the first light emitting elements transferred onto the second anode electrode.

The second hard mask layer may include a first mask base layer; a first mask intermediate layer disposed on the first mask base layer; and a first mask upper layer disposed on the first mask intermediate layer; the first hard mask layer, the first mask base layer, and the first mask upper layer may comprise a same material and the first hard mask layer and the first mask upper layer may comprise different materials.

In the removing of the first hard mask layer, a first etching step of etching the first hard mask layer may be performed, and the second hard mask layer may form a first mask layer disposed on the second light emitting elements disposed on the first anode electrode without etching the first mask intermediate layer while etching the first mask upper layer in the first etching step.

The removing of the second hard mask layer may comprise a second etching step of etching the first mask upper layer; a third etching step of etching the first mask intermediate layer; and a fourth etching step of etching the first mask base layer; a portion of the first hard mask layer may be etched in the second etching step and the fourth etching step, and the remaining portion of the first hard mask layer may form a second mask layer disposed on the first light emitting elements disposed on the second anode electrode.

The second hard mask layer may comprise a second mask base layer; and a second mask upper layer disposed on the second mask base layer, the first hard mask layer and the second mask base layer may comprise a same material and the first hard mask layer and the second mask upper layer may comprise different materials.

In the removing of the first hard mask layer, a first etching step of etching the first hard mask layer may be performed, and the second mask upper layer of the second hard mask layer may be not etched in the first etching step.

The method for fabricating a display device according to one embodiment is advantageous in that the manufacturing process is simple by omitting a process of aligning a substrate and the transfer substrate of the light emitting elements because different types of light emitting elements are disposed regardless of positions and types of emission areas.

In the display device according to one embodiment, even in case that different types of light emitting elements are mixed in the emission areas, only specific light emitting elements may selectively emit light because mask layers of different structures are formed in each of the light emitting elements.

However, the effects of the disclosure are not limited to the aforementioned effects, and various other effects are included in the specification.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
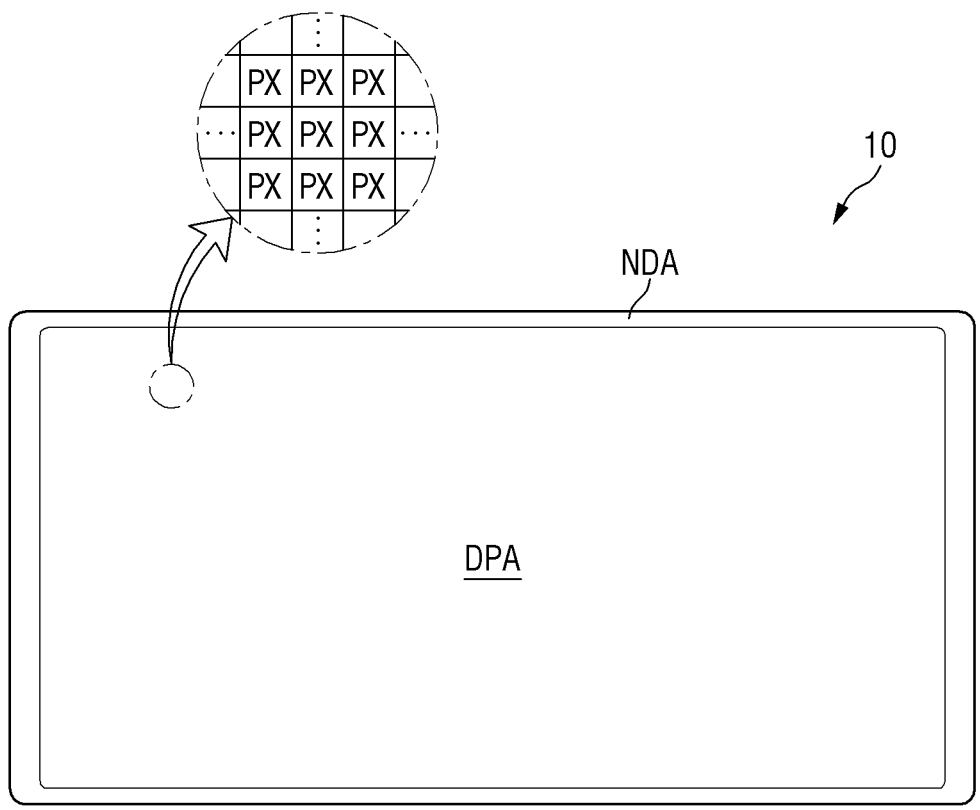
FIG. 1 is a schematic perspective view of a display device according to one embodiment.

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will also be understood that when a layer is referred to as being "on" another layer or substrate, it can be directly on the other layer or substrate, or intervening layers may also be present. Further, it will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween. The same reference numbers indicate the same components throughout the specification.

It will be understood that the terms "connected to" or "coupled to" may include a physical or electrical connection or coupling.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be described with reference to the accompanying drawings.

FIG. 1 is a schematic perspective view of a display device according to one embodiment.

Referring to FIG. 1, a display device 10 displays a moving image or a still image. The display device 10 may refer to any electronic device providing a display screen. Examples of the display device 10 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which provide a display screen.

The display device 10 may include a display panel which provides a display screen. Examples of the display panel may include an inorganic light emitting diode display panel, an organic light emitting display panel, a quantum dot light emitting display panel, a plasma display panel and a field emission display panel. In the following description, a display device in which inorganic light emitting diodes are disposed on a semiconductor circuit board is illustrated as an example of the display panel. However, the disclosure is not limited thereto, and may be applied to other display panels as long as the same technical spirit is applicable.

The shape of the display device 10 may be variously modified. For example, the display device 10 may have a shape such as a rectangular shape elongated in a horizontal direction, a rectangular shape elongated in a vertical direction, a square shape, a quadrilateral shape with rounded corners (vertices), another polygonal shape and a circular shape. The shape of a display area DPA of the display device 10 may also be similar to the overall shape of the display device 10. FIG. 1 illustrates the display device 10 having a rectangular shape elongated in a second direction DR2. It is to be understood that the shapes disclosed herein may include shapes substantial to those shapes disclosed herein.

In this specification, a first direction DR1 indicates a vertical direction of the display device 10, the second direction DR2 indicates a horizontal direction of the display device 10, and a third direction DR3 indicates a thickness direction of the display device 10. In this specification, "upper side," "top," and "top surface" indicate one side of the third direction DR3, and "lower side," "bottom" and "bottom surface" indicate the other side of the third direction DR3. "Left," "right," "upper," and "lower" indicate directions in case that the drawing is viewed from above. For example, "upper" and "lower" indicate the first direction DR1, and "left" and "right" indicate the second direction DR2.

The display device 10 may include the display area DPA and a non-display area NDA. The display area DPA is an area where a screen can be displayed, and the non-display area NDA is an area where a screen is not displayed. The display area DPA may also be referred to as an active region, and the non-display area NDA may also be referred to as a non-active region. The display area DPA may be substantially disposed at the center of the display device 10.

The non-display area NDA may be disposed around the display area DPA. The non-display area NDA may completely or partially surround or may be adjacent to the display area DPA. The display area DPA may have a rectangular shape, and the non-display area NDA may be disposed adjacent to four sides of the display area DPA. The non-display area NDA may form a bezel of the display device 10. Wires or circuit drivers included in the display device 10 may be disposed in the non-display area NDA, or external devices may be mounted thereon.

Figure 2:
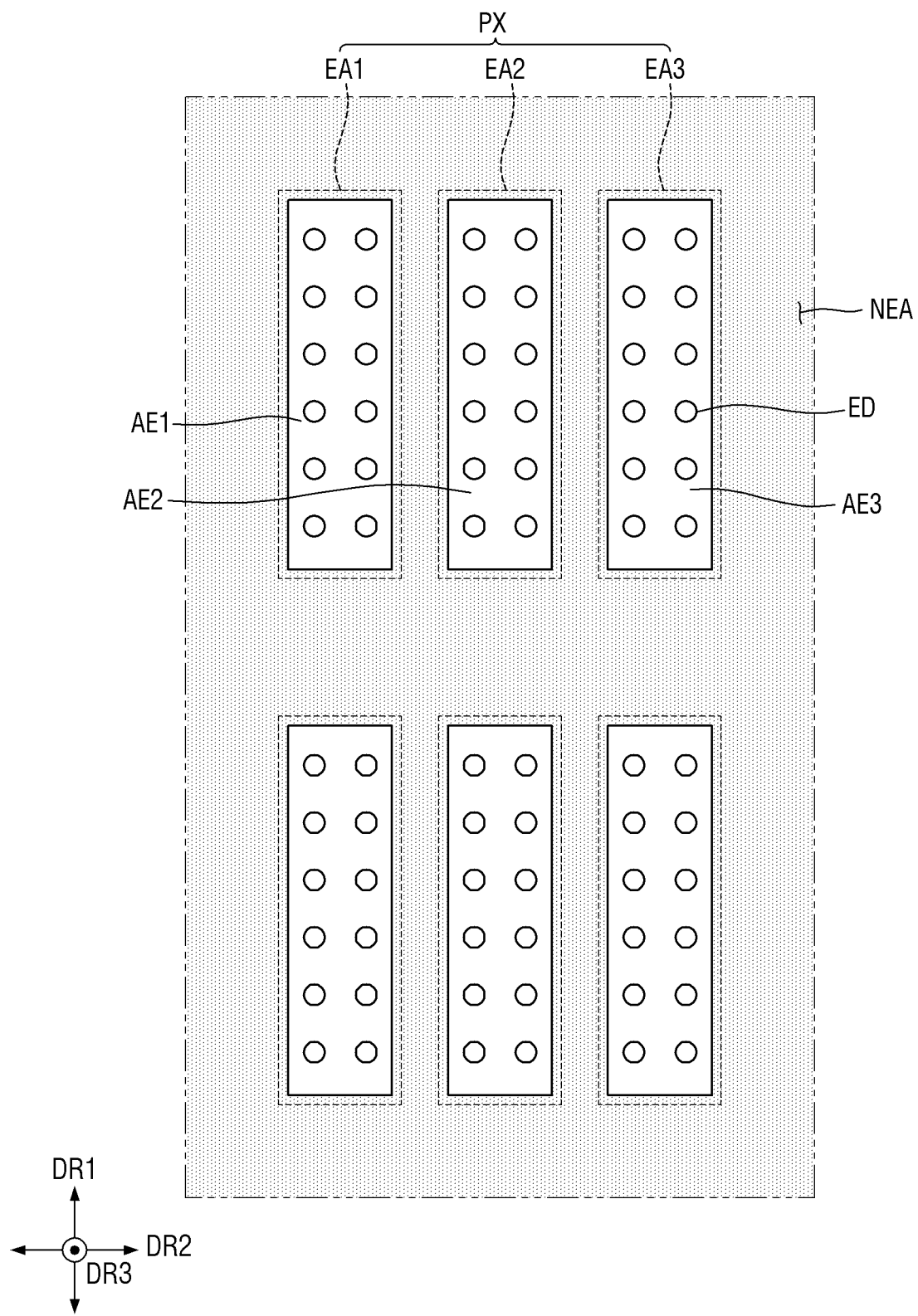
FIG. 2 is a schematic plan view illustrating an arrangement of emission areas of a display device according to one embodiment.
Figure 3:
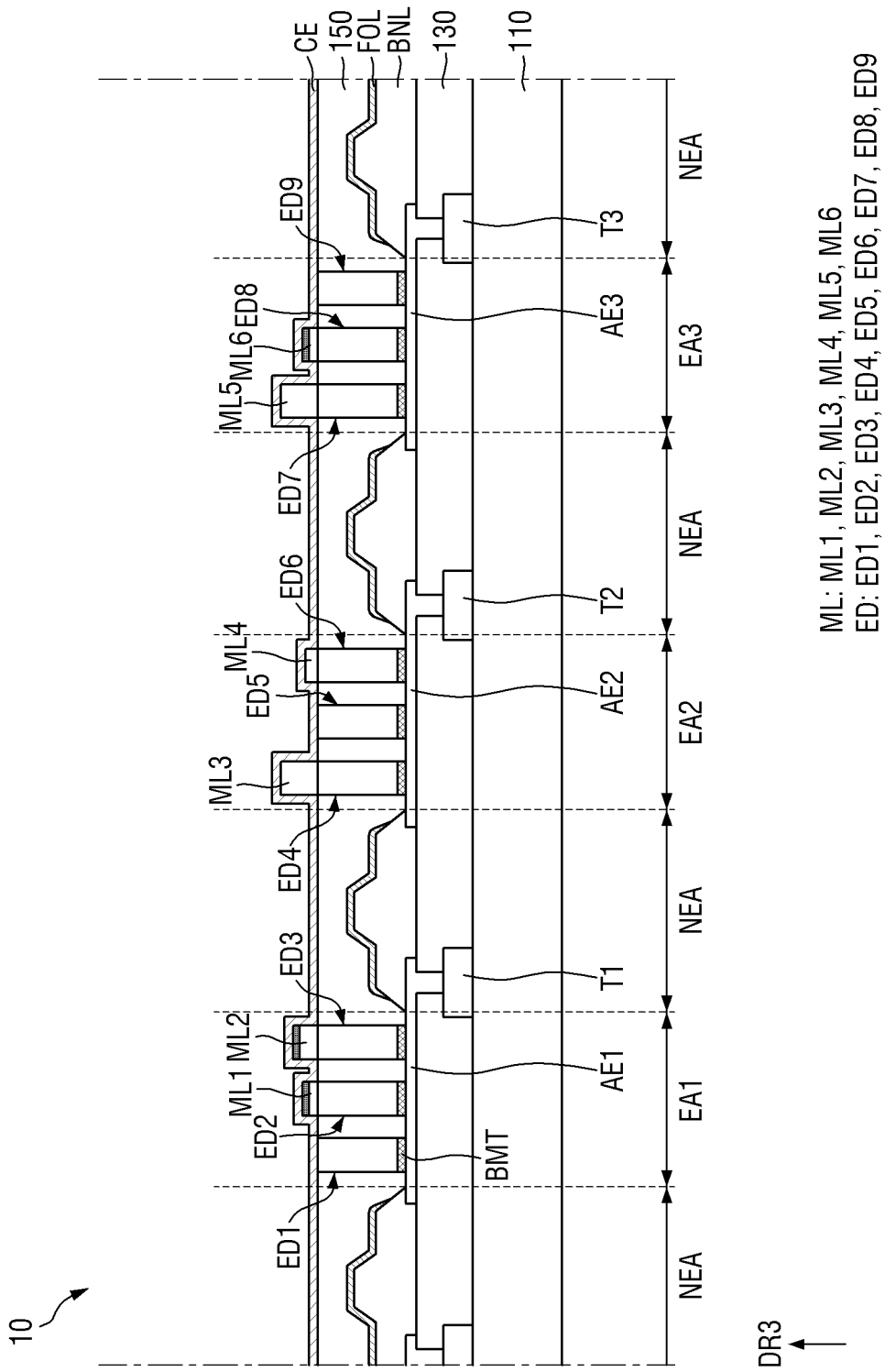
FIG. 3 is a schematic cross-sectional view of a display device according to one embodiment.

FIG. 2 is a schematic plan view illustrating arrangement of emission areas of a display device according to one embodiment. FIG. 3 is a schematic cross-sectional view of a display device according to one embodiment.

Referring to FIGS. 2 and 3, the display device 10 may include pixels PX. The pixels PX may be arranged (or disposed) in a matrix. The shape of each pixel PX may be a rectangular or square shape in a plan view. However, the disclosure is not limited thereto, and it may be a rhombic shape in which each side is inclined with respect to one direction or a direction. The pixels PX may be arranged in a stripe type or an island type. Each of the pixels PX may include one or more light emitting elements that emit light of a specific wavelength band to display a specific or selected color.

Each of the pixels PX may include emission areas EA1, EA2, and EA3. In the display device 10, one pixel PX including the emission areas EA1, EA2, and EA3 may have a minimum light emitting unit.

For example, one pixel PX may include a first emission area EA1, a second emission area EA2, and a third emission area EA3. The first emission area EA1 may emit light of a first color, the second emission area EA2 may emit light of a second color, and the third emission area EA3 may emit light of a third color. For example, the first color may be red, the second color may be green, and the third color may be blue. However, the disclosure is not limited thereto, and the emission areas EA1, EA2, and EA3 may emit light of a same color. In one embodiment, one pixel PX may include three emission areas EA1, EA2, and EA3, but the disclosure is not limited thereto. For example, one pixel PX may include four or more emission areas.

The emission areas EA1, EA2, and EA3 may be arranged in the first direction DR1 and the second direction DR2, and the first emission area EA1, the second emission area EA2, and the third emission area EA3 may be arranged alternately in the first direction DR1. Since the pixels PX are arranged in the first direction DR1 and the second direction DR2, the first emission area EA1, the second emission area EA2, and the third emission area EA3 may be sequentially disposed in the first direction DR1, and such arrangement may be repeated. Further, the first emission area EA1, the second emission area EA2, and the third emission area EA3 may be repeatedly arranged in the second direction DR2.

The display device 10 may include a first substrate 110 and anode electrodes AE1, AE2, and AE3 disposed on the first substrate 110, light emitting elements ED, and a cathode electrode CE. The display device 10 may further include switching elements T1, T2, and T3 and insulating layers 130 and 150 disposed on the first substrate 110.

The first substrate 110 may be an insulating substrate. The first substrate 110 may include a transparent material. For example, the first substrate 110 may include a transparent insulating material such as glass, quartz, or the like within the spirit and the scope of the disclosure. The first substrate 110 may be a rigid substrate. However, the first substrate 110 is not limited thereto. The first substrate 110 may include plastic such as polyimide or the like, and may have a flexible property such that it can be twisted, bent, folded, or rolled. The first substrate 110 may include emission areas EA1, EA2, and EA3 and a non-emission area NEA.

The switching elements T1, T2, and T3 may be disposed on the first substrate 110. In one embodiment, the switching elements T1, T2, and T3 may include a first switching element T1 disposed in the first emission area EA1, a second switching element T2 disposed in the second emission area EA2, and a third switching element T3 disposed in the third emission area EA3. Although not shown in the drawing, the display device 10 may further include a switching element disposed in the non-emission area NEA.

In one embodiment, each of the first switching element T1, the second switching element T2, and the third switching element T3 may be a thin film transistor including amorphous silicon, polysilicon, or an oxide semiconductor. Although not shown in the drawing, signal lines (for example, a gate line, a data line, a power line, and the like) that transmit signals to the switching elements may be further positioned on the first substrate 110.

The first insulating layer 130 may be disposed on the first substrate 110 and the switching elements T1, T2, and T3. In one embodiment, the first insulating layer 130 may include an organic insulating layer to compensate a stepped portion formed by the switching elements T1, T2, and T3. For example, the first insulating layer 130 may include acrylic resin, epoxy resin, imide resin, ester resin, or the like within the spirit and the scope of the disclosure. In one embodiment, the first insulating layer 130 may include a positive photosensitive material or a negative photosensitive material.

The anode electrodes AE1, AE2, and AE3 may be disposed on the first insulating layer 130. The anode electrodes AE1, AE2, and AE3 may be disposed to correspond to the emission areas EA1, EA2, and EA3, respectively. The anode electrodes AE1, AE2, and AE3 may be arranged to be spaced apart from each other in the first direction DR1 and the second direction DR2, similar to the emission areas EA1, EA2, and EA3. The anode electrodes AE1, AE2, and AE3 may have a quadrilateral shape including sides extending in the first direction DR1 and the second direction DR2 in a plan view. However, the disclosure is not limited thereto, and the planar shape of the anode electrodes AE1, AE2, and AE3 may be variously modified depending on the arrangement and structures of the emission areas EA1, EA2, and EA3 of the display device 10. For example, in case that the emission areas EA1, EA2, and EA3 are arranged in a PENTILE™ type, the arrangement of the anode electrodes AE1, AE2, and AE3 may also vary in response thereto, and the planar shape of the anode electrodes AE1, AE2, and AE3 may also be modified to a polygonal shape, a circular shape, or the like within the spirit and the scope of the disclosure.

The anode electrodes AE1, AE2, and AE3 may include a first anode electrode AE1 disposed in the first emission area EA1, a second anode electrode AE2 disposed in the second emission area EA2, and a third anode electrode AE3 disposed in the third emission area EA3. The first anode electrode AE1 may be electrically connected to the first switching element T1 while penetrating the first insulating layer 130, the second anode electrode AE2 may be electrically connected to the second switching element T2 while penetrating the first insulating layer 130, and the third anode electrode AE3 may be electrically connected to the third switching element T3 while penetrating the first insulating layer 130.

The first anode electrode AE1, the second anode electrode AE2, and the third anode electrode AE3 may contain a material having a high reflectivity. For example, the first anode electrode AE1, the second anode electrode AE2, and the third anode electrode AE3 may have a structure in which a material layer having a high work function such as titanium oxide ($TiO_2$), indium tin oxide (ITO), indium zinc oxide (IZO), zinc oxide (ZnO), indium tin zinc oxide (ITZO), or magnesium oxide (MgO), and a material layer having a high reflectivity such as silver (Ag), magnesium (Mg), aluminum (Al), platinum (Pt), lead (Pd), gold (Au), nickel (Ni), neodium (Nd), iridium (Ir), chromium (Cr), lithium (Li), calcium (Ca), or a mixture thereof may be stacked each other. The material layer having a high work function may be disposed above the material layer having a high reflectivity and disposed adjacent to the light emitting element ED. The first anode electrode AE1, the second anode electrode AE2, and the third anode electrode AE3 may have a multilayer structure of ITO/Mg, ITO/MgF, ITO/Ag, and ITO/Ag/ITO, but the disclosure is not limited thereto.

A bank layer BNL may be disposed on the first insulating layer 130 and the anode electrodes AE1, AE2, and AE3. The bank layer BNL may include openings exposing a part of each of the anode electrodes AE1, AE2, and AE3. The opening of the bank layer BNL may delimit the emission areas EA1, EA2, and EA3 and the non-emission areas NEA. For example, among the openings of the bank layer BNL, the opening exposing the first anode electrode AE1 may be the first emission area EA1, and the openings exposing the second anode electrode AE2 and the third anode electrode AE3 may be the second emission area EA2 and the third emission area EA3, respectively. The area where the bank layer BNL is disposed may be the non-emission area NEA.

The bank layer BNL may include an inorganic insulating material, for example, acrylic resin, epoxy resin, phenolic resin, polyamide resin, polyimide resin, unsaturated polyester resin, polyphenylene resin, polyphenylenesulfide resin, benzocyclobutene (BCB), or the like within the spirit and the scope of the disclosure.

A first organic layer FOL may be disposed on the bank layer BNL. The first organic layer FOL may be disposed to overlap the non-emission area NEA without overlapping the emission areas EA1, EA2, and EA3. The first organic layer FOL may be disposed on or directly disposed on the bank layer BNL while being spaced apart from the anode electrodes AE1, AE2, and AE3 adjacent thereto. The first organic layer FOL may be disposed on the entire first substrate 110, and may be disposed to surround the emission areas EA1, EA2, and EA3. The first organic layer FOL may be disposed in a lattice shape as a whole.

The first organic layer FOL may contain a polyimide-based compound. The polyimide-based compound of the first organic layer FOL may have a cyano group to absorb light having a wavelength of about 308 nm, for example, laser light. As an example, in an embodiment, each of the first organic layer FOL and the bank layer BNL may contain a polyimide-based compound, but they may contain different polyimide-based compounds. For example, the bank layer BNL may be made of a polyimide-based compound having no cyano group, and the first organic layer FOL may be made of a polyimide-based compound having a cyano group.

The light emitting elements ED may be disposed on the anode electrodes AE1, AE2, and AE3. The light emitting element ED may be disposed on the anode electrodes AE1, AE2, and AE3 in the emission areas EA1, EA2, and EA3. The light emitting element ED may be an inorganic light emitting diode. The light emitting element ED may include semiconductor layers SEM1, SEM2, EBL, and SLT (see FIG. 8) and an active layer MQW (see FIG. 8) to receive an electrical signal and emit light.

The light emitting element ED may have a shape extending in the third direction DR3. The length of the light emitting element ED in the third direction DR3 may be longer than the length thereof in a horizontal direction. For example, the length of the light emitting element ED in the third direction DR3 may be approximately 1 µm to 5 µm. The light emitting element ED may have a cylindrical shape that is longer in a width than in a height, a disc shape, or a rod shape. However, the disclosure is not limited thereto, and the light emitting element ED may have various shapes, such as a rod shape, a wire shape, a tube shape, a polygonal prism shape such as a regular cube, a rectangular parallelepiped and a hexagonal prism, or a shape extending in one direction or in a direction and having a partially inclined outer surface. A more detailed description of the light emitting element ED will be given later. It is to be understood that the shapes disclosed herein may include shapes substantial to those shapes disclosed herein.

A connection electrode BMT may be disposed on or directly disposed on the anode electrodes AE1, AE2, and AE3. The connection electrode BMT may be in contact with or in direct contact with the anode electrodes AE1, AE2, and AE3 and the light emitting element ED to electrically connect them. The connection electrode BMT may be an ohmic connection electrode or a Schottky connection electrode. Although it is illustrated in the drawing that one connection electrode BMT is disposed to correspond to one light emitting element ED, the disclosure is not limited thereto. For example, one connection electrode BMT may be connected to light emitting elements ED, or connection electrodes BMT may be connected to one light emitting element ED. As an example, the connection electrode BMT may be omitted. In the embodiment in which the light emitting elements ED are disposed in each of the emission areas EA1, EA2 and EA3, the connection electrodes BMT may be disposed on the anode electrodes AE1, AE2 and AE3 respectively disposed in the emission areas EA1, EA2 and EA3.

The connection electrode BMT may contain a conductive metal material. For example, the connection electrode BMT may include at least one of gold (Au), copper (Cu), tin (Sn), titanium (Ti), aluminum (Al), or silver (Ag). For example, the connection electrode BMT may contain a 9:1 alloy, a 8:2 alloy or a 7:3 alloy of gold and tin, or may contain an alloy (SAC305) of copper, silver, and tin. Since the connection electrode BMT is in direct contact with and connected to the anode electrodes AE1, AE2, and AE3, the connection electrode BMT may be made of a same material (or a similar material) as that of the anode electrodes AE1, AE2, and AE3. Accordingly, the adhesive property between the connection electrode BMT and the anode electrodes AE1, AE2, and AE3 may be improved, so that contact characteristics may be improved.

In accordance with one embodiment, in the display device 10, different light emitting elements ED (ED1 to ED9) may be disposed in the emission areas EA1, EA2, and EA3, and the display device 10 may include mask layers ML (ML1 to ML6) disposed on some of the light emitting elements ED disposed in the emission areas EA1, EA2, and EA3. The light emitting elements ED may emit lights of different colors depending on the material of the active layer MQW. The light emitting elements ED may be classified into different types of light emitting elements ED depending on the material of the active layer MQW, and different types of light emitting elements ED may be disposed in each of the emission areas EA1, EA2, and EA3. For example, a first light emitting element ED1, a second light emitting element ED2, and a third light emitting element ED3, which are different types of light emitting elements, may be disposed in the first emission area EA1. A fourth light emitting element ED4, a fifth light emitting element ED5, and a sixth light emitting element ED6, which are different types of light emitting elements, may be disposed in the second emission area EA2, and a seventh light emitting element ED7, an eighth light emitting element ED8, and a ninth light emitting element ED9, which are different types of light emitting elements, may be disposed in the third emission area EA3. Among the light emitting elements ED disposed in any one of the emission areas EA1, EA2, and EA3, some light emitting elements (for example, the first light emitting element ED1, the fifth light emitting element ED5, and the ninth light emitting element ED9) may be in contact with or in direct contact with the cathode electrode CE because the mask layer ML is not disposed thereon. On the other hand, different mask layers ML (ML1 to ML6) may be disposed on the other light emitting elements ED to avoid direct contact with the cathode electrode CE. The display device 10 may include different types of light emitting elements ED in each of the emission areas EA1, EA2, and EA3, and the mask layer ML is selectively disposed thereon, so that only some light emitting elements ED may emit light. A more detailed description thereof will be given later with reference to other drawings.

The second insulating layer 150 may be disposed on the bank layer BNL and the anode electrodes AE1, AE2, and AE3. The second insulating layer 150 may flatten a stepped portion disposed thereunder so that the cathode electrode CE to be described later may be formed. The second insulating layer 150 may be formed to have a height so that the mask layer ML disposed on the light emitting elements ED may protrude upward from the second insulating layer 150. With respect to the top surfaces of the anode electrodes AE1, AE2, and AE3, the height of the second insulating layer 150 may be the same as the height of the light emitting element ED, and the mask layers ML may protrude from the top surface of the second insulating layer 150. The second insulating layer 150 may be disposed to surround the light emitting elements ED.

The second insulating layer 150 may include an organic insulating material. For example, the second insulating layer 150 may include acrylic resin, epoxy resin, phenolic resin, polyamide resin, polyimide resin, unsaturated polyester resin, polyphenylene resin, polyphenylenesulfide resin, benzocyclobutene (BCB), or the like within the spirit and the scope of the disclosure.

The cathode electrode CE may be disposed on the second insulating layer 150, the light emitting elements ED, and the mask layer ML. For example, the cathode electrode CE may be disposed on one surface or a surface of the first substrate 110 on which the light emitting element ED is formed, and may be disposed in the entire display area DPA and the entire non-display area NDA. The cathode electrode CE may be disposed to overlap each of the emission areas EA1, EA2, and EA3 in the display area DPA, and may have a small thickness so that light may be emitted.

The cathode electrode CE may be disposed on or directly disposed on the top surfaces of some of the light emitting elements ED and the top surfaces of the mask layers ML. The cathode electrode CE may be a common layer that covers or overlaps the light emitting elements ED and connects the light emitting elements ED in common, and a common voltage may be applied to each light emitting element ED. However, among the light emitting elements ED, the light emitting elements ED on which the mask layers ML are disposed may not be in direct contact with the cathode electrode CE.

In one of the emission areas EA1, EA2, and EA3, the mask layer ML may not be disposed on some light emitting elements ED, and the mask layer ML may be disposed on the other light emitting elements ED. Accordingly, a stepped portion may be formed on the second insulating layer 130 depending on the arrangement of the mask layer ML, and the height of the cathode electrode CE may be partially different due to the stepped portion.

Since the cathode electrode CE is disposed on the entire first substrate 110 and a common voltage is applied thereto, the cathode electrode CE may contain a material having a low resistance. Further, the cathode electrode CE may be formed to have a small thickness to readily transmit light. For example, the cathode electrode CE may contain a material having a low resistance, such as aluminum (Al), silver (Ag), copper (Cu), or the like within the spirit and the scope of the disclosure. The thickness of the cathode electrode CE may be about 10 Å to 200 Å, but is not limited thereto.

The light emitting elements ED may receive a pixel voltage from the anode electrodes AE1, AE2, and AE3 through the connection electrode BMT, and may receive the common voltage through the cathode electrode CE. The light emitting element ED may emit light at a luminance depending on a voltage difference between the pixel voltage and the common voltage. Among the light emitting elements ED, the light emitting elements on which the mask layers ML are not disposed (for example, the first light emitting element ED1, the fifth light emitting element ED5, and the ninth light emitting element ED9) may emit light because both ends thereof are electrically connected to the anode electrodes AE1, AE2, and AE3 and the cathode electrode CE. However, the other light emitting elements ED may not emit light because one ends thereof are not electrically connected to the cathode electrode CE. In the display device 10 according to one embodiment, only some light emitting elements ED may selectively emit light in each of the emission areas EA1, EA2, and EA3.

Each pixel PX may include a pixel driving circuit. The pixel driving circuit may include transistors and capacitors. The number of transistors and capacitors of each pixel driving circuit may be variously modified. Hereinafter, the pixel driving circuit will be described in conjunction with a 3T1C structure including three transistors and one capacitor as an example. However, the disclosure is not limited thereto, and other modified pixel PX structures such as a 2T1C structure, a 7T1C structure, and a 6T1C structure may be adopted.

Figure 4:
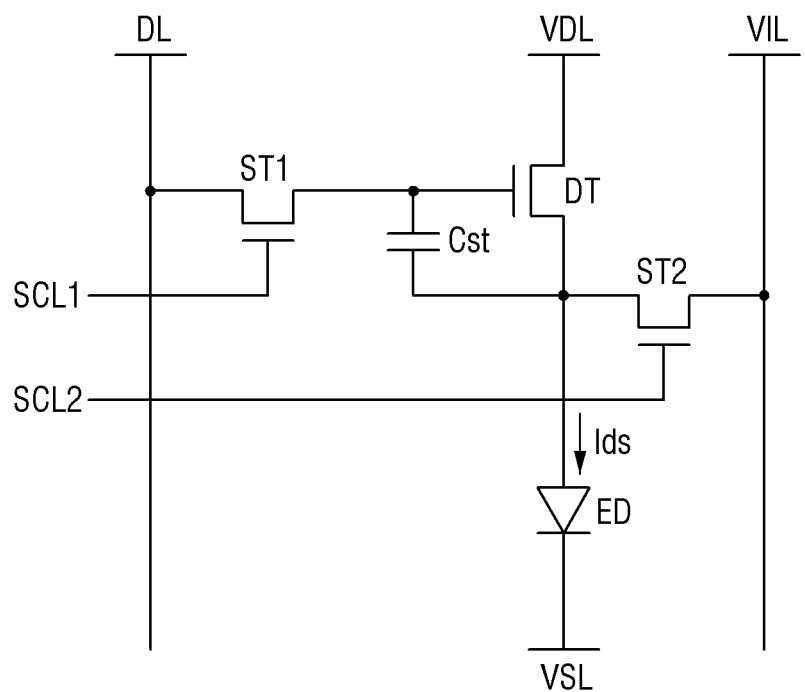
FIG. 4 is a schematic diagram of an equivalent circuit of one pixel of a display device according to one embodiment.

FIG. 4 is a schematic diagram of an equivalent circuit of one pixel of a display device according to one embodiment. FIG. 4 illustrates an example of a pixel circuit diagram included in one pixel PX of FIG. 2.

Referring to FIG. 4, the light emitting element ED emits light in response to a driving current Ids. A light emission amount of the light emitting element ED may be proportional to the driving current Ids. The light emitting element ED may be an anode electrode, a cathode electrode, and an inorganic light emitting element including an inorganic semiconductor disposed between the anode electrode and the cathode electrode.

The anode electrode of the light emitting element ED may be connected to the source electrode of a driving transistor DT, and the cathode electrode thereof may be connected to a second power line VSL to which a low potential voltage lower than a high potential voltage is supplied.

The driving transistor DT adjusts a current flowing from the first power line VDL, to which the first source voltage is applied, to the light emitting element ED according to a voltage difference between a gate electrode and the source electrode. The gate electrode of the driving transistor DT may be connected to the first electrode of a first transistor ST1, the source electrode thereof may be connected to the anode electrode of the light emitting element ED, and the drain electrode thereof may be connected to a first power line VDL to which the high potential voltage is applied.

The first transistor ST1 is turned on by the first scan signal of a first scan line SCL1 to connect the data line DL to the gate electrode of the driving transistor DT. The gate electrode of the first transistor ST1 may be connected to the first scan line SCL1, the first electrode thereof may be connected to the gate electrode of the driving transistor DT, and the second electrode thereof may be connected to the data line DL.

The second transistor ST2 is turned on by the second scan signal of a second scan line SCL2 to connect an initialization voltage line VIL to the source electrode of the driving transistor DT. The gate electrode of the second transistor ST2 may be connected to the second scan line SCL2, the first electrode thereof may be connected to the initialization voltage line VIL, and the second electrode thereof may be connected to the source electrode of the driving transistor DT.

The first electrode of each of the first and second transistors ST1 and ST2 may be a source electrode, and the second electrode thereof may be a drain electrode, but the disclosure is not limited thereto. For example, the first electrode of each of the first and second transistors ST1 and ST2 may be a drain electrode, and the second electrode thereof may be a source electrode.

The capacitor Cst is formed between the gate electrode and the source electrode of the driving transistor DT. The capacitor Cst stores a difference voltage between the gate voltage and the source voltage of the driving transistor DT.

Although FIG. 4 describes the case in which the driving transistor DT and the first and second transistors ST1 and ST2 are formed as N-type metal oxide semiconductor field effect transistors (MOSFETs), but it should be noted that the disclosure is not limited thereto. The driving transistor DT and the first and second transistors ST1 and ST2 may be formed as P-type MOSFETs.

Figure 5:
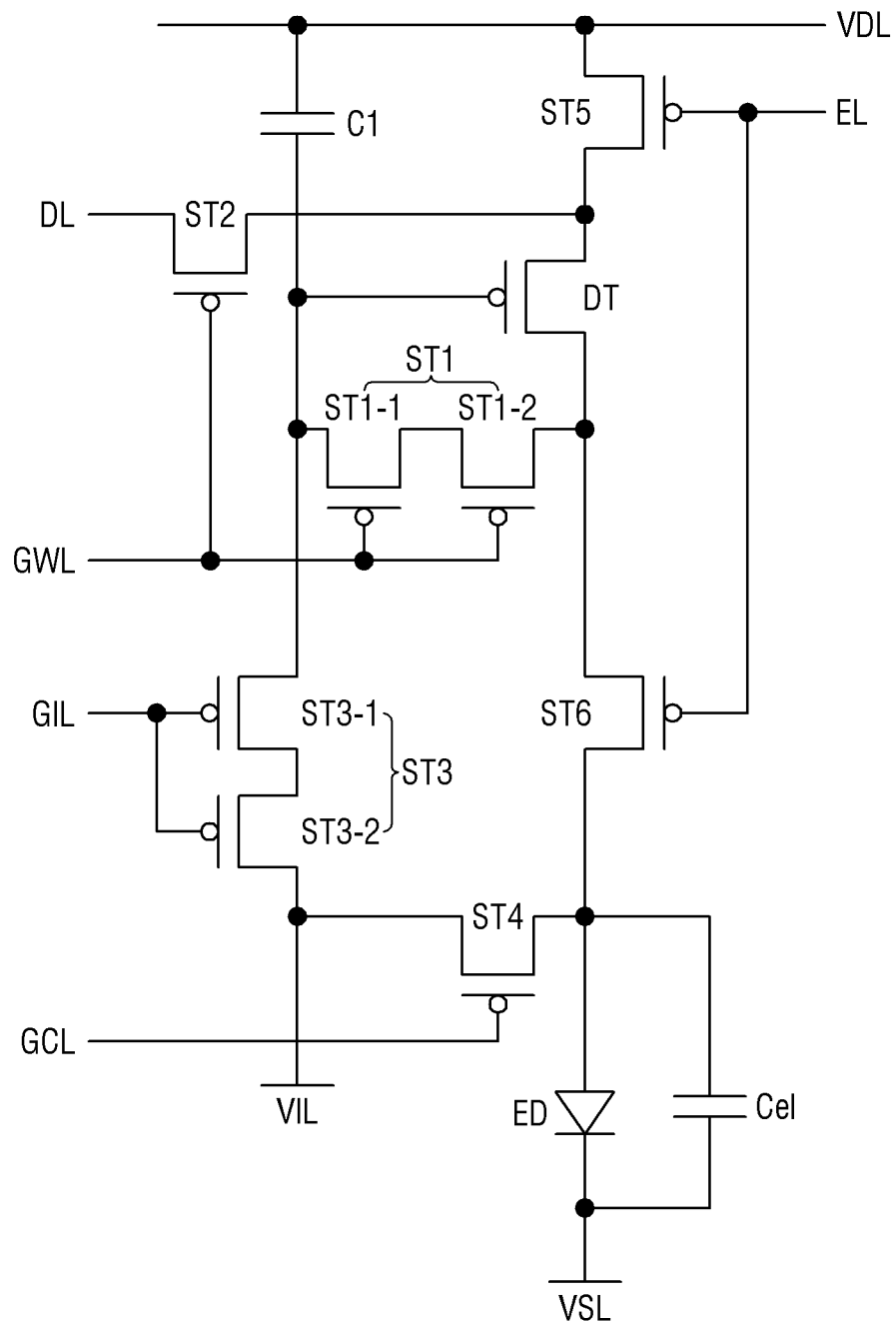
FIGS. 5 and 6 are circuit diagrams of one pixel of a display device according to an embodiment.
Figure 6:
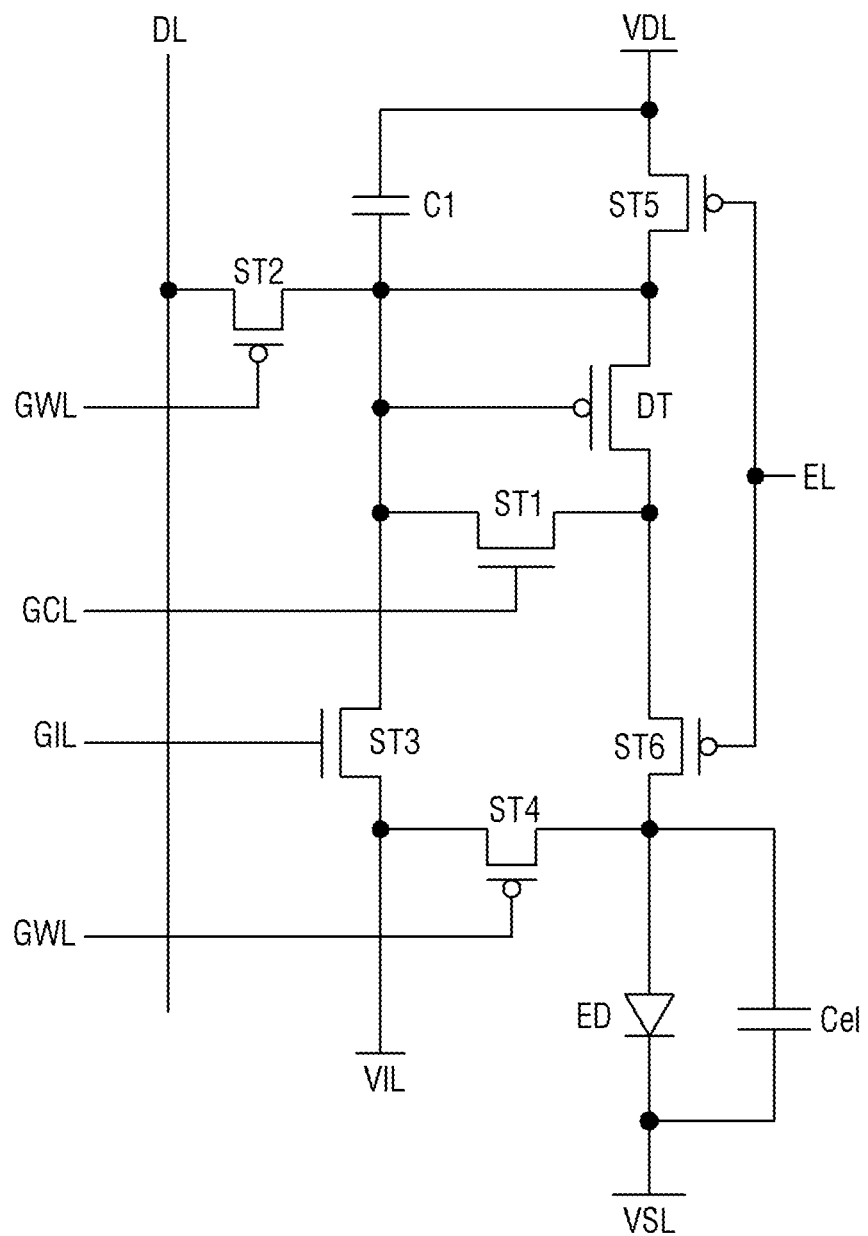

FIGS. 5 and 6 are circuit diagrams of one pixel of a display device according to an embodiment. FIGS. 5 and 6 illustrate another example of the pixel circuit diagram of one pixel PX of FIG. 2. The embodiment of FIG. 6 is different from the embodiment of FIG. 5 in that the driving transistor DT, the second transistor ST2, the fourth transistor ST4, the fifth transistor ST5, and the sixth transistor ST6 are formed as the P-type MOSFETs, and the first transistor ST1 and the third transistor ST3 are formed as the N-type MOSFETs.

Referring to FIG. 5, the anode electrode of the light emitting element ED may be connected to a first electrode of the fourth transistor ST4 and a second electrode of the sixth transistor ST6, and the cathode electrode thereof may be connected to a first power line VSL. A parasitic capacitance Cel may be formed between the anode electrode and the cathode electrode of the light emitting element ED.

The pixel PX may include the driving transistor DT, switch elements, and a capacitor C1. The switch elements include first to sixth transistors ST1, ST2, ST3, ST4, ST5, and ST6. And, the first transistor ST1 may be implemented as a dual transistor including a first subsidiary transistor ST1-1 and a second subsidiary transistor ST1-2. The third transistor ST1 may be implemented as a dual transistor including a third subsidiary transistor ST3-1 and a fourth subsidiary transistor ST3-2.

The driving transistor DT may include a gate electrode, a first electrode, and a second electrode. The driving transistor DT controls a driving current Ids which is a drain-source current flowing between the first electrode and the second electrode according to a data voltage applied to the gate electrode.

The capacitor C1 is formed between the second electrode of the driving transistor DT and a second power line VDL. One electrode of the capacitor C1 may be connected to the second electrode of the driving transistor DT, and the other electrode thereof may be connected to the second power line VDL.

In case that the first electrode of each of the driving transistor DT and the first to sixth transistors ST1 to ST6 is a source electrode, the second electrode thereof may be a drain electrode. As an example, in case that the first electrode of each of the driving transistor DT and the first to sixth transistors ST1 to ST6 is a drain electrode, the second electrode thereof may be a source electrode.

An active layer of each of the driving transistor DT and the first to sixth transistors ST1 to ST6 may be formed of any one of polysilicon, amorphous silicon, or an oxide semiconductor. In case that a semiconductor layer of each of the driving transistor DT and the first to sixth transistors ST1 to ST6 is formed of polysilicon, a process for forming the semiconductor layer may be a low temperature polysilicon (LTPS) process.

Further, in FIG. 5, the driving transistor DT and the first to sixth transistors ST1 to ST6 have been described as being formed of a p-type metal oxide semiconductor field effect transistor (MOSFET), but without being limited thereto, they may be formed of an n-type MOSFET.

Furthermore, the first power voltage of the first power line VDL, the second power voltage of the second power line VSL, and the third power voltage of the initialization voltage line VIL may be set in consideration of the characteristics of the driving transistor DT, the characteristics of the light emitting element ED, and the like within the spirit and the scope of the disclosure.

Referring to FIG. 6, an active layer of each of the driving transistor DT, the second transistor ST2, the fourth transistor ST4, the fifth transistor ST5 and the sixth transistor ST6 formed as the P-type MOSFETs may be formed of polysilicon, whereas an active layer of each of the first transistor ST1 and the third transistor ST3 formed as the N-type MOSFETs may be formed of an oxide semiconductor.

The embodiment of FIG. 6 is different from the embodiment of FIG. 5 in that the gate electrode of the second transistor ST2 and the gate electrode of the fourth transistor ST4 are connected to a write scan line GWL, and the gate electrode of the first transistor ST1 is connected to a control scan line GCL. In FIG. 6, since the first transistor ST1 and the third transistor ST3 are formed as the N-type MOSFETs, a scan signal of a gate high voltage may be applied to the control scan line GCL and an initialization scan line GIL. On the contrary, the second transistor ST2, the fourth transistor ST4, the fifth transistor ST5, and the sixth transistor ST6 are formed as the P-type MOSFETs, so that a scan signal of a gate low voltage may be applied to the write scan line GWL and an emission line EL.

Figure 7:
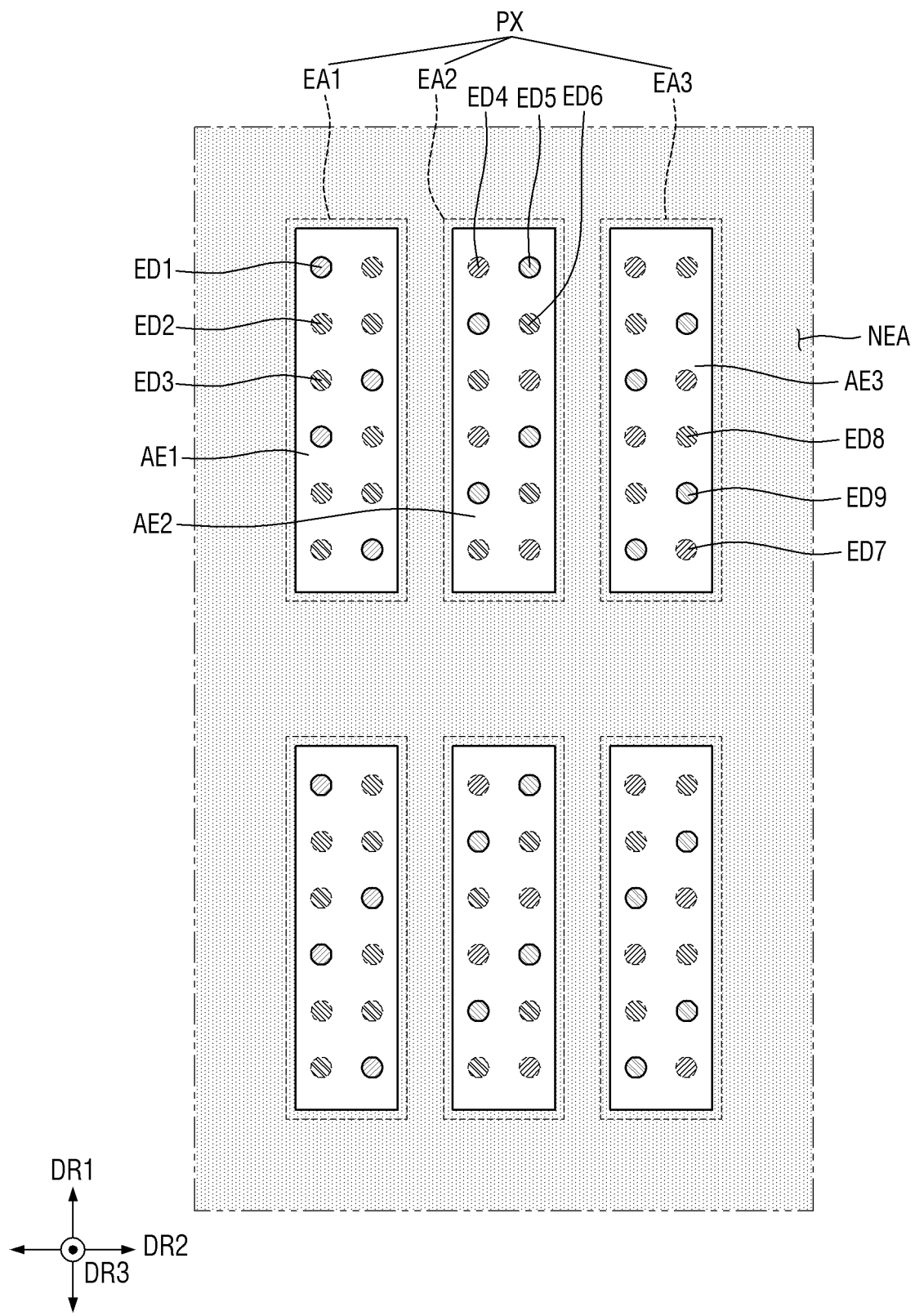
FIG. 7 is a schematic plan view separately illustrating light emitting elements disposed in emission areas of a display device according to one embodiment.

FIG. 7 is a schematic plan view separately illustrating light emitting elements disposed in emission areas of a display device according to one embodiment.

Referring to FIG. 7 in conjunction with FIG. 3, in the display device 10 according to one embodiment, different light emitting elements ED (ED1 to ED9) may be disposed in each of the emission areas EA1, EA2, and EA3, and only some of them may emit light. The first light emitting element ED1, the second light emitting element ED2, and the third light emitting element ED3 may be disposed in the first emission area EA1. The mask layer ML may not be disposed on the first light emitting element ED1, and the mask layer ML may be disposed on the second light emitting element ED2 and the third light emitting element ED3. The first light emitting element ED1 may be a first type light emitting element that is electrically connected to the cathode electrode CE in the first emission area EA1 and emits light, and the second light emitting element ED2 and the third light emitting element ED3 may be second type light emitting elements that are not electrically connected to the cathode electrode CE in the first emission area EA1 and do not emit light.

The fourth light emitting element ED4, the fifth light emitting element ED5, and the sixth light emitting element ED6 may be disposed in the second emission area EA2. The mask layer ML may not be disposed on the fifth light emitting element ED5, and the mask layer ML may be disposed on the fourth light emitting element ED4 and the sixth light emitting element ED6. The fifth light emitting element ED5 may be the first type light emitting element that is electrically connected to the cathode electrode CE in the second emission area EA2 and emits light, and the fourth light emitting element ED4 and the sixth light emitting element ED6 may be the second type light emitting elements that are not electrically connected to the cathode electrode CE in the second emission area EA2 and do not emit light.

The seventh light emitting element ED7, the eighth light emitting element ED8, and the ninth light emitting element ED9 may be disposed in the third emission area EA3. The mask layer ML may not be disposed on the ninth light emitting element ED9, and the mask layer ML may be disposed on the seventh light emitting element ED7 and the eighth light emitting element ED8. The ninth light emitting element ED9 may be the first type light emitting element that is electrically connected to the cathode electrode CE in the third emission area EA3 and emits light, and the seventh light emitting element ED7 and the eighth light emitting element ED8 may be the second type light emitting elements that are not electrically connected to the cathode electrode CE in the third emission area EA3 and do not emit light.

The display device 10 according to one embodiment may include different types of light emitting elements ED disposed in each of the emission areas EA1, EA2, and EA3, and the light emitting elements ED may be selectively electrically connected to the cathode electrode CE to correspond to each of the emission areas EA1, EA2, and EA3. As will be described later, the light emitting elements ED may be classified into different types of light emitting elements depending on the material of the active layer MQW. However, different types of light emitting elements ED may be disposed in each of the emission areas EA1, EA2, and EA3. For example, the first light emitting element ED1, the second light emitting element ED2, and the third light emitting element ED3 disposed in the first emission area EA1 may be the same type of light emitting elements as the fourth light emitting element ED4, the fifth light emitting element ED5, and the sixth light emitting element ED6 disposed in the second emission area EA2, respectively. The fourth light emitting element ED4, the fifth light emitting element ED5, and the sixth light emitting element ED6 disposed in the second emission area EA2 may be the same type of light emitting elements as the seventh light emitting element ED7, the eighth light emitting element ED8, and the ninth light emitting element ED9 disposed in the third emission area EA3, respectively.

The arrangement of the light emitting elements ED in each of the emission areas EA1, EA2, and EA3 may be the same regardless of different emission areas EA1, EA2, and EA3. For example, in the embodiment in which the first light emitting element ED1, the second light emitting element ED2, and the third light emitting element ED3 are disposed along the second direction DR2 in the first emission area EA1, the fourth light emitting element ED4, the fifth light emitting element ED5, and the sixth light emitting element ED6 may be disposed along the second direction DR2 in the second emission area EA2, and the seventh light emitting element ED7, the eighth light emitting element ED8, and the ninth light emitting element ED9 may be disposed along the second direction DR2 in the third emission area EA3. In the display device 10, different emission areas EA1, EA2, and EA3 are distinguished, but the types of the light emitting elements ED disposed therein and the arrangement of the light emitting elements ED depending on the types thereof may be the same. Although FIG. 7 illustrates that the light emitting elements ED are arranged to be spaced apart from each other in the first direction DR1 and the second direction DR2, the disclosure is not limited thereto. In an embodiment, the light emitting elements ED disposed in each of the emission areas EA1, EA2, and EA3 may be disposed in random arrangement. For example, the distances between the light emitting elements ED spaced apart from each other may be different, or they may be disposed to be spaced apart from each other in a direction different from the first and second directions DR1 and DR2. However, even in that case, the arrangement of the light emitting elements ED disposed in different emission areas EA1, EA2, and EA3 may be the same regardless of the emission areas EA1, EA2, and EA3.

In the display device 10 according to one embodiment, different types of light emitting elements ED may be electrically connected to the cathode electrode CE in each of the emission areas EA1, EA2, and EA3. For example, the first light emitting element ED1 may be electrically connected to the cathode electrode CE in the first emission area EA1, the fifth light emitting element ED5 may be electrically connected to the cathode electrode CE in the second emission area EA2, and the ninth light emitting element ED9 may be electrically connected to the cathode electrode CE in the third emission area EA3. The types and arrangement of the light emitting elements ED disposed in each of the emission areas EA1, EA2, and EA3 may be the same, but the types of the light emitting elements ED1, ED5, and ED9 that are connected to the cathode electrode CE and emit light may be different in each of the emission areas EA1, EA2, and EA3. Accordingly, lights of different colors may be emitted in the first emission area EA1, the second emission area EA2, and the third emission area EA3.

Figure 8:
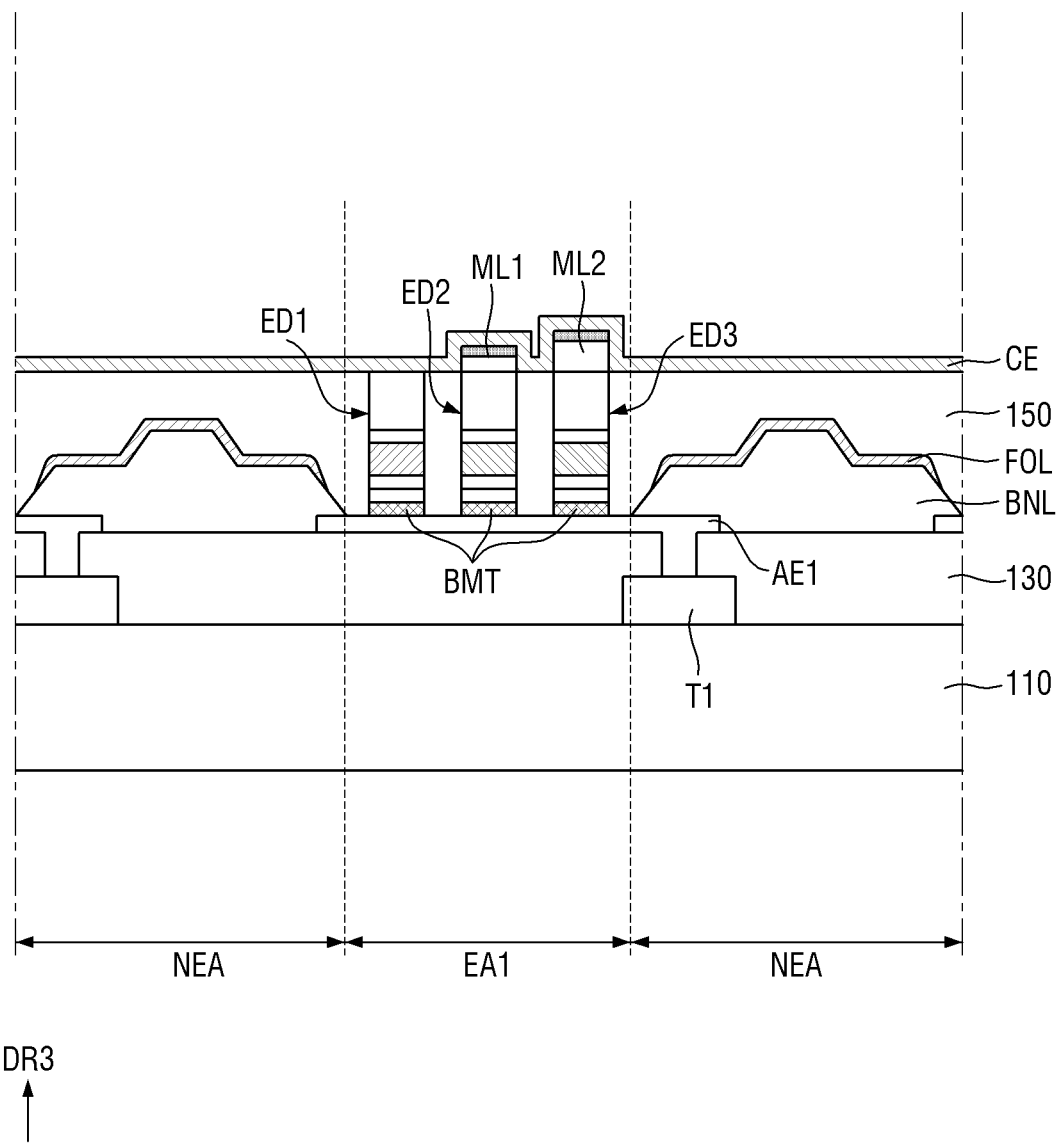
FIG. 8 is a schematic cross-sectional view of a first emission area of FIG. 7.
Figure 9:
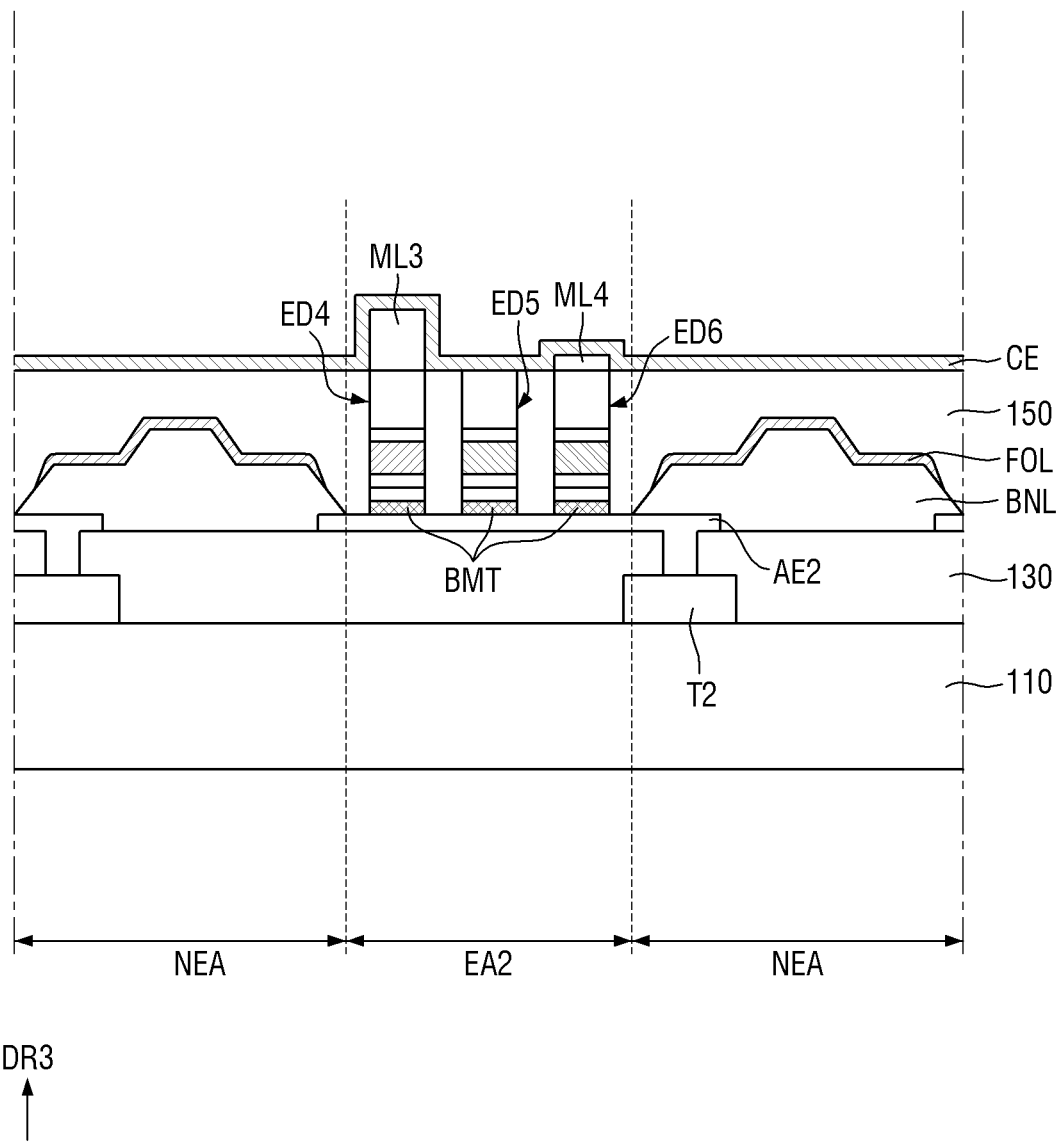
FIG. 9 is a schematic cross-sectional view of a second emission area of FIG. 7.
Figure 10:
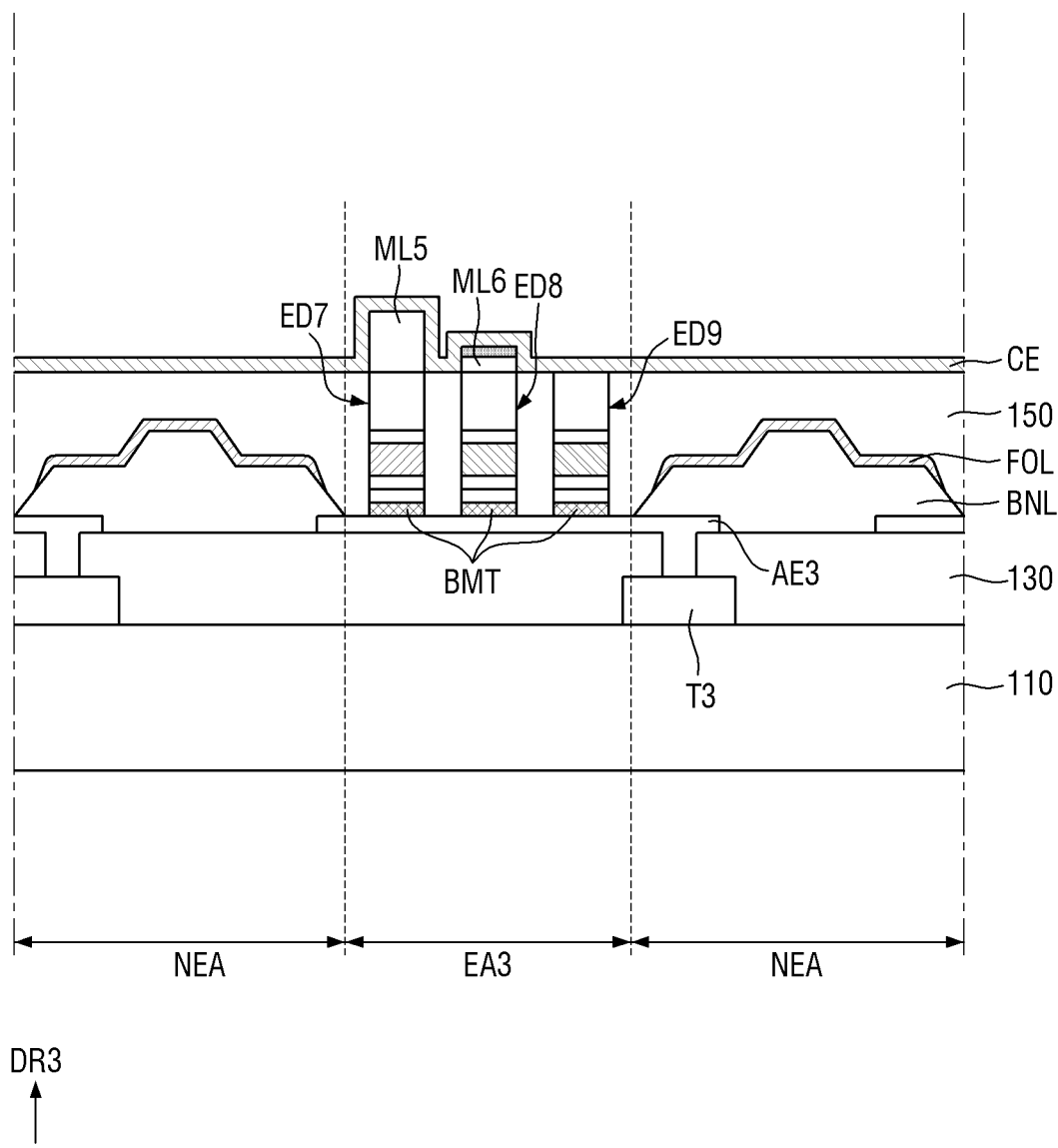
FIG. 10 is a schematic cross-sectional view of a third emission area of FIG. 7.
Figure 11:
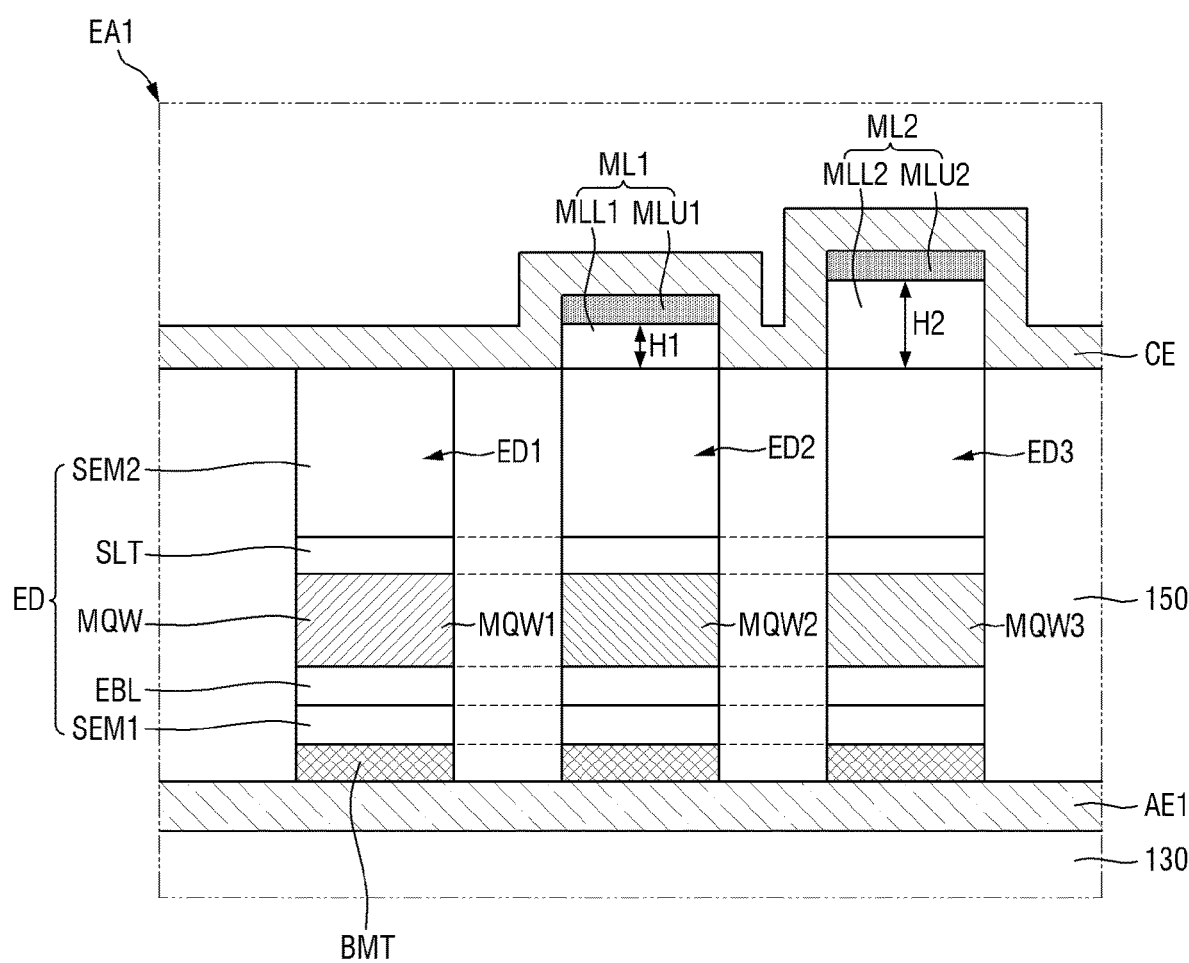
FIG. 11 is an enlarged view of first to third light emitting elements of FIG. 8.
Figure 12:
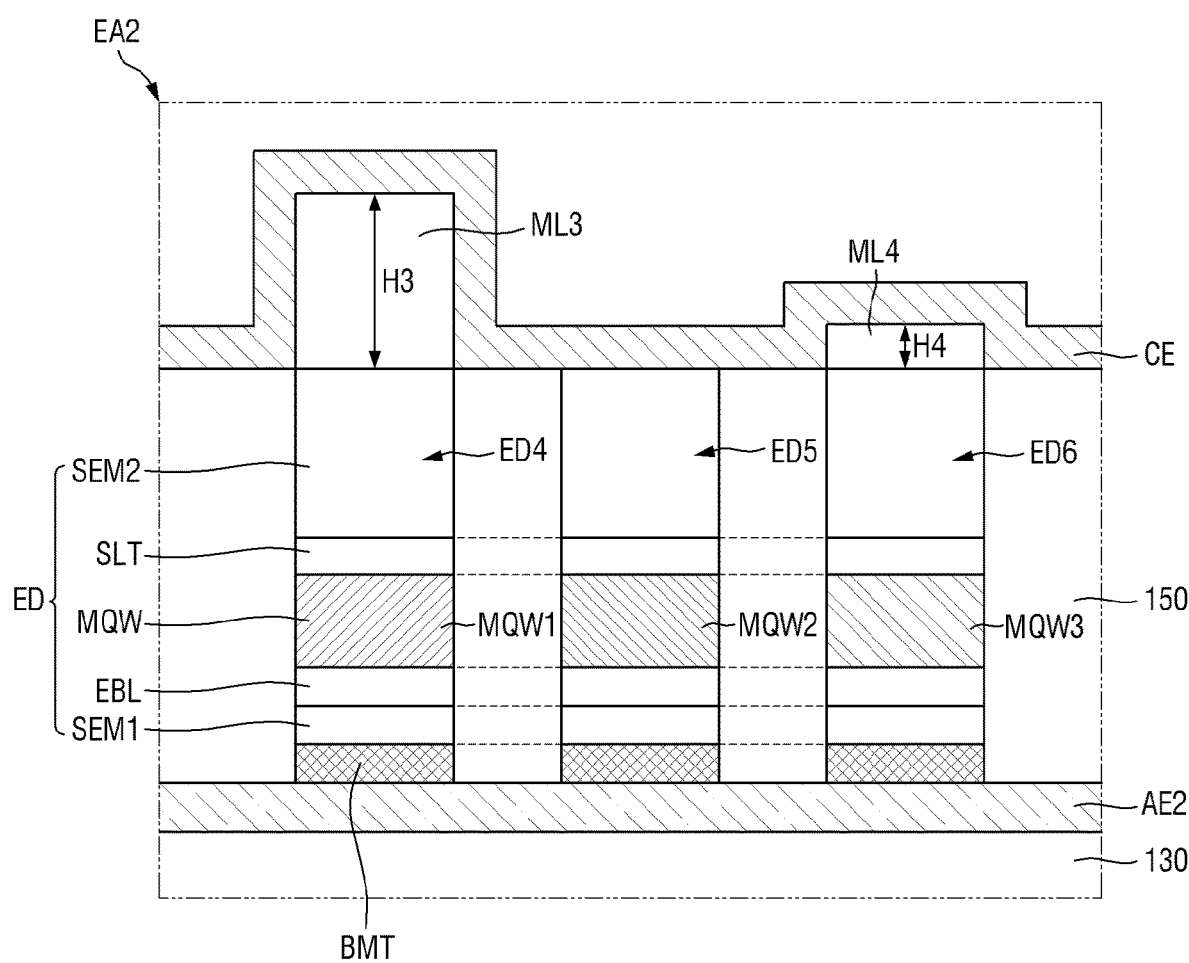
FIG. 12 is an enlarged view of fourth to sixth light emitting elements of FIG. 9.
Figure 13:
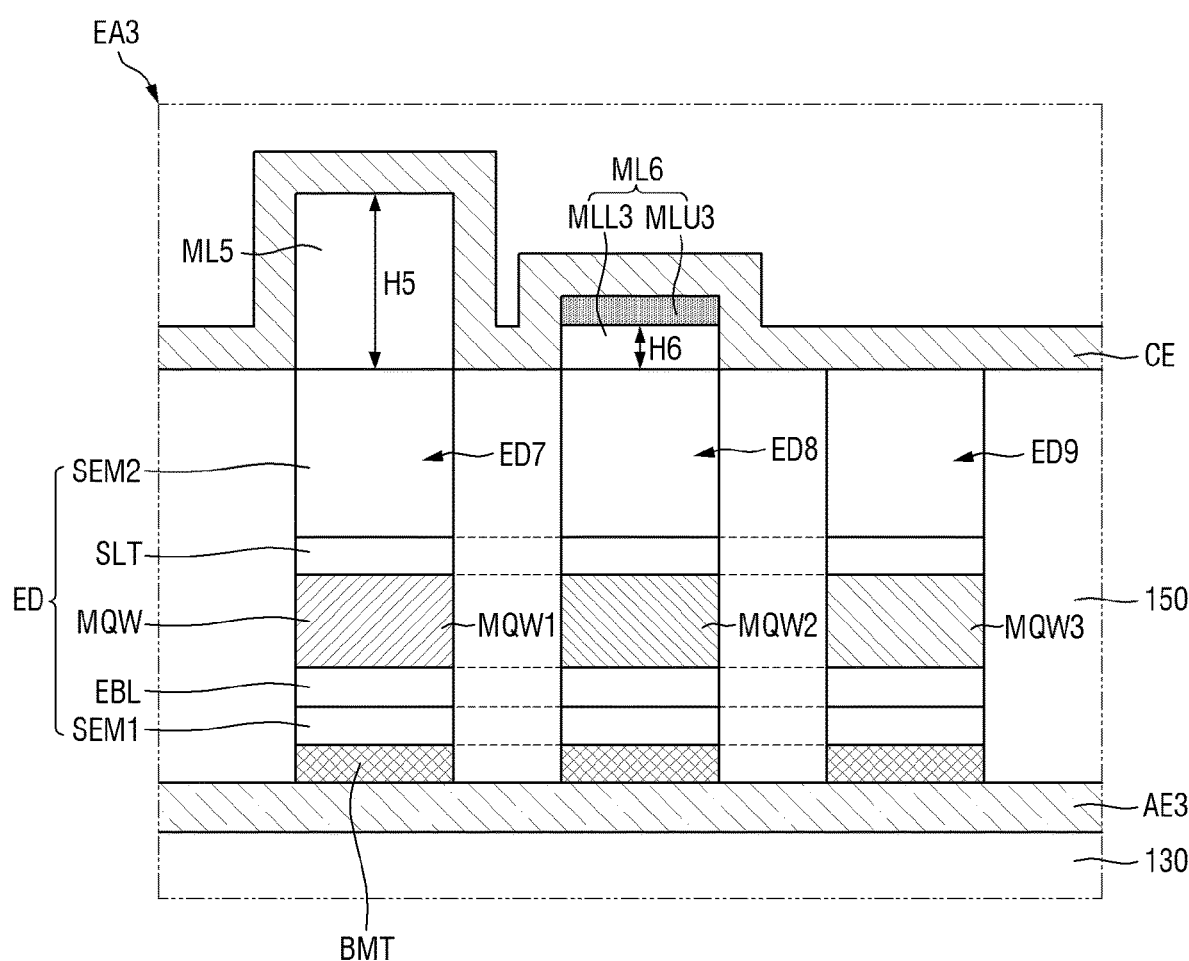
FIG. 13 is an enlarged view of seventh to ninth light emitting elements of FIG. 10.

FIG. 8 is a schematic cross-sectional view of a first emission area of FIG. 7. FIG. 9 is a schematic cross-sectional view of a second emission area of FIG. 7. FIG. 10 is a schematic cross-sectional view of a third emission area of FIG. 7. FIG. 11 is an enlarged view of first to third light emitting elements of FIG. 8. FIG. 12 is an enlarged view of fourth to sixth light emitting elements of FIG. 9. FIG. 13 is an enlarged view of seventh to ninth light emitting elements of FIG. 10. FIGS. 8 to 10 show schematic arrangement of different light emitting elements ED (ED1 to ED9) and mask layers ML (ML1 to ML6) disposed in each of the emission areas EA1, EA2, and EA3, and FIGS. 11 to 13 illustrate the structures of the light emitting elements ED and the mask layers ML disposed in each of the emission areas EA1, EA2, and EA3 in detail.

Referring to FIGS. 8 to 13 in conjunction with FIG. 7, the light emitting element ED may include a first semiconductor layer SEM1, an electron blocking layer EBL, an active layer MQW, a superlattice layer SLT, and a second semiconductor layer SEM2. The first semiconductor layer SEM1, the electron blocking layer EBL, the active layer MQW, the superlattice layer SLT, and the second semiconductor layer SEM2 may be sequentially stacked each other in the third direction DR3.

The first semiconductor layer SEM1 may be disposed on the connection electrode BMT. The first semiconductor layer SEM1 may be a p-type semiconductor, and may include a semiconductor material having a chemical formula of $Al_xGa_yIn_{1-x-y}N$ ($0 \leq x \leq 1$, $0 \leq y \leq 1$, $0 \leq x+y \leq 1$). For example, it may be any one or more of p-type doped AlGaInN, GaN, AlGaN, InGaN, AlN and InN. The first semiconductor layer SEM1 may be doped with a p-type dopant, and the p-type dopant may be Mg, Zn, Ca, Ba, or the like within the spirit and the scope of the disclosure. For example, the first semiconductor layer SEM1 may be p-GaN doped with p-type Mg.

The electron blocking layer EBL may be disposed on the first semiconductor layer SEM1. The electron blocking layer EBL may prevent electrons flowing into the active layer MQW from being injected into another layer without being recombined with holes in the active layer MQW. For example, the electron blocking layer EBL may be p-AlGaN doped with p-type Mg. The thickness of the electron blocking layer EBL may be within a range of about 10 nm to about 50 nm, but the disclosure is not limited thereto. In an embodiment, the electron blocking layer EBL may be omitted.

The active layer MQW may be disposed on the electron blocking layer EBL. The active layer MQW may emit light due to recombination of the electrons and the holes in response to the light emitting signal applied through the first semiconductor layer SEM1 and the second semiconductor layer SEM2. The active layer MQW may include a material having a single or multiple quantum well structure. In case that the active layer MQW contains a material having a multiple quantum well structure, the active layer MQW may have the structure in which well layers and barrier layers may be alternately laminated. At this time, the well layer may be formed of InGaN, and the barrier layer may be formed of GaN or AlGaN, but the disclosure is not limited thereto. For example, the active layer MQW may have a structure in which semiconductor materials having large band gap energy and semiconductor materials having small band gap energy may be alternately stacked each other, and may include other group III to V semiconductor materials according to the wavelength band of the emitted light.

The superlattice layer SLT is disposed on the active layer MQW. The superlattice layer SLT may reduce stress due to the difference in lattice constant between the second semiconductor layer SEM2 and the active layer MQW. For example, the superlattice layer SLT may be formed of InGaN or GaN. The thickness of the superlattice layer SLT may be in a range of about 50 nm to about 200 nm. However, the superlattice layer SLT may be omitted.

The second semiconductor layer SEM2 may be disposed on the superlattice layer SLT. The second semiconductor layer SEM2 may be an n-type semiconductor. The second semiconductor layer SEM2 may include a semiconductor material having a chemical formula of AlxGayIn1-x-yN ($0 \leq x \leq 1$, $0 \leq y \leq 1$, $0 \leq x+y \leq 1$). For example, it may be any one or more of n-type doped AlGaInN, GaN, AlGaN, InGaN, AlN and InN. The second semiconductor layer SEM2 may be doped with an n-type dopant, and the n-type dopant may be Si, Ge, Sn, or the like within the spirit and the scope of the disclosure. For example, the second semiconductor layer SEM2 may be n-GaN doped with n-type Si. The thickness of the second semiconductor layer SEM2 may be within a range of about 2 μm to about 4 μm, but the disclosure is not limited thereto.

In accordance with one embodiment, some of the light emitting elements ED of the display device 10 may include different active layers MQW to emit lights of different colors. For example, in the first emission area EA1, the first light emitting element ED1 may include a first active layer MQW1, the second light emitting element ED2 may include a second active layer MQW2, and the third light emitting element ED3 may include a third active layer MQW3. The first light emitting element ED1 may emit red light of a first color, the second light emitting element ED2 may emit green light of a second color, and the third light emitting element ED3 may emit blue light of a third color. Similarly, the fourth light emitting element ED4 including the first active layer MQW1, the fifth light emitting element ED5 including the second active layer MQW2, and the sixth light emitting element ED6 including the third active layer MQW3 may be disposed in the second emission area EA2. The seventh light emitting element ED7 including the first active layer MQW1, the eighth light emitting element ED8 including the second active layer MQW2, and the ninth light emitting element ED9 including the third active layer MQW3 may be disposed in the third emission area EA3. The first light emitting element ED1, the fourth light emitting element ED4, and the seventh light emitting element ED7 may be red light emitting elements that emit light of the first color, the second light emitting element ED2, the fifth light emitting element ED5, and the eighth light emitting element ED8 may be green light emitting elements that emit light of the second color, and the third light emitting element ED3, the sixth light emitting element ED6, and the ninth light emitting element ED9 may be blue light emitting elements that emit light of the third color.

In the first emission area EA1, only the first light emitting element ED1 may be electrically connected to the cathode electrode CE and emit red light. In the second emission area EA2, only the fifth light emitting element ED5 may be electrically connected to the cathode electrode CE and emit green light. In the third emission area EA3, only the ninth light emitting element ED9 may be electrically connected to the cathode electrode CE and emit blue light. In the display device 10 according to one embodiment, different types of light emitting elements ED are disposed in each of the emission areas EA1, EA2, and EA3, and only some of them may be electrically connected to the cathode electrode CE and emit light. Accordingly, lights of different colors may be emitted from each of the emission areas EA1, EA2, and EA3.

The mask layer ML may be disposed on other light emitting elements ED that are not connected to the cathode electrode CE. For example, a first mask layer ML1 may be disposed on the second light emitting element ED2, and a second mask layer ML2 may be disposed on the third light emitting element ED3. The second light emitting element ED2 and the third light emitting element ED3 may not be electrically connected to the cathode electrode CE due to the mask layers ML1 and ML2, respectively.

A third mask layer ML3 may be disposed on the fourth light emitting element ED4, and a fourth mask layer ML4 may be disposed on the sixth light emitting element ED6. A fifth mask layer ML5 may be disposed on the seventh light emitting element ED7, and a sixth mask layer ML6 may be disposed on the eighth light emitting element ED8. The fourth light emitting element ED4, the sixth light emitting element ED6, the seventh light emitting element ED7, and the eighth light emitting element ED8 may not be electrically connected to the cathode electrode CE due to the mask layers ML3, ML4, ML5, and ML6, respectively. The light emitting elements ED that are not electrically connected to the cathode electrode CE may remain as non-light emitting elements disposed in each of the emission areas EA1, EA2, and EA3.

In accordance with one embodiment, the mask layers ML disposed on the light emitting elements remaining as the non-light emitting elements may be different from each other. The first mask layer ML1 disposed on the second light emitting element ED2 may include a first base layer MLL1 and a first upper layer MLU1 disposed on the first base layer MLL1, and the second mask layer ML2 disposed on the third light emitting element ED3 may include a second base layer MLL2 and a second upper layer MLU2 disposed on the second base layer MLL2. The sixth mask layer ML6 disposed on the eighth light emitting element ED8 may include a third base layer MLL3 and a third upper layer MLU3 disposed on the third base layer MLL3. The first mask layer ML1, the second mask layer ML2, and the sixth mask layer ML6 may have a multilayer structure including the base layers MLL1, MLL2, and MLL3 and the upper layers MLU1, MLU2, and MLU3 containing different materials, respectively. On the other hand, the third mask layer ML3 disposed on the fourth light emitting element ED4, the fourth mask layer ML4 disposed on the sixth light emitting element ED6, and the fifth mask layer ML5 disposed on the seventh light emitting element ED7 may have a single layer structure including a single layer. The third mask layer ML3, the fourth mask layer ML4, and the fifth mask layer ML5 may include a same material (or a similar material) as those of the base layers MLL1, MLL2, and MLL3, respectively, and may contain materials different from those of the upper layers MLU1, MLU2 and MLU3, respectively. In accordance with one embodiment, the base layers MLL1, MLL2, and MLL3 may contain an insulating material such as silicon oxide ($SiO_x$), silicon nitride ($SiN_x$), or silicon oxynitride ($SiO_xN_y$), and the upper layers MLU1, MLU2, and MLU3 may contain a metal material such as aluminum (Al), gold (Au), copper (Cu), or the like within the spirit and the scope of the disclosure.

At least one of the mask layers ML disposed on the second type light emitting elements that are non-light emitting elements may contain a same insulating material as those of the base layers MLL1, MLL2, and MLL3. The second type light emitting elements may be insulated from the cathode electrode CE by the mask layer ML disposed on the second semiconductor layer SEM2, and may not emit light even if they are electrically connected to the anode electrodes AE1, AE2, and AE3. Since the mask layer ML is not disposed on the first type light emitting elements, the first type light emitting elements may have both ends electrically connected to the anode electrodes AE1, AE2, and AE3 and the cathode electrode CE and may emit light.

During the manufacturing process of the display device 10, the light emitting elements ED may be disposed on the anode electrodes AE1, AE2, and AE3 in a state where hard mask layers HML1, HML2, and HML3 (see FIG. 20) are disposed on one ends of the light emitting elements ED. As described above, the types and arrangement of the light emitting elements ED disposed in each of the emission areas EA1, EA2 and EA3 may be the same regardless of the emission areas EA1, EA2, and EA3. The red light emitting elements ED1, ED4, and ED7, the green light emitting elements ED2, ED5, and ED8, and the blue light emitting elements ED3, ED6, and ED8 may be arranged in the same manner in each of the emission areas EA1, EA2, and EA3 regardless of positions. In the light emitting elements ED arranged regardless of the positions and types of the emission areas EA1, EA2, and EA3, the hard mask layers HML1, HML2, and HML3 may be selectively removed to correspond to the corresponding emission areas EA1, EA2, and EA3. In the embodiment in which the first emission area EA1 emits red light, the hard mask layers HML1, HML2, and HML3 disposed on the first light emitting element ED1 that is the red light emitting element may be completely removed, and the hard mask layers HML1, HML2, and HML3 disposed on the second light emitting element ED2 that is the green light emitting element and the third light emitting element ED3 that is the blue light emitting element may be partially removed, thereby forming different mask layers ML1 and ML2. Similarly, in the case of the second emission area EA2 and the third emission area EA3, the hard mask layers HML1, HML2, and HML3 disposed on the fifth light emitting element ED5 that is the green light emitting element and the ninth light emitting element ED9 that is the blue light emitting element may be completely removed, and the hard mask layers HML1, HML2, and HML3 disposed on the other light emitting elements may be partially removed, thereby forming different mask layers ML3, ML4, ML5, and ML6. Since only some hard mask layers HML1, HML2, and HML3 are selectively and completely removed in each of the emission areas EA1, EA2, and EA3, different processes may be performed in each of the emission areas EA1, EA2, and EA3 may be different, and the structures and materials of the mask layers ML (ML1 to ML6) remaining after the processes may also be different.

For example, the first to sixth mask layers ML1 to ML6 may include layers containing a same insulating material. The first mask layer ML1, the second mask layer ML2, and the sixth mask layer ML6 may include the base layers MLL1, MLL2, and MLL3 made of an insulating material, respectively, and the third mask layer ML3, the fourth mask layer ML4, and the fifth mask layer ML5 may have a single layer structure made of an insulating material. However, the mask layers ML and the insulating material layers thereof may have different thicknesses.

For example, the third mask layer ML3 and the fifth mask layer ML5 respectively disposed on the fourth light emitting element ED4 and the seventh light emitting element ED7 that are the red light emitting elements may have thicknesses greater than those of other mask layers. The first mask layer ML1 and the sixth mask layer ML6 respectively disposed on the second light emitting element ED2 and the eighth light emitting element ED8 that are the green light emitting elements may have thicknesses smaller than (or less than) those of the third mask layer ML3 and the fifth mask layer ML5. The second mask layer ML2 disposed on the third light emitting element ED3 that is the blue light emitting element may have a thickness smaller than (or less than) those of the third mask layer ML3 and the fifth mask layer ML5 and greater than those of the first mask layer ML1 and the sixth mask layer ML6, and the fourth mask layer ML4 disposed on the sixth light emitting element ED6 that is another blue light emitting element may have the smallest thickness. Such a magnitude relationship may be obtained in the case of comparing the thicknesses including the upper layers MLU1, MLU2, and MLU3 of the first mask layer ML1, the second mask layer ML2, and the sixth mask layer ML6. The thicknesses of the base layers MLL1, MLL2, and MLL3 except the upper layers MLU1, MLU2, and MLU3 made of a metal material and other mask layers may have different magnitude relationships.

For example, a first thickness H1 of the first base layer MLL1 of the first mask layer ML1 may be smaller than (or less than) a second thickness H2 of the second base layer MLL2 of the second mask layer ML2. The first thickness H1 of the first base layer MLL1 may be the same as a sixth thickness H6 of the third base layer MLL3 of the sixth mask layer ML6 and a fourth thickness H4 of the fourth mask layer ML4. The second thickness H2 of the second base layer MLL2 of the second mask layer ML2 may be smaller than (or less than) a third thickness H3 of the third mask layer ML3 and a fifth thickness H5 of the fifth mask layer ML5, and the third thickness H3 of the third mask layer ML3 and the fifth thickness H5 of the fifth mask layer ML5 may be the same.

In the manufacturing process of the display device 10, the process of selectively removing the hard mask layers HML1, HML2, and HML3 disposed on the light emitting elements ED may be performed by a process of selectively etching layers having different etching selectivities. Since the base layers MLL1, MLL2, and MLL3 and the upper layers MLU1, MLU2, and MLU3 contain different materials and have different etching selectivities, they may be selectively etched depending on conditions of an etching process. However, the base layers MLL1, MLL2, and MLL3 or the hard mask layers HML1, HML2, and HML3 including layers made of a same insulating material as those of the base layers MLL1, MLL2, and MLL3 may be selectively removed at different thicknesses. Accordingly, the thicknesses and structures of the mask layers ML remaining in each of the emission areas EA1, EA2, and EA3 may be different.

In the display device 10 according to one embodiment, since different types of light emitting elements ED are disposed regardless of the positions and types of the emission areas EA1, EA2, and EA3, a process for arranging other light emitting elements ED to correspond to the emission areas EA1, EA2, and EA3 may be omitted. The display device 10 is advantageous in that the manufacturing process is simple by omitting a process of aligning the first substrate 110 and the transfer substrate of the light emitting elements ED because the red, green, and blue light emitting elements are disposed regardless of the emission areas EA1, EA2, and EA3. Further, since the hard mask layers HML1, HML2, and HML3 of different structures are formed in each of the light emitting elements ED, even in case that the hard mask layers HML1, HML2, and HML3 are selectively removed and different types of light emitting elements are mixed in each of the emission areas EA1, EA2, and EA3, only specific light emitting elements ED may selectively emit light.

Hereinafter, a fabricating process of the display device 10 will be described with further reference to other drawings.

Figure 14:
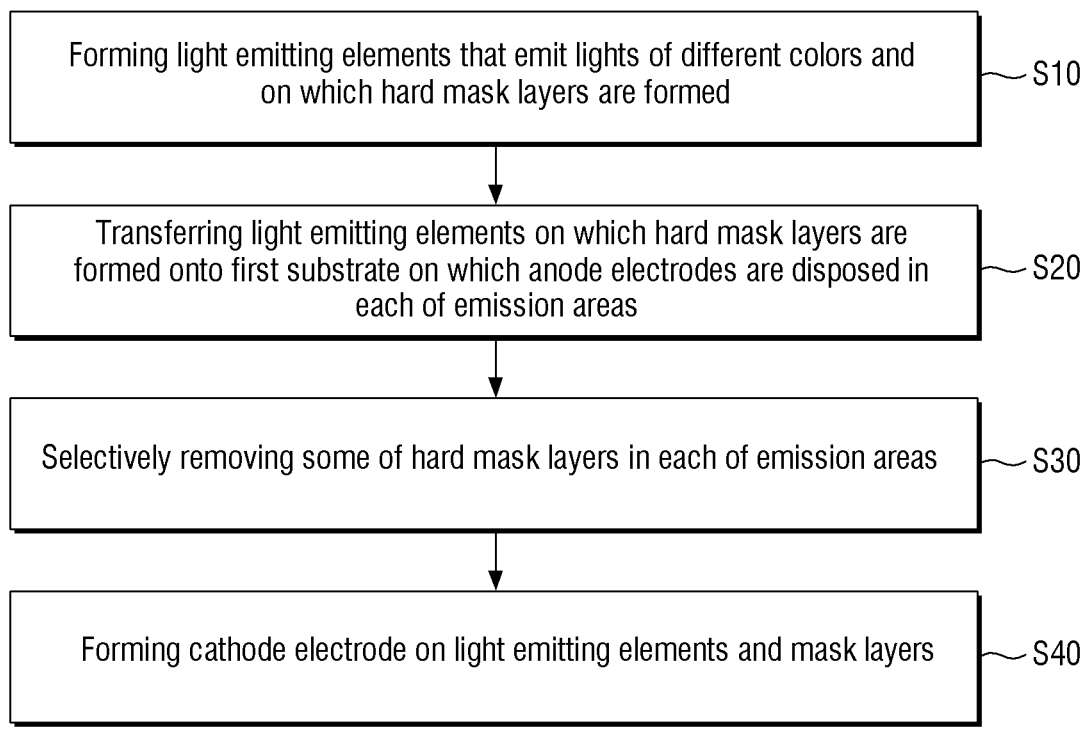
FIG. 14 is a flowchart showing a process for fabricating a display device according to one embodiment.

FIG. 14 is a flowchart showing a process for fabricating a display device according to one embodiment.

Referring to FIG. 14, a method for fabricating the display device 10 according to one embodiment may include forming the light emitting elements ED that emit lights of different colors and on which the hard mask layers HML1, HML2, and HML3 are formed (step S10), transferring the light emitting elements ED on which the hard mask layers HML1, HML2, and HML3 are formed onto the first substrate 110 on which the anode electrodes AE1, AE2, and AE3 are disposed in each of the emission areas EA1, EA2, and EA3 (step S20), selectively removing some of the hard mask layers HML1, HML2, and HML3 in each of the emission areas EA1, EA2, and EA3 (step S30), and forming the cathode electrode CE on the light emitting elements ED and the mask layers ML (step S40).

The display device 10 may be manufactured by a process of forming the light emitting elements ED on a substrate different from the first substrate 110 and transferring them onto the first substrate 110 on which the anode electrodes AE1, AE2, and AE3 are formed. In case that the light emitting elements ED are transferred onto the first substrate 110, a process of removing the hard mask layers HML1, HML2, and HML3 formed on the specific light emitting elements ED in each of the emission areas EA1, EA2, and EA3 is performed. In this process, one ends of different types of light emitting elements ED may be exposed and the mask layers ML of different structures may be formed in each of the emission areas EA1, EA2, and EA3.

FIGS. 15 to 18 are schematic cross-sectional views illustrating a process of forming light emitting elements during the manufacturing process of a display device according to one embodiment. First, the process of forming the light emitting elements ED and the hard mask layers HML1, HML2, and HML3 (step S10) will be described with reference to FIGS. 15 to 18.

Figure 15:
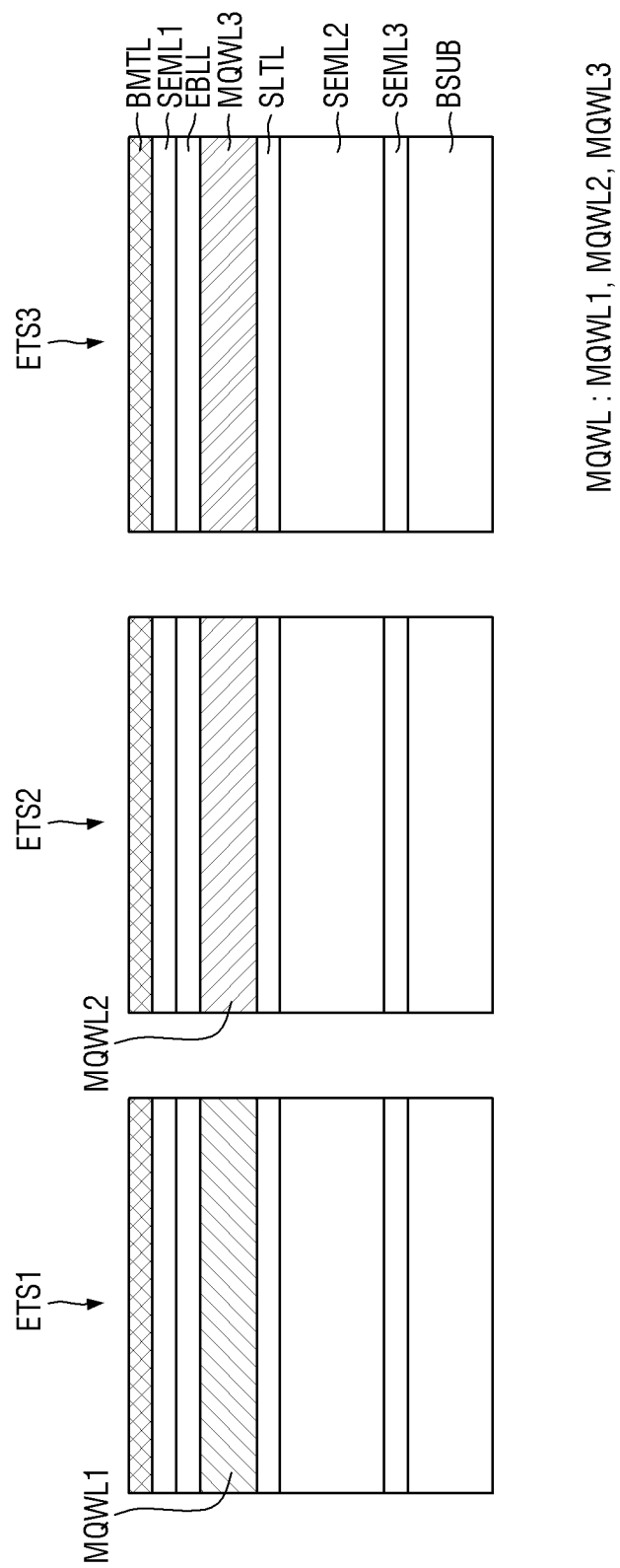
FIGS. 15 to 18 are schematic cross-sectional views illustrating a process of forming light emitting elements during the manufacturing process of a display device according to one embodiment.

Referring to FIG. 15, base substrates BSUB are prepared, and element substrates ETS1, ETS2, and ETS3 are formed by forming semiconductor material layers SEML3, SEML2, SLTL, MQWL, EBLL, and SEML1 and a connection electrode layer BMTL on the base substrate BSUB. The base substrate BSUB may be a sapphire substrate ($Al_2O_3$) or a silicon wafer containing silicon. However, the disclosure is not limited thereto. Hereinafter, a case in which the base substrate BSUB is a sapphire substrate will be described as an example.

The semiconductor material layers SEML3, SEML2, SLTL, MQML, EBLL, and SEML1 are formed on the base substrate BSUB. The semiconductor material layers SEML3, SEML2, SLTL, MQML, EBLL, and SEML1 may be formed by an epitaxial growth method. The epitaxial growth method may be electron beam deposition, physical vapor deposition (PVD), chemical vapor deposition (CVD), plasma laser deposition (PLD), dual-type thermal evaporation, sputtering, metal organic chemical vapor deposition (MOCVD), or the like within the spirit and the scope of the disclosure. For example, it may be performed by the metal organic chemical vapor deposition (MOCVD), but the disclosure is not limited thereto.

A precursor material for forming the semiconductor material layers may be selected to form a target material in a selectable range without any limitation. For example, the precursor material may be a metal precursor including an alkyl group such as a methyl group or an ethyl group. Examples of the precursor material may include, but are not limited to, trimethylgallium $Ga(CH_3)_3$, trimethylaluminum $Al(CH_3)_3$, and triethyl phosphate $(C_2H_5)_3PO_4$.

A third semiconductor material layer SEML3 is formed on the base substrate BSUB. Although it is shown in the drawing that one third semiconductor material layer SEML3 is deposited, the disclosure is not limited thereto, and layers may be formed. The third semiconductor material layer SEML3 may be disposed to reduce the difference in lattice constant between a second semiconductor material layer SEML2 and the base substrate BSUB. For example, the third semiconductor material layer SEML3 may include an undoped semiconductor, and may be a material that is not doped with an n-type or p-type dopant. In an embodiment, the third semiconductor material layer SEML3 may be, but is not limited to, at least one of undoped InAlGaN, GaN, AlGaN, InGaN, AlN, or InN.

The second semiconductor material layer SEML2, the superlattice material layer SLTL, the active material layer MQWL, the electron blocking material layer EBLL, and the first semiconductor material layer SEML1 are sequentially formed on the third semiconductor material layer SEML3 using the above-described method, and the connection electrode layer BMTL is disposed on the first semiconductor material layer SEML1 to form the element substrates ETS1, ETS2, and ETS3. The connection electrode layer BMTL may be formed by deposition, sputtering, an atomic layer deposition process, or the like, instead of the epitaxial growth method.

The first element substrate ETS1 may be a first active material layer MQWL1 in which the active material layer MQWL contains a material capable of emitting red light, the second element substrate ETS2 may be a second active material layer MQWL2 in which the active material layer MQWL contains a material capable of emitting green light, and the third element substrate ETS3 may be a third active material layer MQWL3 in which the active material layer MQWL contains a material capable of emitting blue light. The layers formed on different element substrates ETS1, ETS2, and ETS3 may form the light emitting elements ED that emit lights of different colors in a subsequent process.

Figure 16:
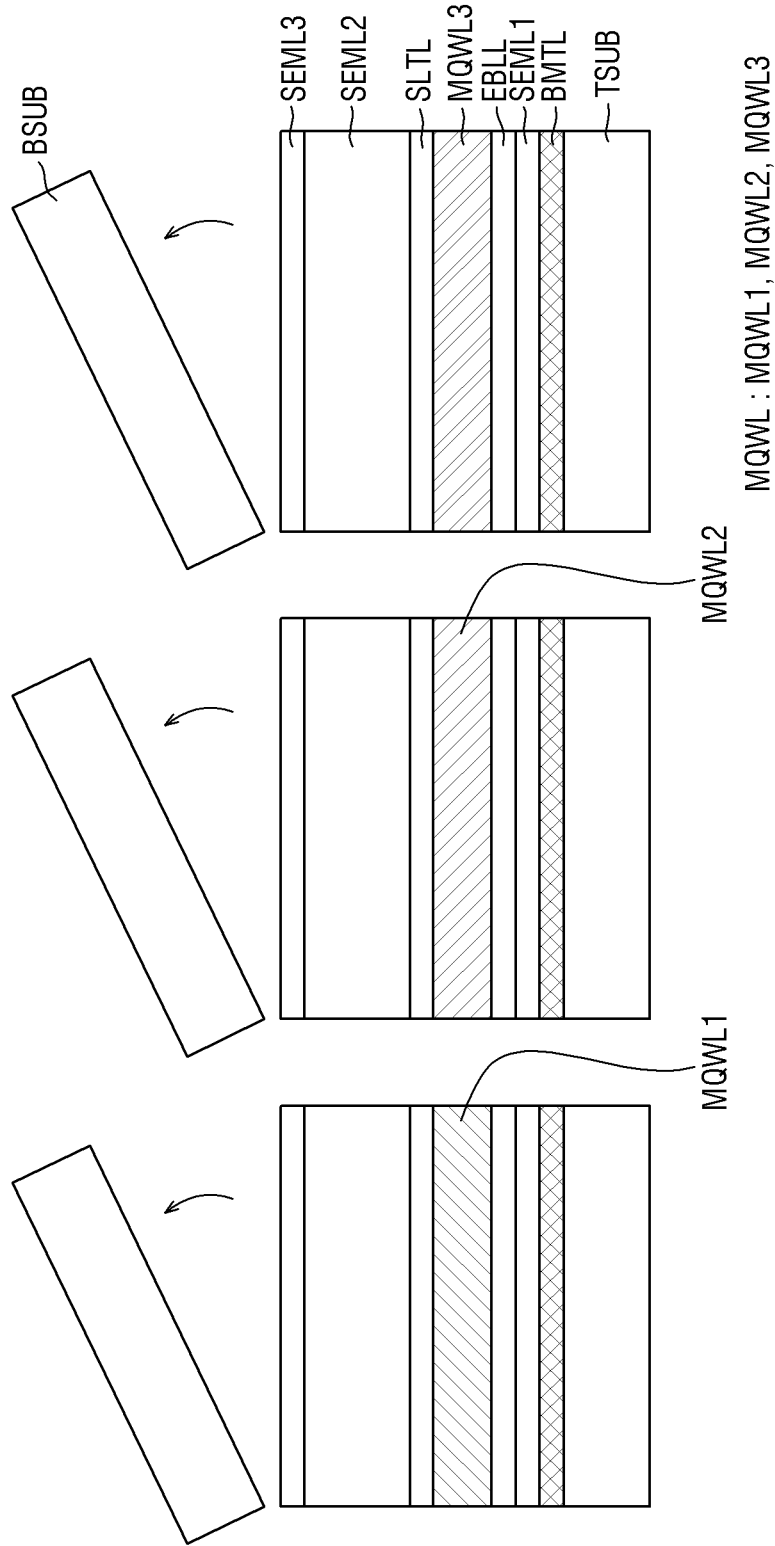

Referring to FIG. 16, the semiconductor material layers of the element substrates ETS1, ETS2, and ETS3 and the connection electrode layers BMTL are transferred onto a temporary substrate TSUB, and the base substrate BSUB is removed. The temporary substrate TSUB may be disposed on the connection electrode layer BMTL. The temporary substrate TSUB, which is a substrate on which the process of forming the hard mask layers HML1, HML2, and HML3 is performed during the manufacturing process of the light emitting element ED, may be removed later. The temporary substrate TSUB may include a transparent substrate such as a sapphire substrate, glass, or the like within the spirit and the scope of the disclosure. However, the disclosure is not limited thereto, and it may be formed of a conductive substrate such as GaN, SiC, ZnO, Si, GaP and GaAs. Since the semiconductor material layers of the element substrates ETS1, ETS2, and ETS3 are transferred to the temporary substrate TSUB, the third semiconductor material layer SEML3 may be exposed.

Figure 17:
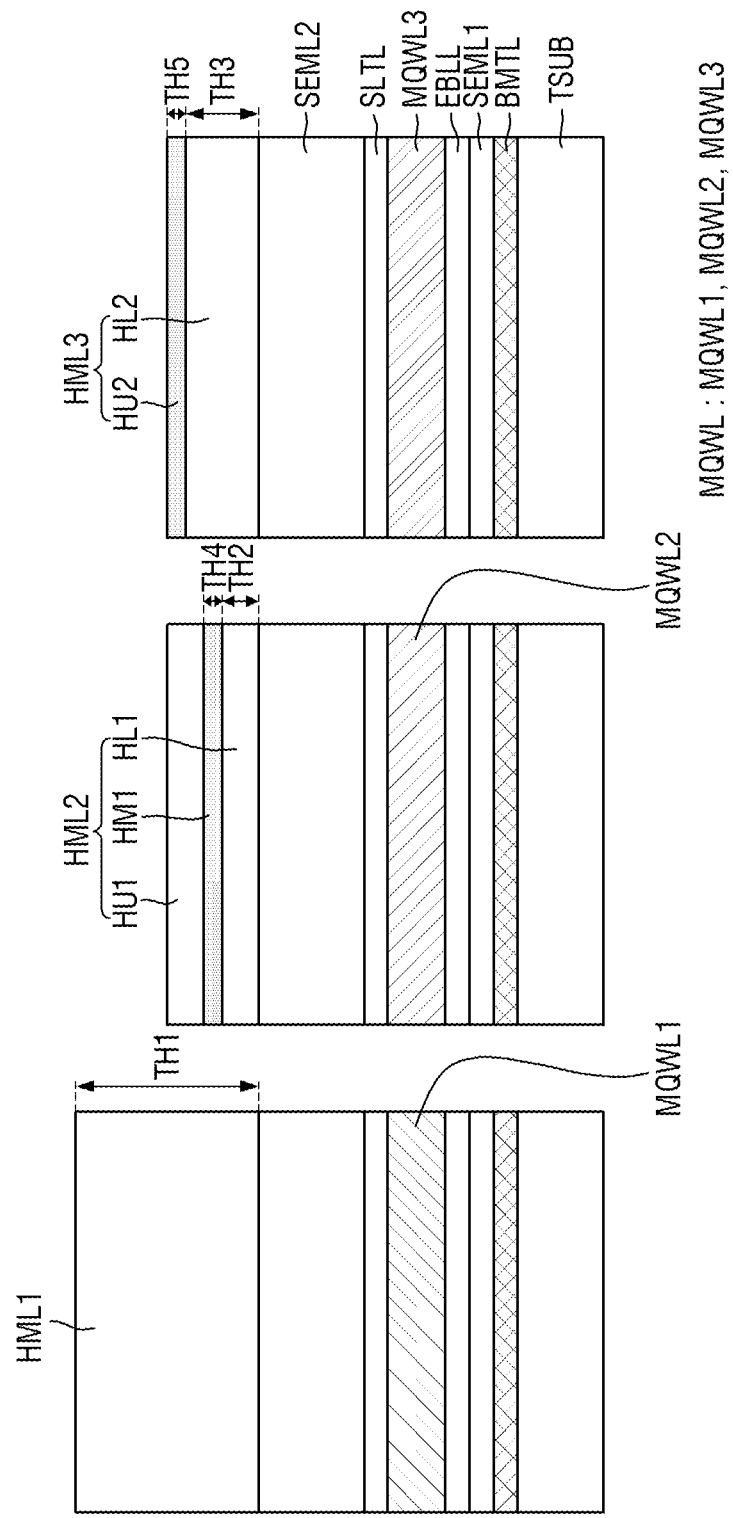

Referring to FIG. 17, among the semiconductor material layers, the third semiconductor material layer SEML3 is removed, and different hard mask layers HML1, HML2, and HML3 are formed on the second semiconductor material layer SEML2. A first hard mask layer HML1 may be disposed on the second semiconductor material layer SEML2 of the first element substrate ETS1, a second hard mask layer HML2 may be disposed on the second semiconductor material layer SEML2 of the second element substrate ETS2, and a third hard mask layer HML3 may be disposed on the second semiconductor material layer SEML2 of the third element substrate ETS3. The first hard mask layer HML1 may have a single layer structure made of a single material, and the second hard mask layer HML2 and the third hard mask layer HML3 may have a structure in which two or more layers may be stacked each other. The second hard mask layer HML2 may include a first mask base layer HL1, a first mask intermediate layer HM1, and a first mask upper layer HU1, and the third hard mask layer HML3 may include a second mask base layer HL2 and a second mask upper layer HU2 and a second mask intermediate layer HM2.

The first hard mask layer HML1, the first mask base layer HL1 and the first mask upper layer HU1 of the second hard mask layer HML2, and the first mask base layer HL2 of the third hard mask layer HML3 may contain a same material (or a similar material), and the first mask intermediate layer HM1 and the second mask upper layer HU2 may contain a same material (or a similar material). Each of the first hard mask layer HML1, the first mask base layer HL1, the first mask upper layer HU1, and the first mask base layer HL2 may contain an insulating material such as silicon oxide ($SiO_x$), silicon nitride ($SiN_x$), or silicon oxynitride ($SiO_xN_y$), similar to the above-described first base layer MLL1, and each of the first mask intermediate layer HM1 and the second mask upper layer HU2 may contain a metal material, similar to the first upper layer MLU1.

Each of the second hard mask layer HML2 and the third hard mask layer HML3 may include layers containing different materials and having different etching selectivities. Accordingly, in the process of etching any one layer, the other layers may function as an etching stopper. On the other hand, the first hard mask layer HML1 is formed as a single layer but has a thickness greater than those of the other hard mask layers HML2 and HML3, so that a part of the first hard mask layer HML1 may remain during the removal of the other hard mask layer HML2 and HML3. For example, a first thickness TH1 of the first hard mask layer HML1 may be greater than a second thickness TH2 of the first mask base layer HL1 and a third thickness TH3 of the second mask base layer HL2. The third thickness TH3 of the second mask base layer HL2 may be greater than the second thickness TH2 of the first mask base layer HL1. Accordingly, a part of the first hard mask layer HML1 may remain during the complete removal of the second hard mask layer HML2 and the third hard mask layer HML3.

On the contrary, a fourth thickness TH4 of the first mask intermediate layer HM1 may be the same as a fifth thickness TH5 of the second mask upper layer HU2. Since they have etching selectivities different from those of other layers, they may not have etching selectivities corresponding to thicknesses in the etching process.

Figure 18:
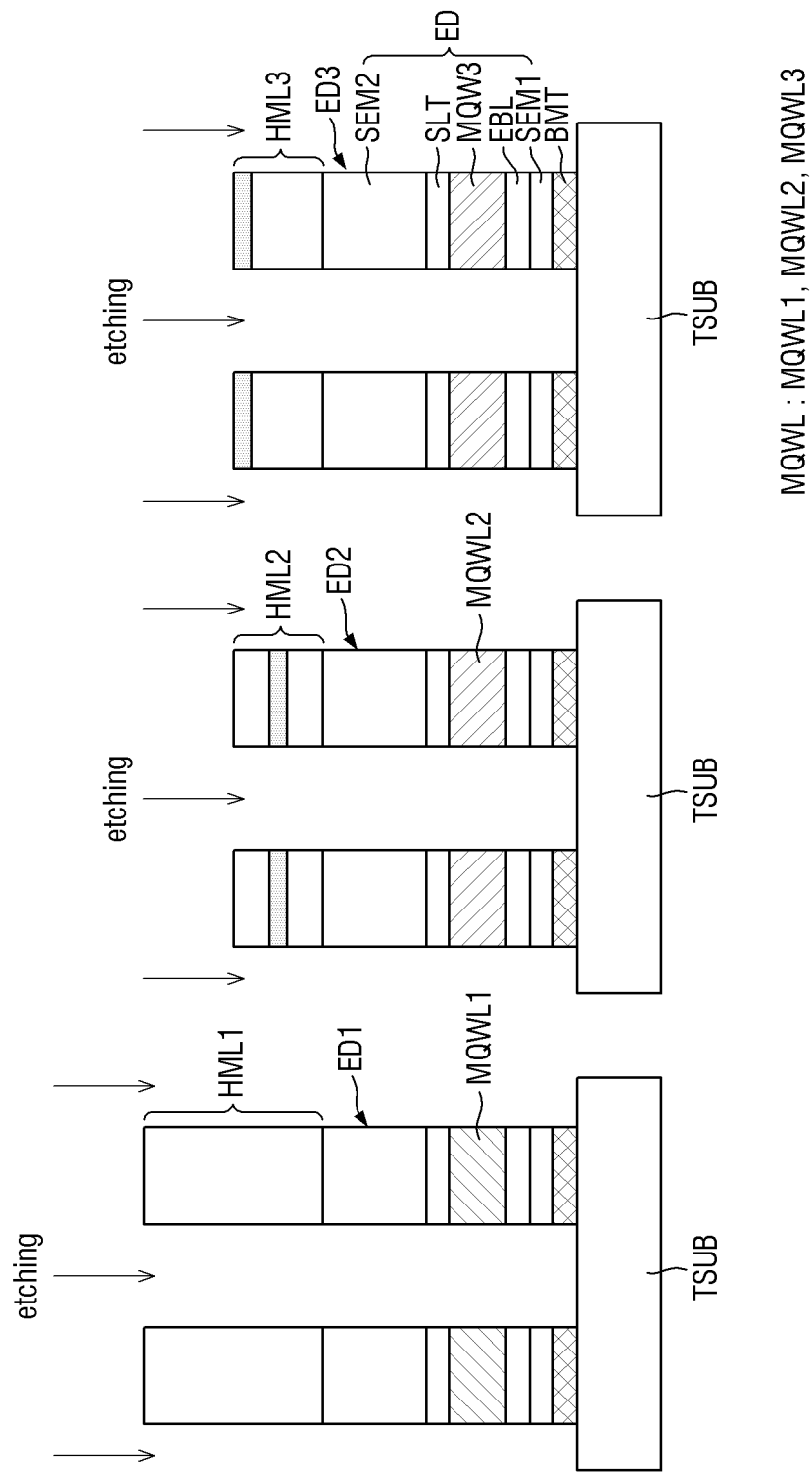

Referring to FIG. 18, the semiconductor material layers SEML2, SLTL, MQML, EBLL, and SEML1, the connection electrode layer BMTL, and the hard mask layers HML1, HML2, and HML3 are etched to form the light emitting elements ED on which the hard mask layers HML1, HML2, and HML3 are formed (step S10).

Although not shown in the drawing, the light emitting elements ED may be formed by a process of forming the mask pattern on the semiconductor material layers SEML2, SLTL, MQML, EBLL, and SEML1 and etching the portion where the mask pattern is not formed. The semiconductor material layers may be etched by a selected or given method. For example, the process of etching the semiconductor material layers may be performed by a dry etching method, a wet etching method, a reactive ion etching (ME) method, a deep reactive ion etching (DRIE) method, an inductively coupled plasma reactive ion etching (ICP-RIE) method, or the like within the spirit and the scope of the disclosure. The dry etching method may be suitable for vertical etching because anisotropic etching can be performed. In the case of using the aforementioned etching technique, it may be possible to use $Cl_2$ or $O_2$ as an etchant. However, the disclosure is not limited thereto.

The semiconductor material layers of the first element substrate ETS1 may be etched to form a red light emitting element ED_R including the first active layer MQW1, the semiconductor material layers of the second element substrate ETS2 may be etched to form a green light emitting element ED_G including the second active layer MQW2, and the semiconductor material layers of the third element substrate ETS3 may be etched to form a blue light emitting element ED_B including the third active layer MQW3. The red light emitting element ED_R, the green light emitting element ED_G, and the blue light emitting element ED_B may include in common the second semiconductor layer SEM2, the superlattice layer SLT, the active layer MQW, the electron blocking layer EBL, and the first semiconductor layer SEM1.

The first hard mask layer HML1 may be disposed on the red light emitting elements ED_R, the second hard mask layer HML2 may be disposed on the green light emitting elements ED_G, and the third hard mask layer HML3 may be disposed on the blue light emitting elements ED_B. They may be selectively removed or partially removed to form the mask layer ML in a subsequent process.

FIGS. 19 to 26 are schematic cross-sectional views illustrating a transfer process of light emitting elements during the manufacturing process of a display device according to one embodiment. The process of transferring the light emitting elements ED (step S20) and the process of selectively removing the hard mask layers HML1, HML2, and HML3 (step S30) will be described with reference to FIGS. 19 to 26.

Figure 19:
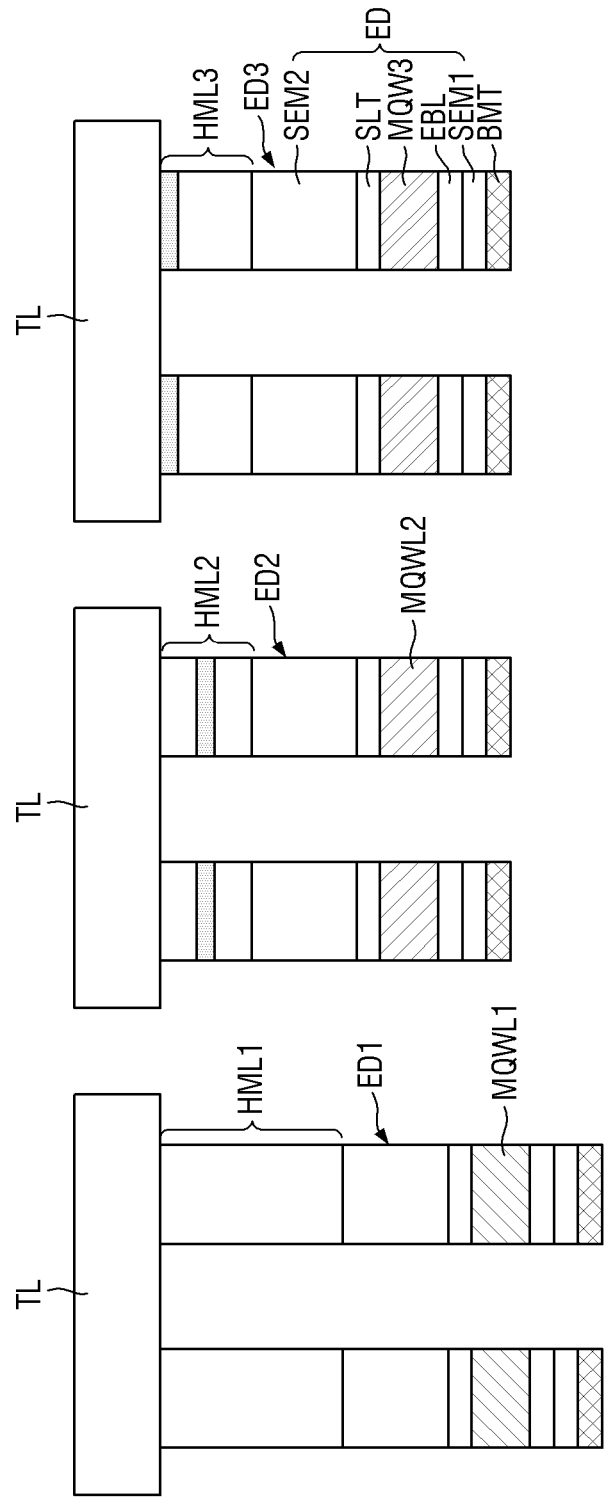
FIGS. 19 to 26 are schematic cross-sectional views illustrating a transfer process of light emitting elements during the manufacturing process of a display device according to one embodiment.
Figure 20:
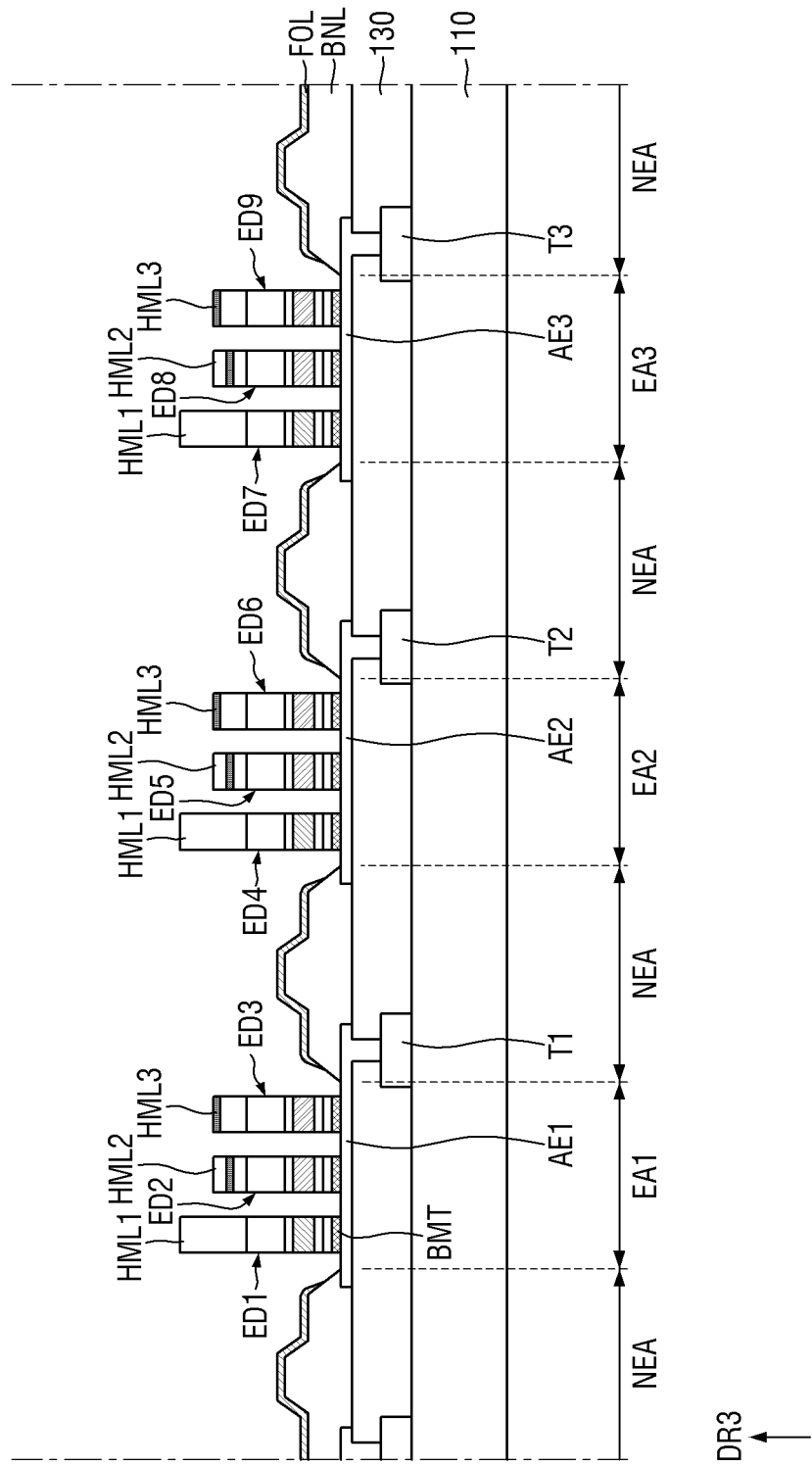

Referring to FIGS. 19 and 20, the light emitting elements ED on which the hard mask layers HML1, HML2, and HML3 are formed are transferred onto a transfer film TL, and transferred onto the first substrate 110 on which the anode electrodes AE1, AE2, and AE3 are disposed in each of the emission areas EA1, EA2, and EA3 (step S20).

The transfer film TL may contain a stretchable material. The stretchable material may include, for example, polyolefine, polyvinyl chloride (PVC), elastomeric silicone, elastomeric polyurethane, elastomeric polyisoprene, or the like within the spirit and the scope of the disclosure. The transfer film TL may include a support layer and an adhesive layer to adhere and support the light emitting elements ED on which the hard mask layers HML1, HML2, and HML3 are formed.

The transfer film TL may be disposed on the hard mask layers HML1, HML2, and HML3. In case that the transfer film TL is disposed, the temporary substrate TSUB disposed thereunder may be removed, and the connection electrodes BMT disposed at one ends of the light emitting elements ED (ED1, ED2, and ED3) may be exposed.

In case that the connection electrodes BMT are exposed, the light emitting elements ED are transferred onto the first substrate 110 on which the anode electrodes AE1, AE2, and AE3 are disposed. The light emitting elements ED may be transferred such that the connection electrode BMT disposed on the first semiconductor layer SEM1 is in direct contact with the anode electrodes AE1, AE2, and AE3. In case that the light emitting elements ED are disposed on the anode electrodes AE1, AE2, and AE3, the transfer film TL is removed.

In accordance with one embodiment, in the manufacturing process of the display device 10, different light emitting elements ED1, ED2, and ED3 including different active layers MQW1, MQW2, MQW3 may be disposed on the anode electrodes AE1, AE2, and AE3, respectively, regardless of the emission areas EA1, EA2, and EA3. The red light emitting element ED_R including the first active layer MQW1 may be disposed in each of the first emission area EA1, the second emission area EA2, and the third emission area EA3. In this manner, the green light emitting element ED_G including the second active layer MQW2 and the blue light emitting element ED_B including the third active layer MQW3 may be disposed in each of the first emission area EA1, the second emission area EA2, and the third emission area EA3. The red light emitting element ED_R may be the first light emitting element ED1, the fourth light emitting element ED4, and the seventh light emitting element ED7 in each of the emission areas EA1, EA2, and EA3. The green light emitting element ED_G may be the second light emitting element ED2, the fifth light emitting element ED5, and the eighth light emitting element ED8 in each of the emission areas EA1, EA2, and EA3, and the blue light emitting element ED_B may be the third light emitting element ED3, the sixth light emitting element ED6, and the ninth light emitting element ED9 in each of the emission areas EA1, EA2, and EA3. The first hard mask layer HML1 may be disposed on the first light emitting element ED1, the fourth light emitting element ED4, and the seventh light emitting element ED7, the second hard mask layer HML2 may be disposed on the second light emitting element ED2, the fifth light emitting element ED5, and the eighth light emitting element ED8, and the third hard mask layer HML3 may be disposed on the third light emitting element ED3, the sixth light emitting element ED6, and the ninth light emitting element ED9.

Among the light emitting elements ED disposed in each of the emission areas EA1, EA2, and EA3, the light emitting elements including the same active layer MQW, for example, the red light emitting elements ED_R, the green light emitting elements ED_G, and the blue light emitting elements ED_B, are transferred from the same transfer film TL, so that the relative layout and arrangement thereof may be the same in each of the emission areas EA1, EA2, and EA3. For example, in case that the second light emitting element ED2 is disposed on one side or a side of the first light emitting element ED1 in the first emission area EA1, the fifth light emitting element ED5 may be disposed on one side or a side of the fourth light emitting element ED4 in the second emission area EA2, and the eighth light emitting element ED8 may be disposed on one side or a side of the seventh light emitting element ED7 in the third emission area EA3. In case that the third light emitting element ED3 is disposed on the other side of the first light emitting element ED1 in the first emission area EA1, the sixth light emitting element ED6 may be disposed on the other side of the fourth light emitting element ED4 in the second emission area EA2, and the ninth light emitting element ED9 may be disposed on the other side of the seventh light emitting element ED7 in the third emission area EA3. The arrangement of different types of light emitting elements ED may be random in each of the emission areas EA1, EA2, and EA3, but the arrangement of the light emitting elements ED in different emission areas EA1, EA2, and EA3 may be the same.

Figure 21:
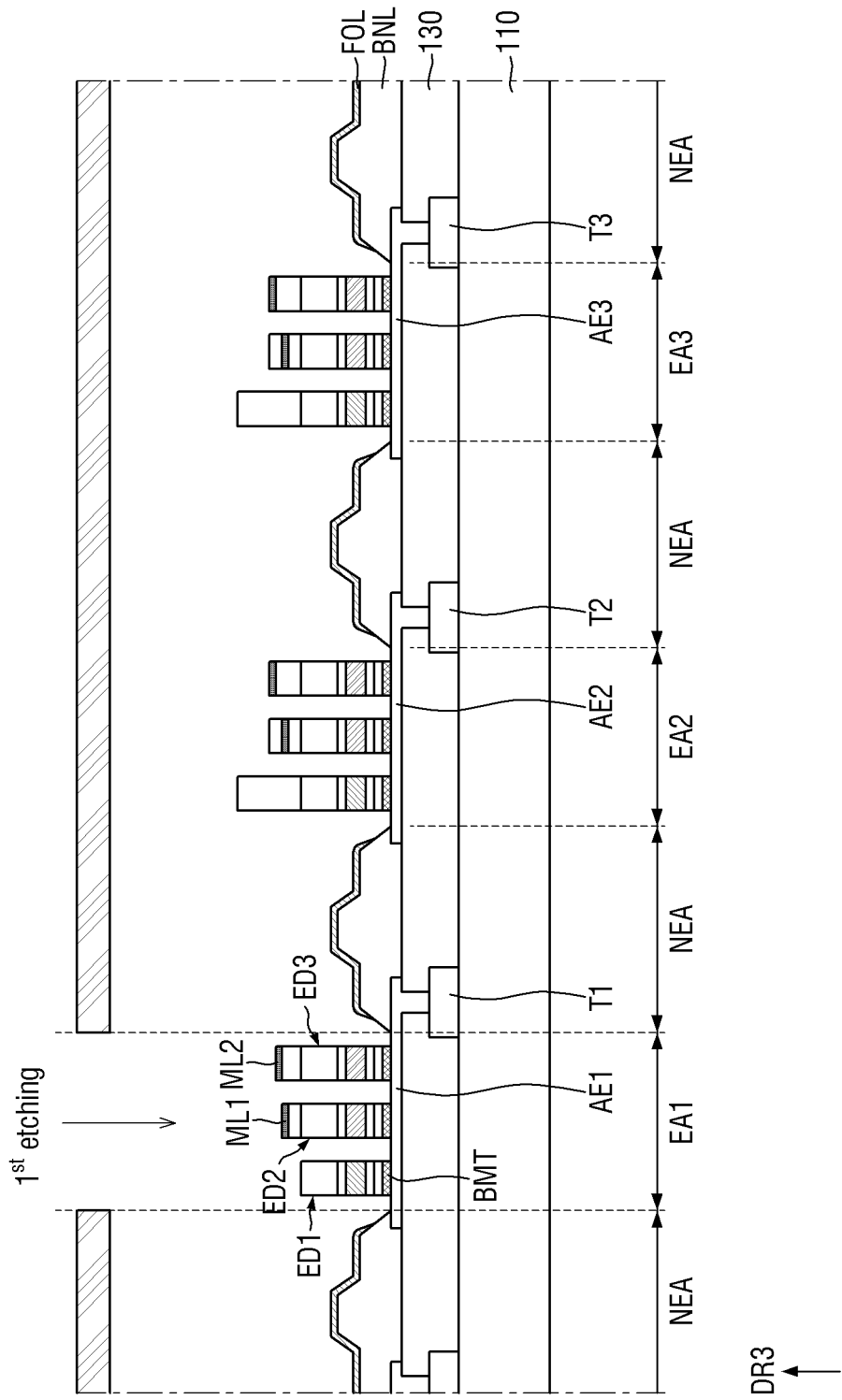

Referring to FIG. 21, the hard mask layers HML1, HML2, and HML3 are etched in the first emission area EA1 to expose one end or an end of the first light emitting element ED1 and form the first mask layer ML1 and the second mask layer ML2. In this step, a process for selectively exposing only the first light emitting element ED1 in the first emission area EA1 is performed. A first etching process ($1^{st}$ etching) in which a mask is disposed on the first substrate 110 to expose only the first emission area EA1, and the hard mask layers HML1, HML2, and HML3 are etched in the first emission area EA1 is performed. The first etching process may be performed as a process for removing the first hard mask layer HML1. During the first etching process ($1^{st}$ etching), the first hard mask layer HML1 disposed on the first light emitting element ED1 may be completely removed. The second hard mask layer HML2 disposed on the second light emitting element ED2 may form the first mask layer ML1 due to the removal of the first mask upper layer HU1, and the third hard mask layer HML3 may form the second mask layer ML2 because the second mask upper layer HU2 has a different etching selectivity and thus is not etched. The first emission area EA1 may selectively expose the first light emitting element ED1 only by performing an etching process only once.

Figure 22:
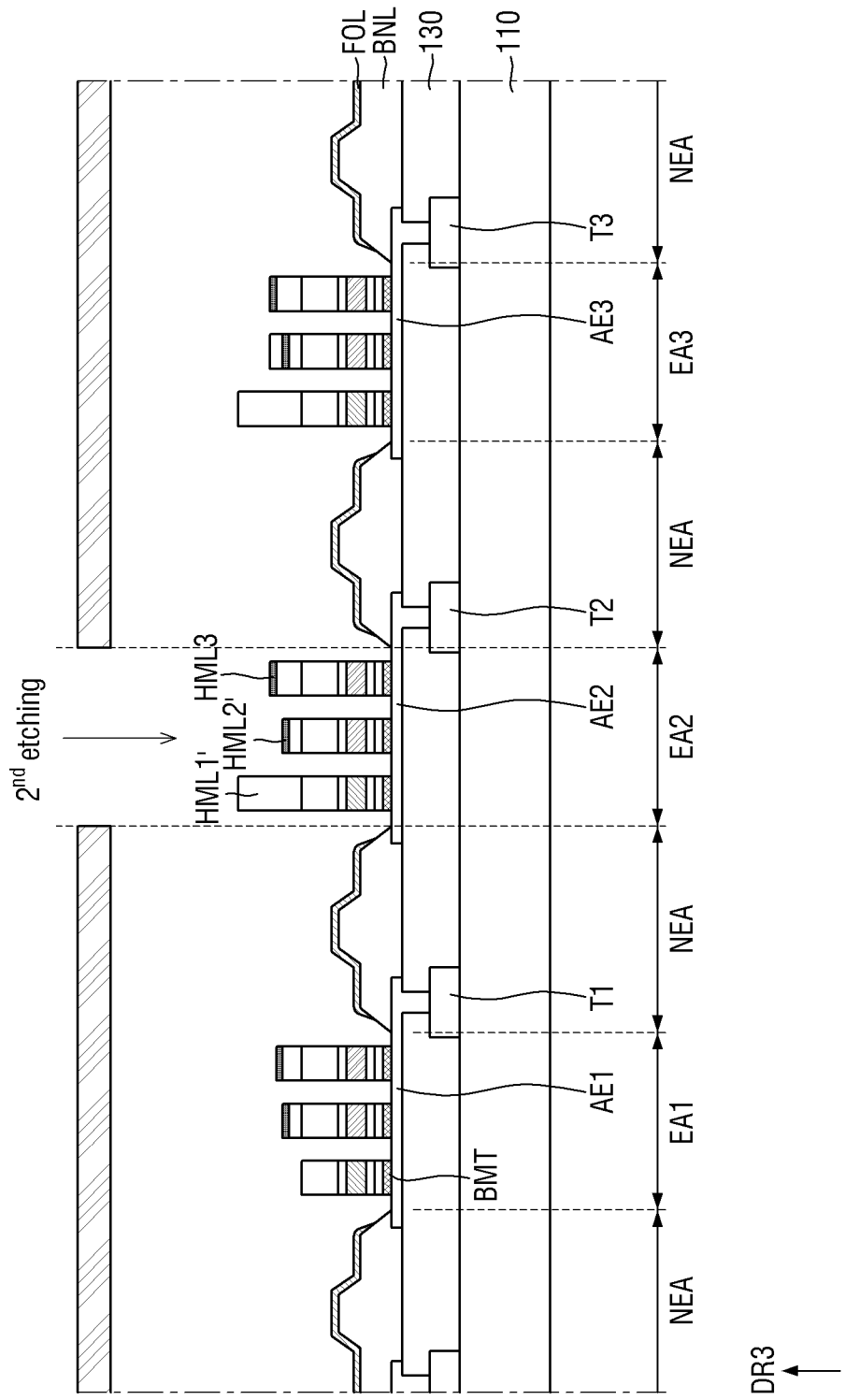
Figure 23:
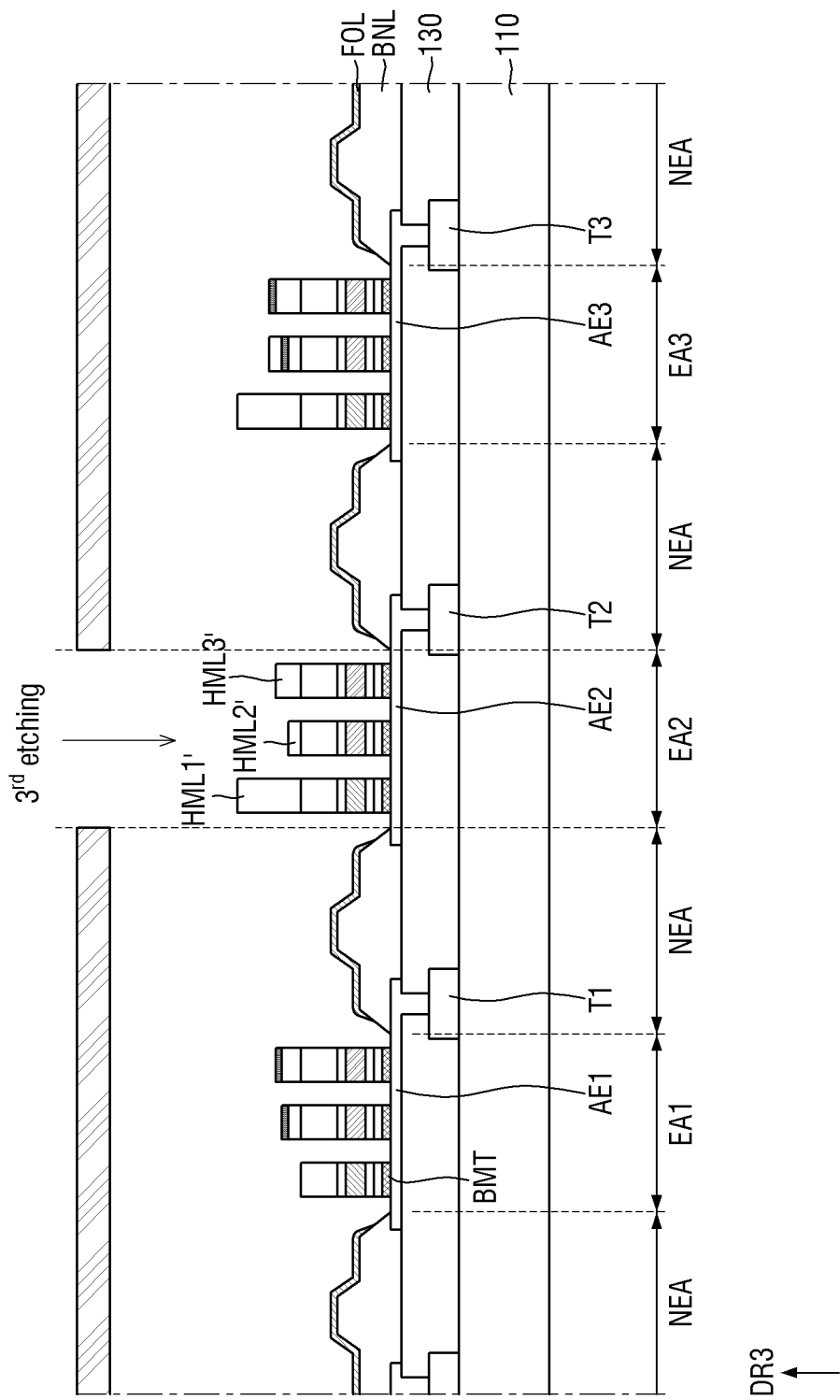
Figure 24:
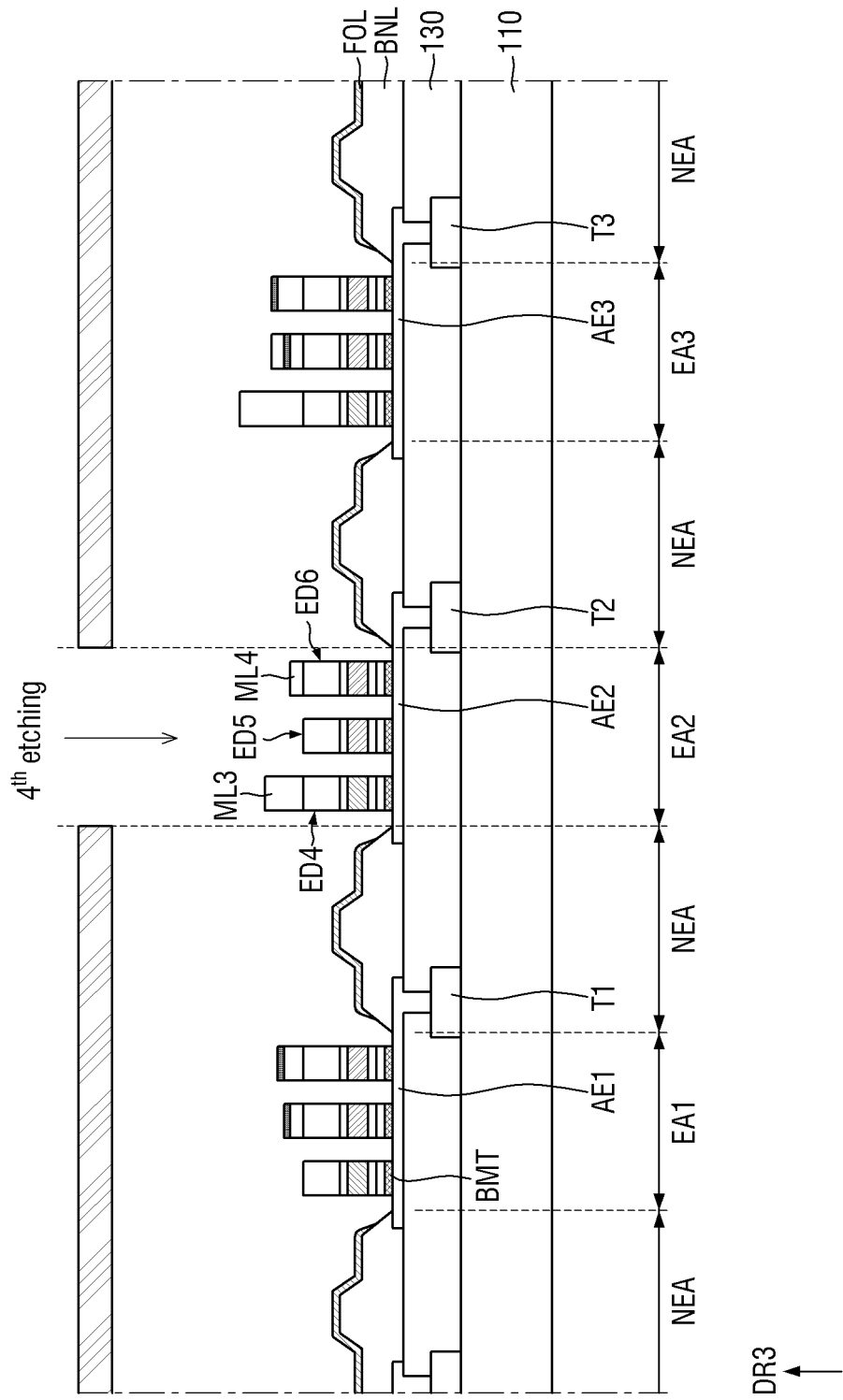

Referring to FIGS. 22 to 24, the hard mask layers HML1, HML2, and HML3 are etched in the second emission area EA2 to expose one end or an end of the fifth light emitting element ED5 and form the third mask layer ML3 and the fourth mask layer ML4. In this step, a process for selectively exposing only the fifth light emitting element ED5 in the second emission area EA2 is performed. Second to fourth etching processes ($2^{nd}$, $3^{rd}$, and $4^{th}$ etching) in which a mask is disposed on the first substrate 110 to expose only the second emission area EA2, and the hard mask layers HML1, HML2, and HML3 are etched in the second emission area EA2 are performed.

First, the second etching process ($2^{nd}$ etching) may be performed as a process of removing the first mask upper layer HU1 of the second hard mask layer HML2. During the second etching process ($2^{nd}$ etching), the first mask upper layer HU1 may be completely removed, and the first hard mask layer HML1 may be partially removed (HML1'). The third hard mask layer HML3 may not be etched because the second mask upper layer HU2 serves as an etching stopper.

The third etching process ($3^{rd}$ etching) may be performed as a process of removing a first mask intermediate layer HM1 of a second hard mask layer HML2'. During the third etching process ($3^{rd}$ etching), the first mask intermediate layer HM1 may be completely removed, and the second mask upper layer HU2 of the third hard mask layer HML3 may be removed. The first hard mask layer HML1' may not be etched because it has a different etching selectivity.

The fourth etching process ($4^{th}$ etching) may be performed as a process of removing a first mask base layer HL1 of the second hard mask layer HML2'. During the fourth etching process ($4^{th}$ etching), the first mask base layer HL1 may be completely removed, and the first hard mask layer HML1' and a second mask base layer HL2 of a third hard mask layer HML3' may be partially removed. As described above, the thickness of the first mask base layer HL1 is smaller than (or less than) those of the first hard mask layer HML1' and the second mask base layer HL2 of the third hard mask layer HML3', so that the first hard mask layer HML1' and the second mask base layer HL2 of the third hard mask layer HML3' may partially remain during the complete removal of the first mask base layer HL1. They may form the third mask layer ML3 and the fourth mask layer ML4, respectively. In the second emission area EA2, the fifth light emitting element ED5 may be selectively exposed by performing the etching process three times.

Figure 25:
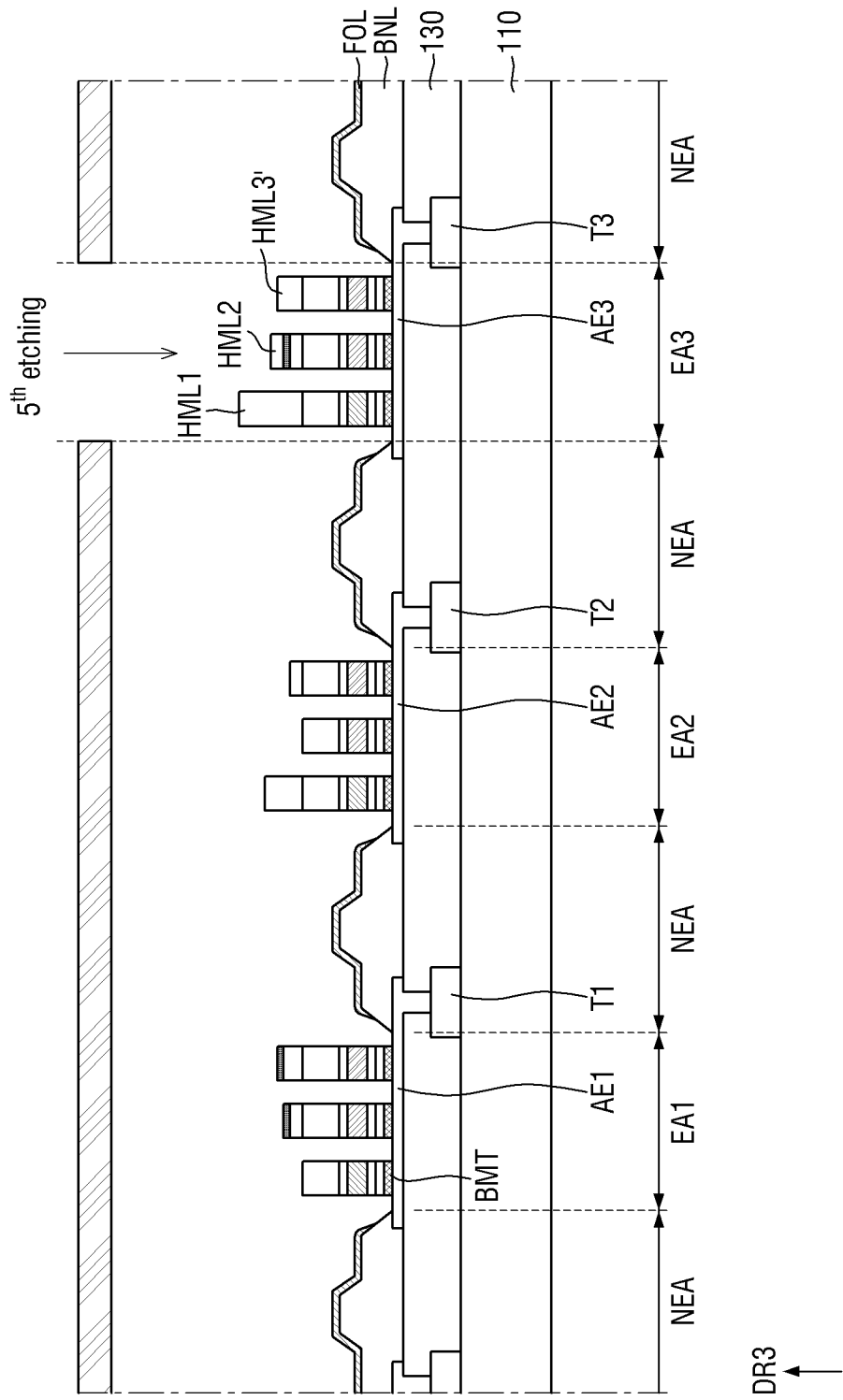
Figure 26:
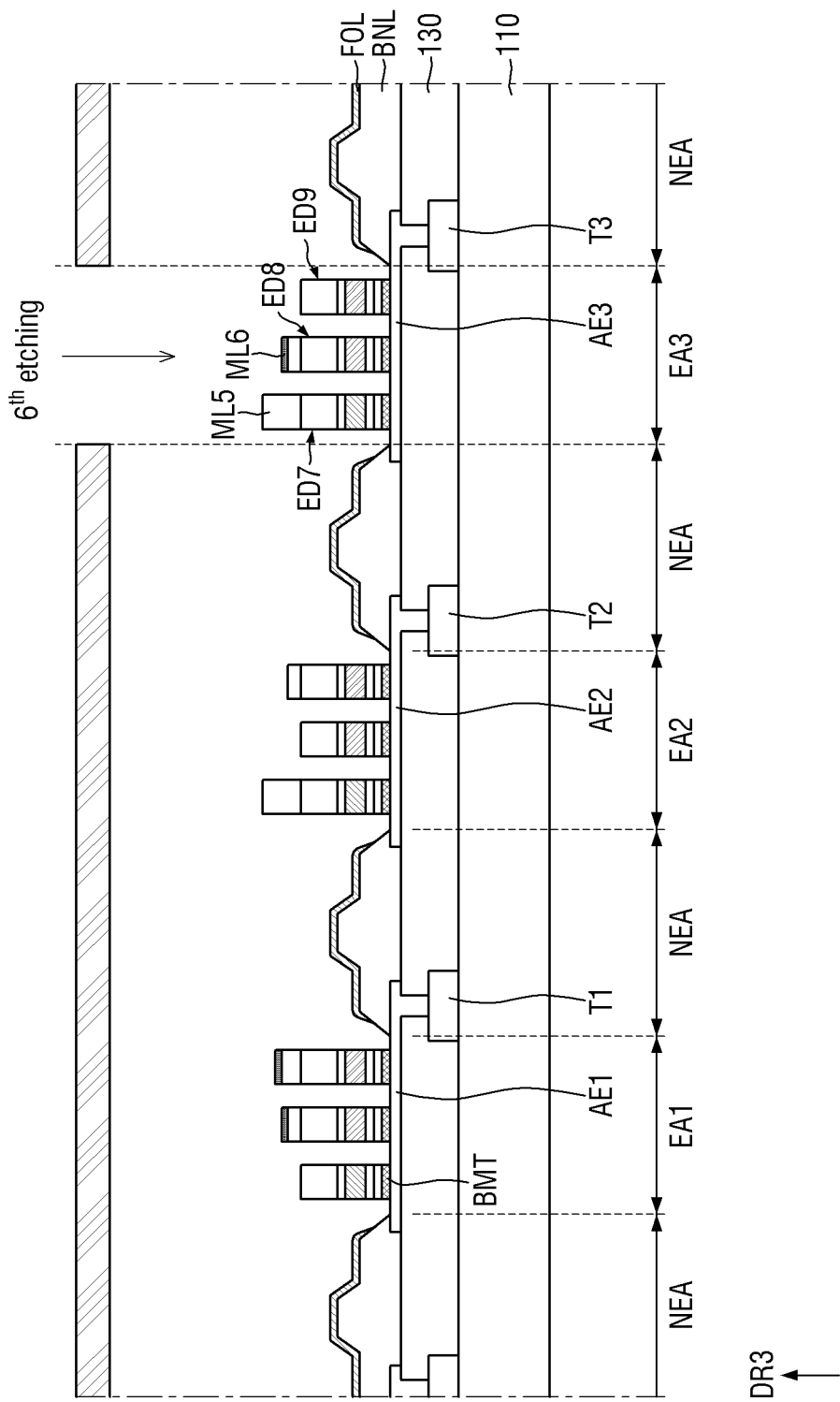

Referring to FIGS. 25 and 26, the hard mask layers HML1, HML2, and HML3 are etched in the third emission area EA3 to expose one end or an end of the ninth light emitting element ED9 and form the fifth mask layer ML5 and the sixth mask layer ML6. In this step, a process for selectively exposing only the ninth light emitting element ED9 in the third emission area EA3 is performed. Fifth and sixth etching processes (5$^{th}$ and 6$^{th}$ etching) in which a mask is disposed on the first substrate 110 to expose only the third emission area EA3, and the hard mask layers HML1, HML2, and HML3 are etched in the third emission area EA3 are performed.

First, the fifth etching process (5$^{th}$ etching) may be performed as a process of removing the second mask upper layer HU2 of the third hard mask layer HML3. During the fifth etching process (5$^{th}$ etching), the second mask upper layer HU2 may be completely removed, and the first hard mask layer HML1 and the second hard mask layer HML2 may not be etched.

The sixth etching process (6$^{th}$ etching) may be performed as a process of removing the second mask base layer HL2 of the third hard mask layer HML3'. During the sixth etching process (6$^{th}$ etching), the second mask base layer HL1 may be completely removed, and a part of the first hard mask layer HML1 and the first mask upper layer HU1 of the second hard mask layer HML2 may be removed. Since the first hard mask layer HML1 has a thickness greater than that of the second mask base layer HL2, only a part of the first hard mask layer HML1 may be etched during the removal of the second mask base layer HL2. The etching of the second hard mask layer HML2 may be stopped because the first mask upper layer HU1 has been completely removed and the first mask intermediate layer HM1 serves as an etching stopper. They may form the fifth mask layer ML5 and the sixth mask layer ML6, respectively. In the third emission area EA3, the ninth light emitting element ED9 may be selectively exposed by performing the etching process twice.

The light emitting elements ED transferred onto the first substrate 110 may be selectively exposed by the above-described processes. Different types of light emitting elements ED1, ED5, and ED9 may be selectively exposed in each of the emission areas EA1, EA2, and EA3, and different mask layers ML (ML1 to ML6) may be disposed on the other light emitting elements ED. Since the display device 10 repeatedly transfers different types of light emitting elements ED in each of the emission areas EA1, EA2, and EA3, the transfer process may be simplified. A process of selectively exposing specific light emitting elements ED to correspond to each of the emission areas EA1, EA2, and EA3 may be performed so that different lights may be emitted from different emission areas EA1, EA2, and EA3.

Although not shown in the drawing, the display device 10 may be manufactured by forming the second insulating layer 150 and the cathode electrode CE on the light emitting elements ED. In the first emission area EA1, only the first light emitting element ED1 may be electrically connected to the cathode electrode CE to emit red light. In the second emission area EA2, only the fifth light emitting element ED5 may be electrically connected to the cathode electrode CE to emit green light. In the third emission area EA3, only the ninth light emitting element ED9 may be electrically connected to the cathode electrode CE to emit blue light.

Hereinafter, various embodiments of the display device 10 will be described with reference to other drawings.

Figure 27:
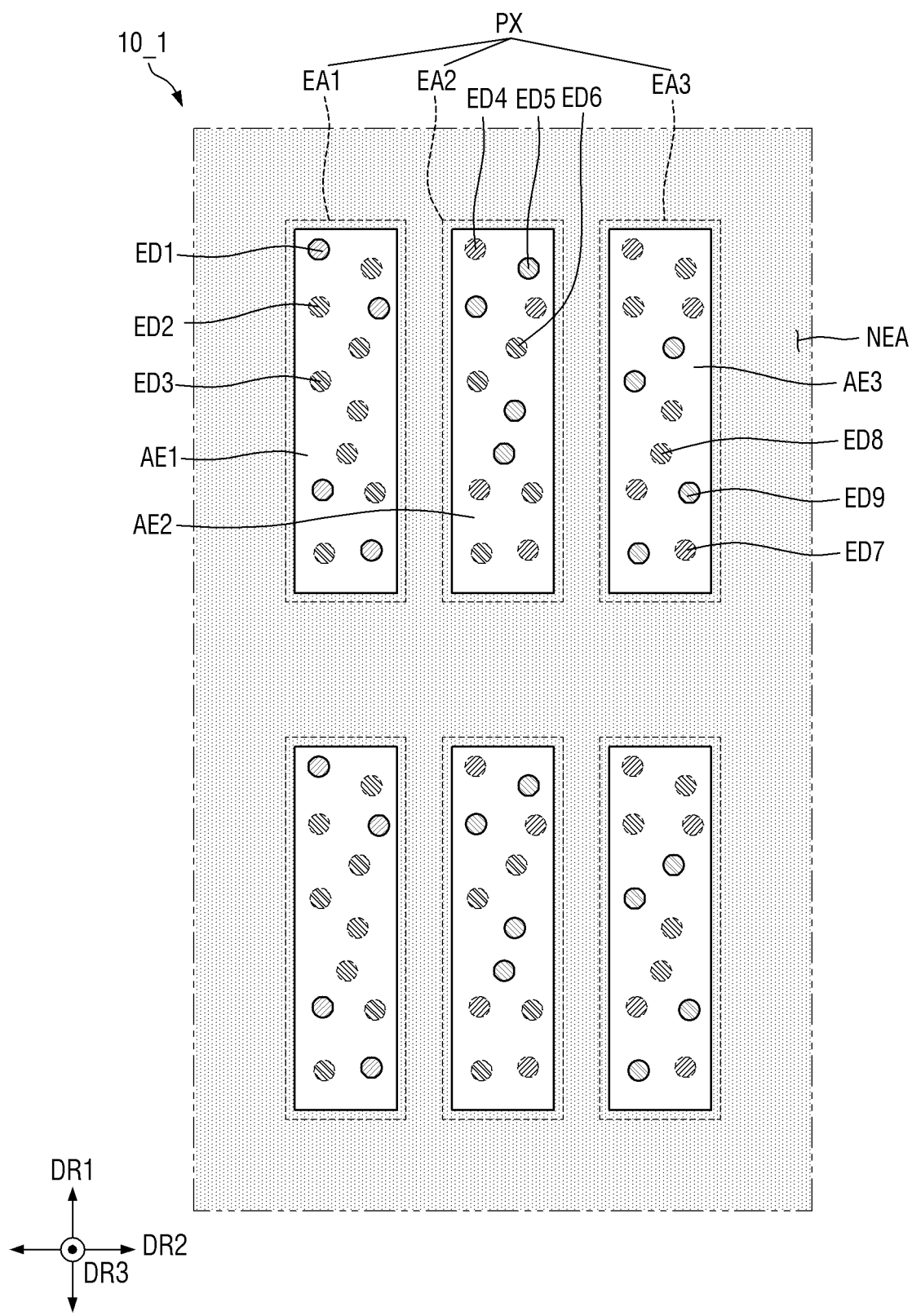
FIG. 27 is a schematic plan view separately illustrating light emitting elements disposed in emission areas of a display device according to an embodiment.

FIG. 27 is a schematic plan view separately illustrating light emitting elements disposed in emission areas of a display device according to an embodiment.

Referring to FIG. 27, in a display device 10_1 according to one embodiment, different light emitting elements ED (ED1 to ED9) disposed in each of the emission areas EA1, EA2, and EA3 may be arranged randomly. The embodiment is different from the embodiment of FIG. 2 in that the arrangement of the light emitting elements ED is different.

In the embodiment of FIG. 2, different types of light emitting elements ED disposed in each of the emission areas EA1, EA2, and EA3 may be regularly arranged in the first direction DR1 and the second direction DR2. On the contrary, in the embodiment, different types of light emitting elements ED disposed in each of the emission areas EA1, EA2, and EA3 may be irregularly arranged. For example, in the first emission area EA1 of FIG. 2, a pair of the first light emitting elements ED1, a pair of the second light emitting elements ED2, and a pair of the third light emitting elements ED3 may be parallel to each other while being spaced apart from each other in the first direction DR1, and the gaps therebetween may be substantially the same. On the other hand, in the first emission area EA1 of FIG. 27, a pair of the first light emitting elements ED1, a pair of the second light emitting elements ED2, and a pair of the third light emitting elements ED3 may be spaced apart from each other without being parallel to each other, and the gaps therebetween may be different. Further, the gaps between different first light emitting elements ED1 adjacent to each other in the first emission area EA1 of FIG. 2 may be substantially the same and regular, whereas the gaps between different first light emitting elements ED1 adjacent to each other in the first emission area EA1 of FIG. 27 may be different and random. However, also in the embodiment, the arrangement of the light emitting elements ED disposed in the first emission area EA1, for example, the relative arrangement of the first light emitting element ED1, the second light emitting element ED2, and the third light emitting element ED3, may be the same as those in the second emission area EA2 and the third emission area EA3.

The display device 10_1 is advantageous in that the alignment of the first substrate 110 and the transfer film TL is relatively flexible in the process of transferring the light emitting elements ED onto the first substrate 110 because different types of light emitting elements ED are randomly arranged. The embodiment is advantageous in that the alignment of the first substrate 110 and the transfer film TL may have an error with respect to a design value or they may not be completely aligned.

Figure 28:
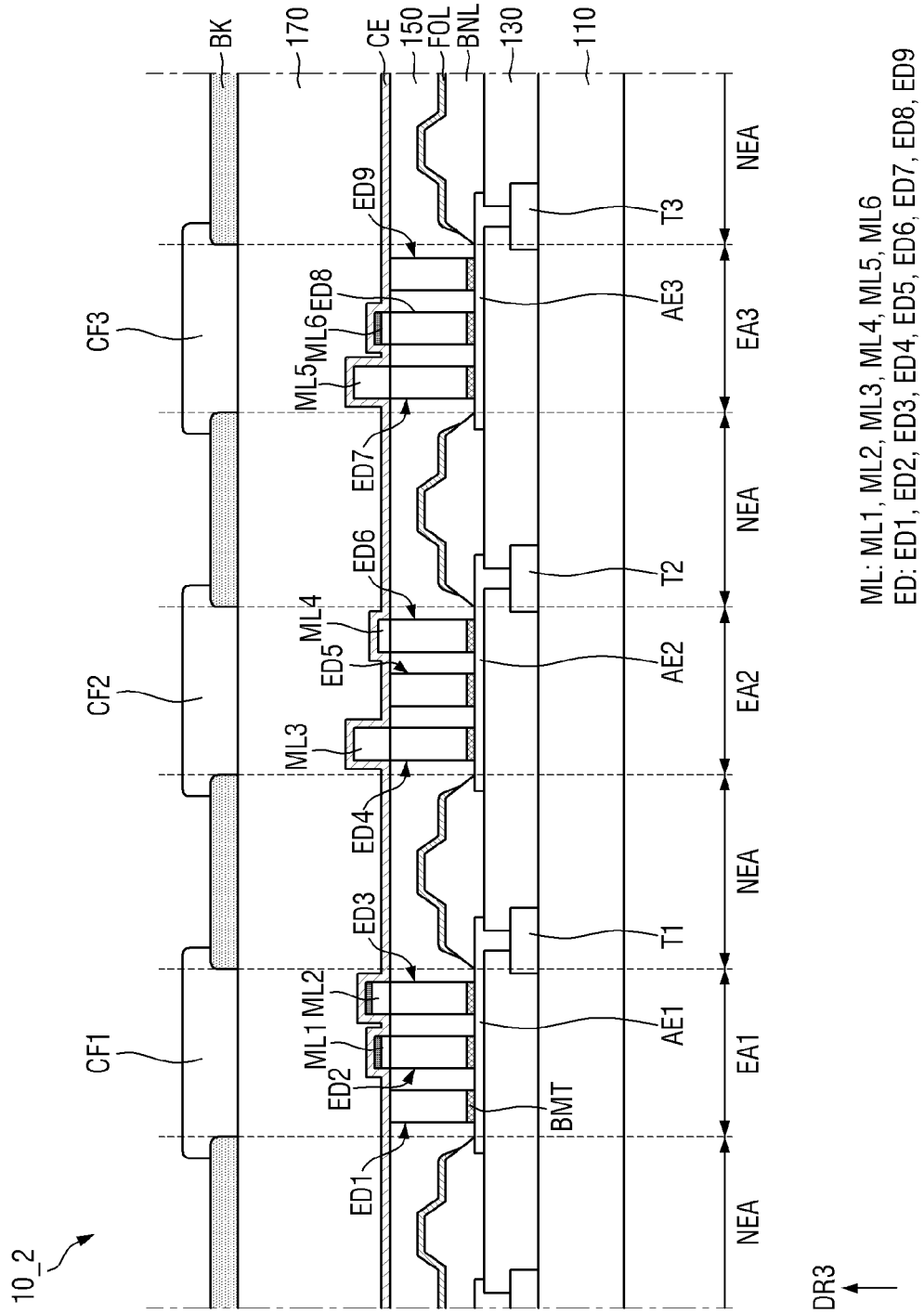
FIG. 28 is a schematic cross-sectional view of a display device according to an embodiment.

FIG. 28 is a schematic cross-sectional view of a display device according to an embodiment.

Referring to FIG. 28, a display device 10_2 according to one embodiment may further include a third insulating layer 170, a light blocking member BK, and color filters CF1, CF2, and CF3 disposed on the cathode electrode CE. In the embodiment, the color filters CF1, CF2, and CF3 disposed to correspond to the emission areas EA1, EA2, and EA3 are further included, so that the color purity of the emitted light may be further improved. In the following description, redundant description will be omitted while focusing on differences.

The third insulating layer 170 may be disposed on the cathode electrode CE. The third insulating layer 170 may flatten a stepped portion disposed thereunder so that the light blocking member BK and the color filters CF1, CF2, and CF3 to be described later may be disposed. The third insulating layer 170 may have a thickness that is enough to flatten the top surface thereof regardless of the stepped portion of the cathode electrode CE disposed thereunder.

The third insulating layer 170 may contain a transparent inorganic insulating material or a transparent organic insulating material.

The light blocking member BK may be disposed on the third insulating layer 170. The light blocking member BK may overlap the non-emission area NEA to block transmission of light. The light blocking member BK may be disposed in a grid shape in a plan view, similar to the bank layer BNL. The light blocking member BK may be disposed to overlap the bank layer BNL and the first organic layer FOL, and may not overlap the emission areas EA1, EA2, and EA3.

In one embodiment, the light blocking member BK may contain an organic light blocking material, and may be formed by a process of coating and exposing the organic light blocking material. The light blocking member BK may include a dye or a pigment having a light blocking property, and may be a black matrix.

The color filters CF1, CF2, and CF3 may be disposed on the third insulating layer 170. The color filters CF1, CF2, and CF3 may be respectively disposed to correspond to regions opened by the light blocking members BK. Different color filters CF1, CF2, and CF3 may be disposed to be spaced apart from each other, but the disclosure is not limited thereto.

The color filters CF1, CF2, and CF3 may include a first color filter CF1, a second color filter CF2, and a third color filter CF3. The first color filter CF1 may be disposed to overlap the first emission area EA1. The second color filter CF2 may be disposed to overlap the second emission area EA2 of the bank layer BNL, and the third color filter CF3 may be disposed to overlap the third emission area EA3 of the bank layer BNL.

The color filters CF1, CF2, and CF3 may be disposed to fill the regions opened by the light blocking members BK, and may be partially disposed on the light blocking members BK. However, the disclosure is not limited thereto, and the color filters CF1, CF2, and CF3 may be disposed in the regions opened by the light blocking members BK. Each of the color filters CF1, CF2, and CF3 may be disposed in an island-shaped pattern, but the disclosure is not limited thereto. For example, each of the color filters CF1, CF2, and CF3 may form a linear pattern extending in one direction or in a direction in the display area DPA. In one embodiment, the first color filter CF1 may be a red color filter, the second color filter CF2 may be a green color filter, and the third color filter CF3 may be a blue color filter. Each of the color filters CF1, CF2, and CF3 may transmit only some of the lights emitted from the light emitting element ED, and may block transmission of the other lights. In the display device 10_2 according to one embodiment, the lights emitted from the light emitting element ED are emitted through the color filters CF1, CF2, and CF3, so that the color purity may be further improved.

Figure 29:
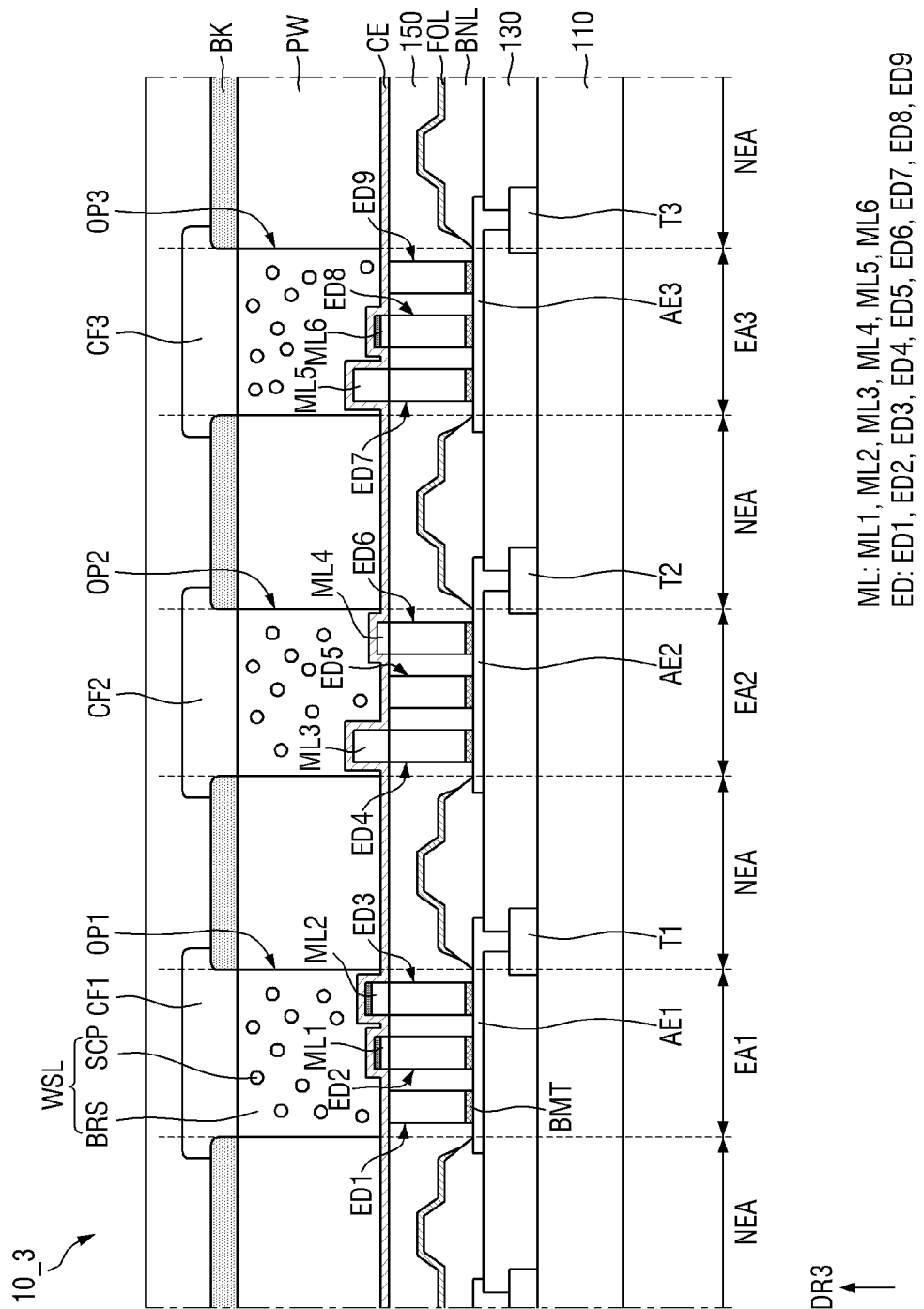
FIG. 29 is a schematic cross-sectional view of a display device according to an embodiment.

FIG. 29 is a schematic cross-sectional view of a display device according to an embodiment.

Referring to FIG. 29, a display device 10_3 according to one embodiment may further include a partition wall (or bank) PW, a light scattering layer WSL, the light blocking member BK, and the color filters CF1, CF2, and CF3 disposed on the cathode electrode CE. The embodiment is different in that the third insulating layer 170 is replaced with the partition wall PW and the light scattering layer WSL is further disposed between the color filters CF1, CF2, CF3 and the cathode electrode CE. In the following description, redundant description will be omitted while focusing on differences.

The partition wall PW may be disposed on the cathode electrode CE of the display area DPA, and may partition the emission areas EA1, EA2, and EA3, similar to the bank layer BNL. The partition wall PW may be disposed to extend in the first direction DR1 and the second direction DR2, and may be formed in a grid pattern in the entire display area DPA. Further, the partition wall PW may not overlap the emission areas EA1, EA2, and EA3, and may overlap the non-emission area NEA.

The partition wall PW may include openings OP1, OP2, and OP3 exposing the cathode electrode CE disposed thereunder. The openings OP1, OP2, and OP3 may include a first opening OP1 overlapping the first emission area EA1, a second opening OP2 overlapping the second emission area EA2, and a third opening OP3 overlapping the third emission area EA3. Here, the openings OP1, OP2, and OP3 may correspond to the emission areas EA1, EA2, and EA3. For example, the first opening OP1 may correspond to the first emission area EA1, the second opening OP2 may correspond to the second emission area EA2, and the third opening OP3 may correspond to the third emission area EA3.

The partition wall PW may serve to provide a space for forming the light scattering layer WSL. To this end, the partition wall PW may have a thickness. For example, the thickness of the partition wall PW may be in the range of about 1 μm to about 10 μm. The partition wall PW may contain an organic insulating material to have a thickness. The organic insulating material may contain, for example, epoxy resin, acrylic resin, cardo resin or imide resin.

The light scattering layer WSL may be disposed on each of the openings OP1, OP2, and OP3. The light scattering layer WSL may be disposed in each of the openings OP1, OP2, and OP3, and may be disposed to be spaced apart from each other. The light scattering layer WSL may be formed in a pattern of islands spaced apart from each other. For example, the light scattering layer WSL may be disposed in each of the first opening OP1, the second opening OP2, and the third opening OP3 in a one-to-one correspondence. Further, the light scattering layer WSL may be disposed to overlap each of the first emission area EA1, the second emission area EA2, and the third emission area EA3. In an embodiment, each of the light scattering layer WSL may completely overlap the first emission area EA1, the second emission area EA2, and the third emission area EA3. However, the disclosure is not limited thereto, and the light scattering layer WSL may be formed in a linear pattern extending in one direction or in a direction.

The light scattering layer WSL may scatter lights emitted from the light emitting elements ED to be incident on the color filters CF1, CF2, and CF3. The light scattering layer WSL may contain a base resin BRS and a scatterer SCP. The base resin BRS may contain a transparent organic material. For example, the base resin BRS may contain epoxy resin, acrylic resin, cardo resin, or imide resin. The scatterer SCP may be a metal oxide particle or an organic particle. Examples of the metal oxide may include titanium oxide ($TiO_2$), zirconium oxide ($ZrO_2$), aluminum oxide ($Al_2O_3$), indium oxide ($In_2O_3$), zinc oxide ($ZnO$), tin oxide ($SnO_2$), and the like within the spirit and the scope of the disclosure. Examples of a material of the organic particles may include acrylic resin and urethane resin, and the like within the spirit and the scope of the disclosure.

The light blocking member BK and the color filters CF1, CF2, and CF3 may be disposed on the partition wall PW and the light scattering layer WSL. The light blocking member BK may be disposed on or directly disposed on the partition wall PW, and the color filters CF1, CF2, and CF3 may be respectively disposed to correspond to the light scattering layer WSL. Descriptions thereof are the same as those described above with reference to the embodiment of FIG. 28.

FIGS. 30 to 36 show some steps of a process of transferring light emitting elements during the manufacturing process of a display device according to one embodiment.

Referring to FIGS. 30 to 36, in the process of transferring the light emitting elements ED using the transfer film TL during the manufacturing process of the display device 10 according to one embodiment, a process of adjusting the distance between the light emitting elements ED using transfer films TL1, TL2, and TL3 may be further performed.

Figure 30:
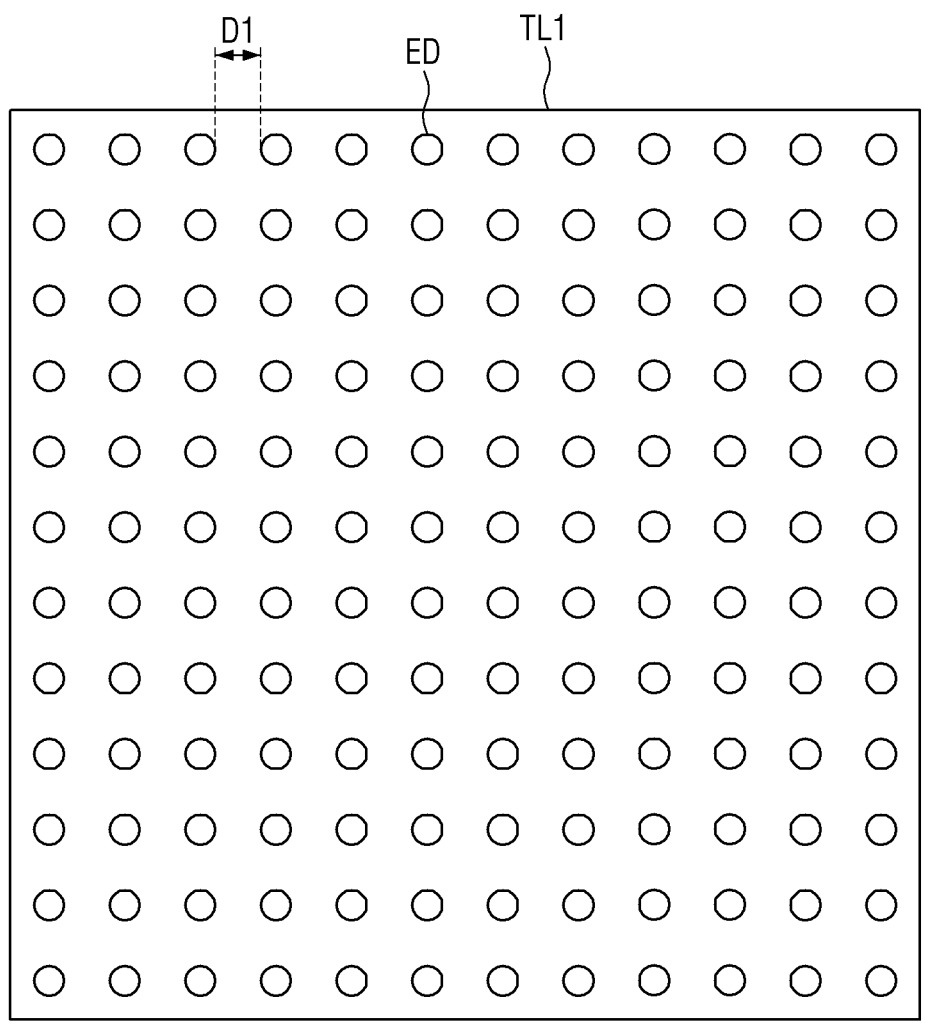
FIGS. 30 to 36 show some steps of a process of transferring light emitting elements during the manufacturing process of a display device according to one embodiment.
Figure 31:
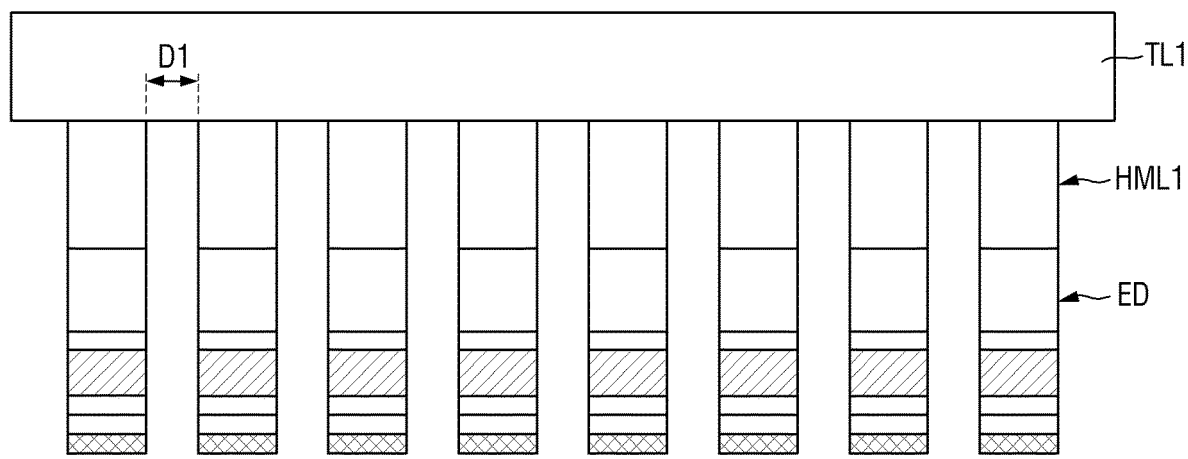

First, as shown in FIGS. 30 and 31, the light emitting elements ED transferred onto the first transfer film TL1 may be disposed to be spaced apart from each other by a first distance D1. In case that the light emitting elements ED spaced apart from each other by the first distance D1 are transferred onto the first substrate 110, the number of light emitting elements ED disposed per area of the emission areas EA1, EA2, and EA3 may be excessive. Since the light emitting elements ED are spaced apart from each other by the first distance D1 that is relatively narrow, the number of light emitting elements ED per unit area of the first transfer film TL1 may be larger than the number of light emitting elements ED per unit area of each of the emission areas EA1, EA2, and EA3. As described above, the transfer film TL may be made of a stretchable material, so that the distance between the light emitting elements ED may be increased by stretching the first transfer film TL1.

Figure 32:
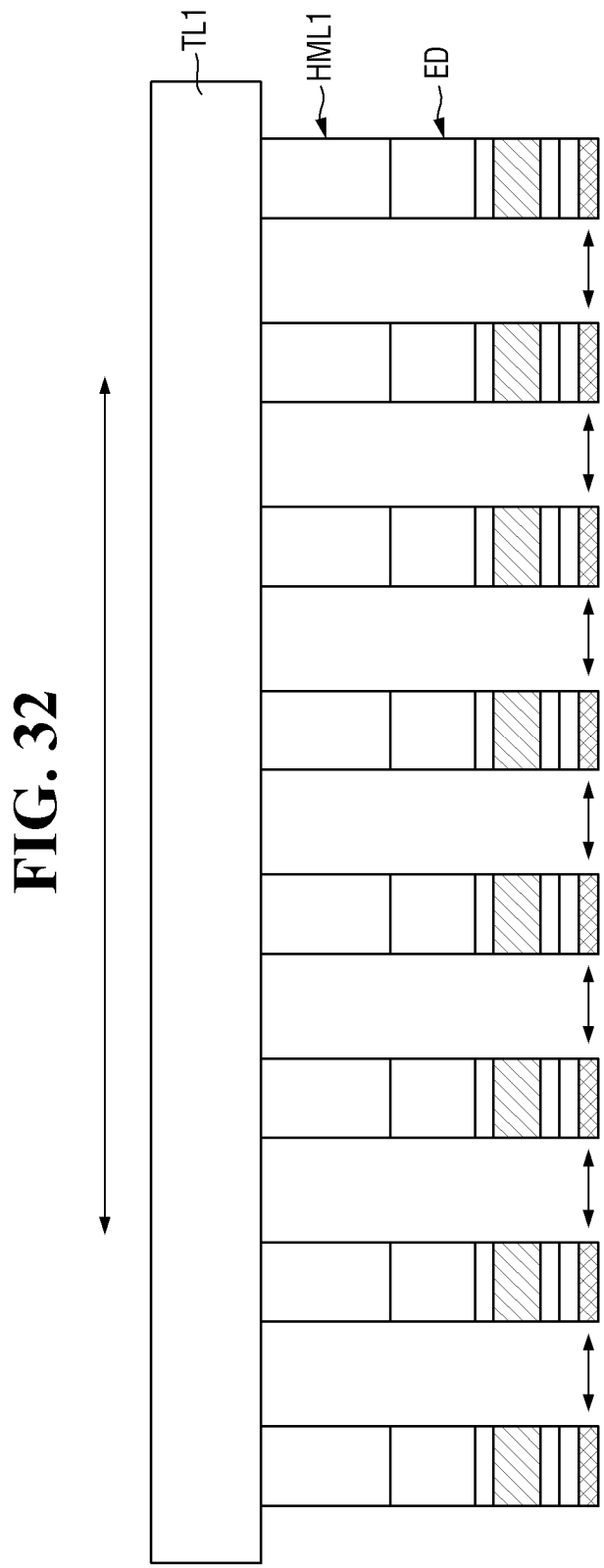
Figure 33:
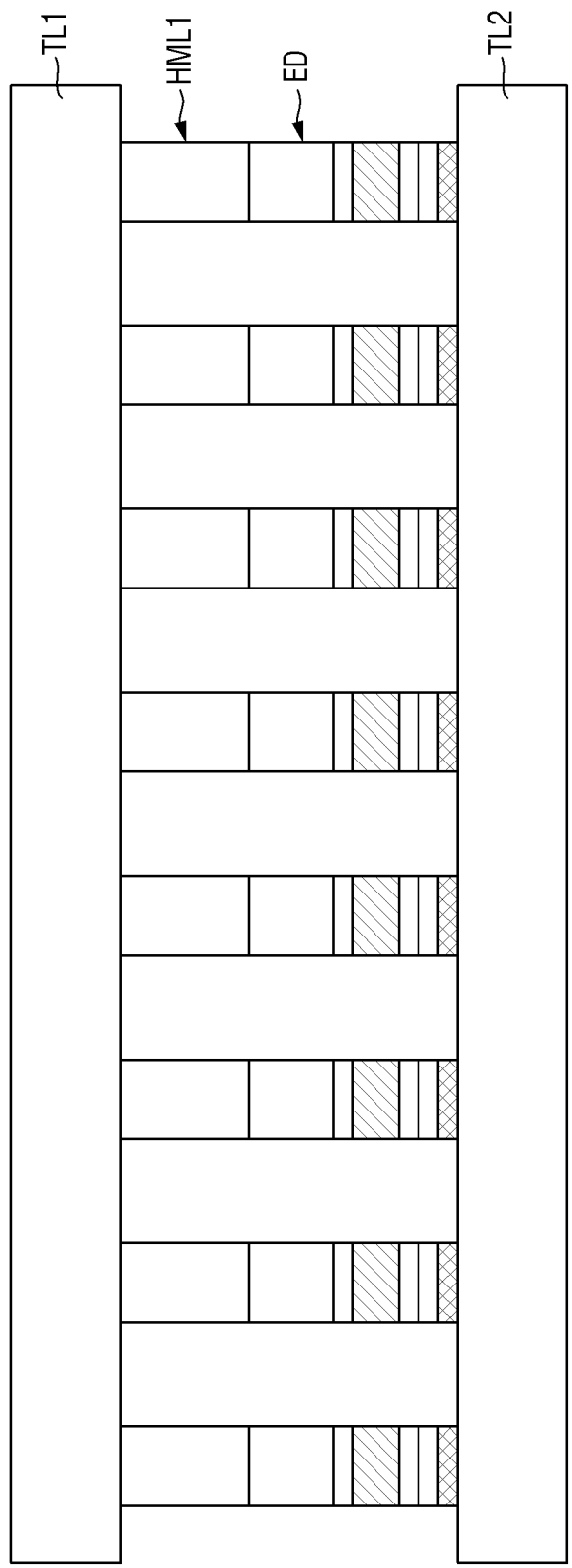

As illustrated in FIGS. 32 and 33, the first transfer film TL1 is stretched in one direction or a direction and the other direction or another direction to increase the distance between the light emitting elements ED (see FIG. 32). In that state, the light emitting elements ED disposed on the first transfer film TL1 are transferred to the second transfer film TL2. The light emitting elements ED transferred onto the second transfer film TL2 may be disposed at the distance wider than the first distance D1 in a state where the second transfer film TL2 is not stretched.

Figure 34:
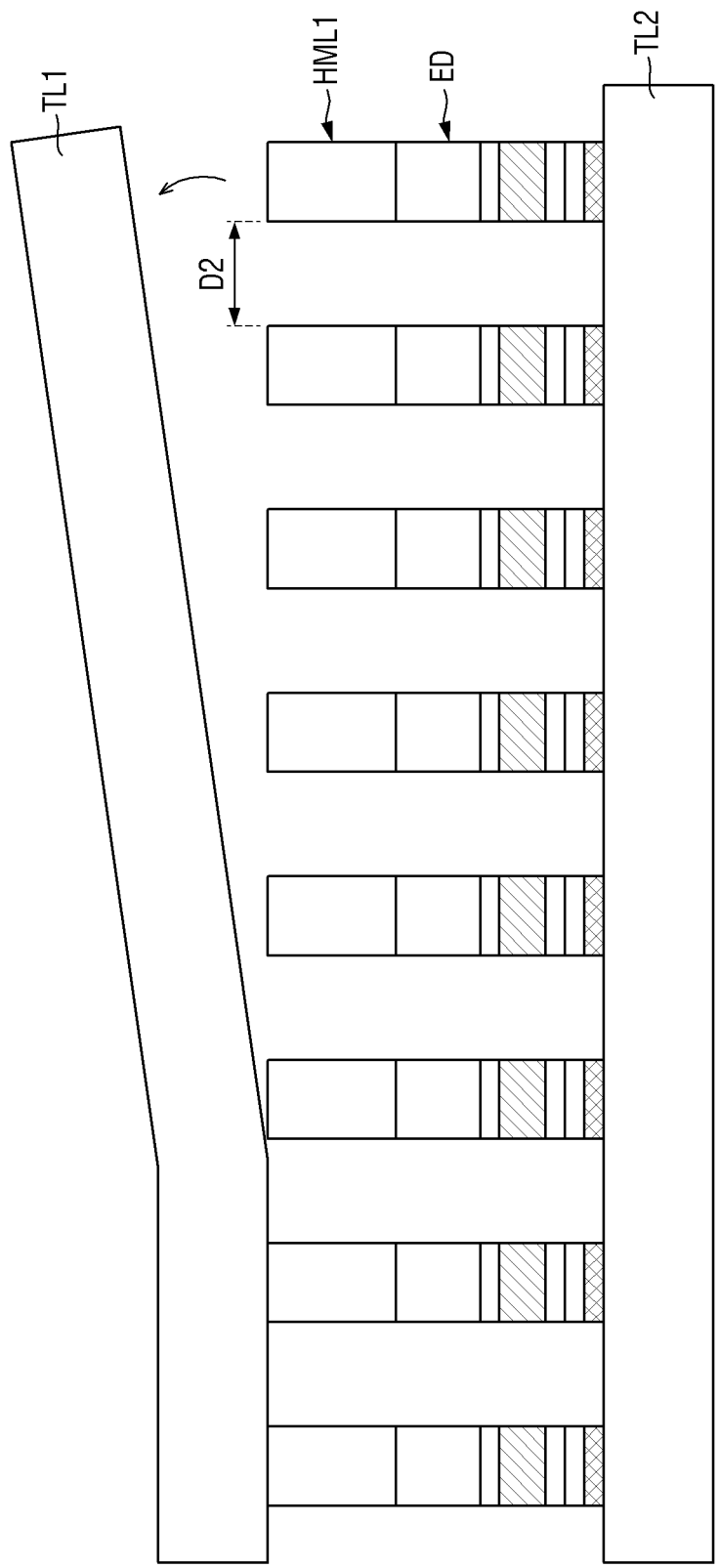
Figure 35:
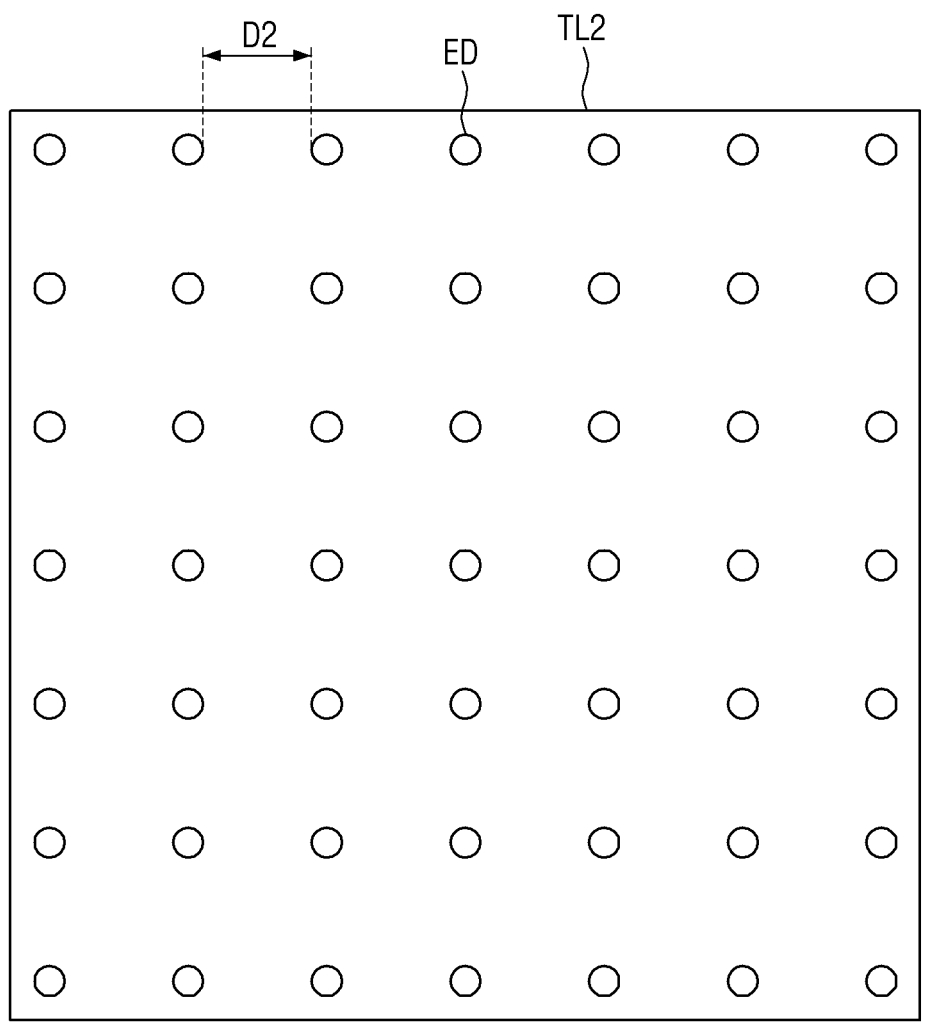

As illustrated in FIGS. 34 and 35, the light emitting elements ED may be disposed on the second transfer film TL2 while being spaced apart from each other by a second distance D2 greater than the first distance D1. Since the light emitting elements ED are transferred in a state where the connection electrodes BMT are disposed on or directly disposed on the second transfer film TL2, re-transfer may be required so that opposite ends of the light emitting elements ED or the hard mask layer HML1 is disposed on or directly disposed on another transfer film.

Figure 36:
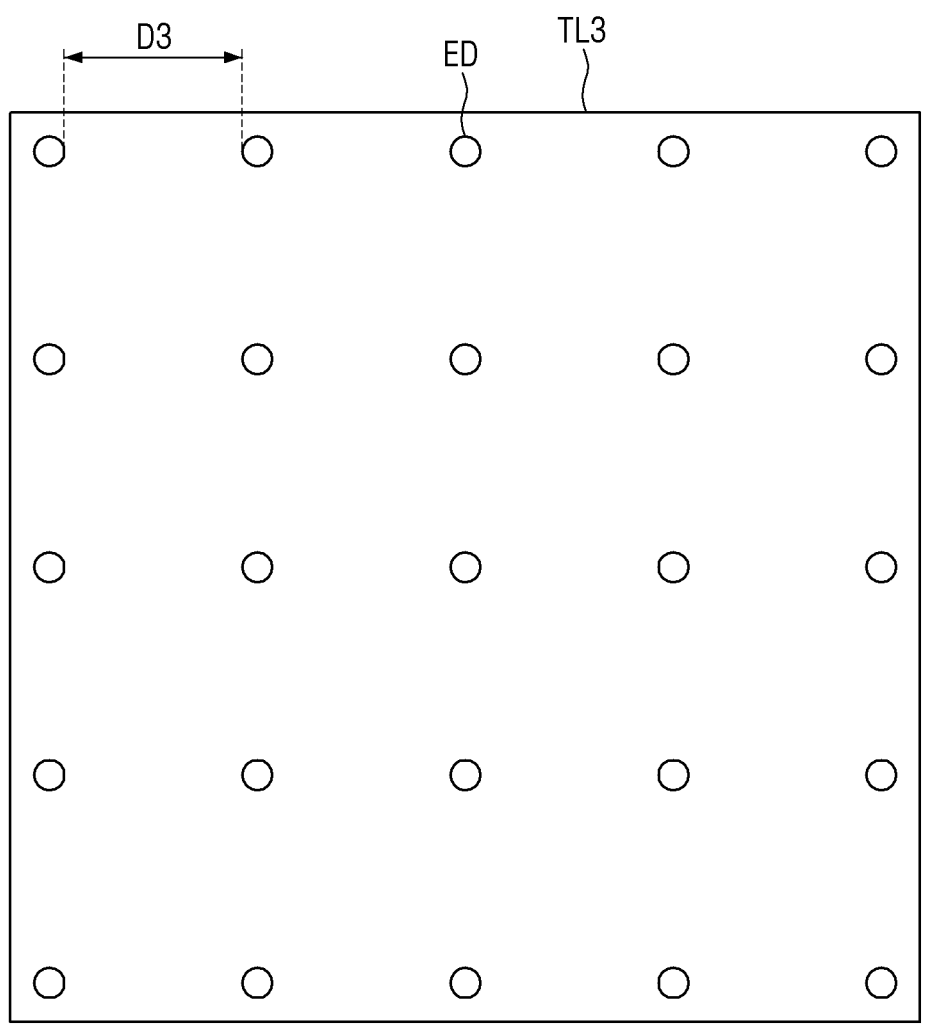

Although not specifically illustrated in the drawing, the distance between the light emitting elements ED may be further increased by repeating the above-described processes. As shown in FIG. 36, the light emitting elements ED may be spaced apart from each other by a third distance D3 greater than the second gap D2 on the third transfer film TL3. The light emitting elements ED formed on the temporary substrate TSUB by the above-described processes may be spaced apart from each other by appropriate distances corresponding to the areas of the emission areas EA1, EA2, and EA3 of the first substrate 110.

Figure 37:
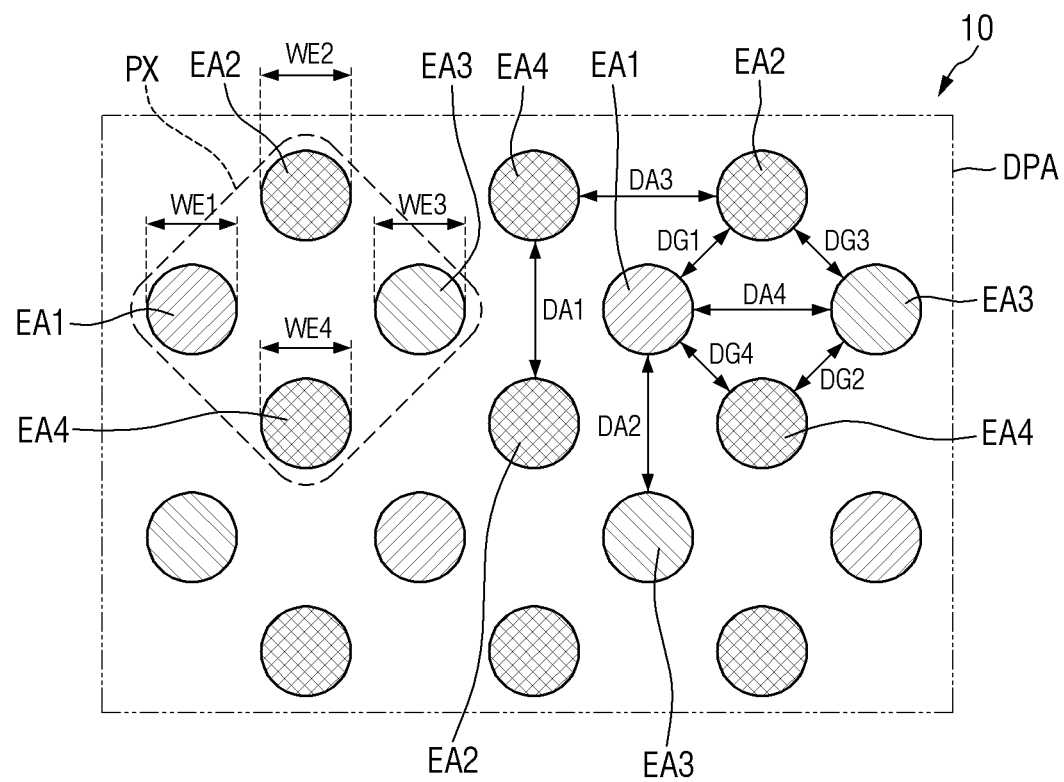
FIG. 37 is a schematic plan view illustrating relative arrangement of emission areas disposed in the display area of a display device according to one embodiment.

FIG. 37 is a schematic plan view illustrating relative arrangement of emission areas disposed in the display area of a display device according to one embodiment.

Referring to FIG. 37, in the display device 10 according to one embodiment, each of the pixels PX may include four emission areas EA1, EA2, EA3, and EA4, the emission areas EA1, EA1, EA2, EA3, and EA4 may be arranged to be spaced apart from each other in the first direction DR1 and the second direction DR2, and the emission areas EA1, EA2, EA3, EA4 that are most adjacent to each other may be spaced apart from each other in diagonal directions DD1 and DD2 between the first direction DR1 and the second direction DR2. The embodiment is different from the embodiment of FIG. 2 in that the number of emission areas EA1, EA1, EA2, EA3, and EA4 constituting one pixel PX and the arrangement of the emission areas EA1, EA1, EA2, EA3, and EA4 are different. In the following description, redundant description will be omitted while focusing on differences.

Each of the pixels PX may include the first emission area EA1 emitting light of the first color, the second emission area EA2 emitting light of the second color, the third emission area EA3 emitting light of the third color, and a fourth emission area EA4 emitting light of the second color. Unlike the embodiment of FIG. 2, each of the emission areas EA1, EA2, EA3, and EA4 may have a circular shape in a plan view. Although not shown in the drawing, different light emitting elements ED (ED1 to ED9) may be disposed in each of the emission areas EA1, EA2, EA3, and EA4, and only some of them may emit light.

For example, the first light emitting element ED1, the second light emitting element ED2, and the third light emitting element ED3 may be disposed in the first emission area EA1. The mask layer ML may not be disposed on the first light emitting element ED1, and the mask layer ML may be disposed on the second light emitting element ED2 and the third light emitting element ED3. The first light emitting element ED1 may be the first type light emitting element that is electrically connected to the cathode electrode CE in the first emission area EA1 and emits light, and the second light emitting element ED2 and the third light emitting element ED3 may be the second type light emitting elements that are not electrically connected to the cathode electrode CE in the first emission area EA1 and do not emit light.

The fourth light emitting element ED4, the fifth light emitting element ED5, and the sixth light emitting element ED6 may be disposed in the second emission area EA2 and the fourth emission area EA4. The mask layer ML may not be disposed on the fifth light emitting element ED5, and the mask layer ML may be disposed on the fourth light emitting element ED4 and the sixth light emitting element ED6. The fifth light emitting element ED5 may be the first type light emitting element that is electrically connected to the cathode electrode CE in the second emission area EA2 and emits light, and the fourth light emitting element ED4 and the sixth light emitting element ED6 may be the second type light emitting elements that are not electrically connected to the cathode electrode CE in the second emission area EA2 and do not emit light. The fourth emission area EA4 may be substantially the same as the second emission area EA2.

The seventh light emitting element ED7, the eighth light emitting element ED8, and the ninth light emitting element ED9 may be disposed in the third emission area EA3. The mask layer ML may not be disposed on the ninth light emitting element ED9, and the mask layer ML may be disposed on the seventh light emitting element ED7 and the eighth light emitting element ED8. The ninth light emitting element ED9 may be the first type light emitting element that is electrically connected to the cathode electrode CE in the third emission area EA3 and emits light, and the seventh light emitting element ED7 and the eighth light emitting element ED8 may be the second type light emitting elements that are not electrically connected to the cathode electrode CE in the third emission area EA3 and do not emit light.

In the display area DPA, the first emission areas EA1 and the third emission areas EA3 may be alternately disposed in the first direction DR1 and the second direction DR2. The second emission areas EA2 and the fourth emission areas EA4 may also be alternately disposed in the first direction DR1 and the second direction DR2. The first emission areas EA1, the second emission areas EA2, the third emission areas EA3, and the fourth emission areas EA4 may be alternately disposed in the diagonal directions DD1 and DD2 between the first direction DR1 and the second direction DR2. The diagonal directions DD1 and DD2 may be oblique directions inclined from the first direction DR1 and the second direction DR2.

For example, in each of the pixels PX, the first emission area EA1 and the second emission area EA2 may be alternately disposed in the first diagonal direction DD1 between one side or a side of the first direction DR1 and one side or a side of the second direction DR2, and the third emission area EA3 and the fourth emission area EA4 may be alternately disposed in the diagonal direction DD1. In each of the pixels PX, the first emission area EA1 and the fourth emission area EA4 may be alternately disposed in the second diagonal direction DD2 between one side or a side of the first direction DR1 and the other side of the second direction DR2, and the second emission area EA2 and the third emission area EA3 may be alternately disposed in the second diagonal direction DD2. The first diagonal direction DD1 and the second diagonal direction DD2 may intersect each other.

In one embodiment, the first emission area EA1, the second emission area EA2, the third emission area EA3, and the fourth emission area EA4 may have a same area or diameter. For example, a first diameter WE1 of the first emission area EA1, a second diameter WE2 of the second emission area EA2, a third diameter WE3 of the third emission area EA3, and a fourth diameters WE4 of the fourth emission area EA4 may be the same. Also in the embodiment of FIG. 2, the areas of the first to third emission areas EA1, EA2, and EA3 may be the same. However, the disclosure is not limited thereto. In an embodiment, the emission areas EA1, EA2, EA3, and EA4 may have different diameters.

Distances DA1 and DA3 between the second emission area EA2 and the fourth emission area EA4 adjacent to each other may be the same as distances DA2 and DA4 between the first emission area EA1 and the third emission area EA3 adjacent to each other. For example, a first distance DA1 between the second emission area EA2 and the fourth emission area EA4 adjacent in the first direction DR1 may be the same as a second distance DA2 between the first emission area EA1 and the third emission area EA3 adjacent in the first direction DR1. A third distance DA3 between the second emission area EA2 and the fourth emission area EA4 adjacent in the second direction DR2 may be the same as a fourth distance DA4 between the first emission area EA1 and the third emission area EA3 adjacent in the second direction DR2. Further, a first diagonal distance DG1 between the first emission area EA1 and the second emission area EA2 adjacent in the first diagonal direction DD1 may be the same as a second diagonal distance DG2 between the third emission area EA3 and the fourth emission area EA4 adjacent in the first diagonal direction DD1. A third diagonal distance DG3 between the second emission area EA2 and the third emission area EA3 adjacent in the second diagonal direction DD2 may be the same as a fourth diagonal distance DG4 between the first emission area EA1 and the fourth emission area EA4 adjacent in the second diagonal direction DD2. However, the disclosure is not limited thereto. The distances between the emission areas EA1, EA1, EA2, EA3, and EA4 adjacent to each other may vary depending on the arrangement and diameters of the emission areas EA1, EA1, EA2, EA3, and EA4.

Although it is illustrated in the drawing that the first emission area EA1 emits red light of the first color, the second emission area EA2 and the fourth emission area EA4 emit green light of the second color, and the third emission area EA3 emits blue light of the third color, but the disclosure is not limited thereto. In an embodiment, the first emission area EA1 may emit red light of the first color, the second emission area EA2 and the fourth emission area EA4 may emit blue light of the third color, and the third emission area EA3 may emit green light of the second color. As an example, the first emission area EA1 may emit green light of the second color, the second emission area EA2 and the fourth emission area EA4 may emit red light of the first color, and the third emission area EA3 may emit blue light of the third color. As an example, the fourth emission area EA4 may emit yellow light of a fourth color different from the first to third colors. The yellow light of the fourth color may have a central wavelength band in a range of about 550 nm to about 600 nm, but is not limited thereto. Each of the emission areas EA1, EA2, EA3, and EA4 may include different kinds and types of light emitting elements ED depending on the wavelength band of light to be emitted.

Although it is illustrated in the drawing that each of the first to fourth emission areas EA1, EA2, EA3, and EA4 has a circular shape in a plan view, the disclosure is not limited thereto. As described above, each of the emission areas EA1, EA1, EA2, EA3, and EA4 may have a polygonal shape such as a triangular shape, a quadrangular shape, a pentagonal shape, a hexagonal shape, and an octagonal shape, an elliptical shape, or an atypical shape.

FIG. 37 illustrates that the distances DA1 to DA4 and DG1 to DG4 between the first to fourth emission areas EA1, EA2, EA3 and EA4 are the shortest distances with respect to the outer parts of the emission areas EA1, EA2, EA3 and EA4. However, the disclosure is not limited thereto. The distances DA1 to DA4 and DG1 to DG4 between the emission areas EA1, EA2, EA3, and EA4 may be illustrated with respect to the centers of the emission areas EA1, EA2, EA3, and EA4.

Figure 38:
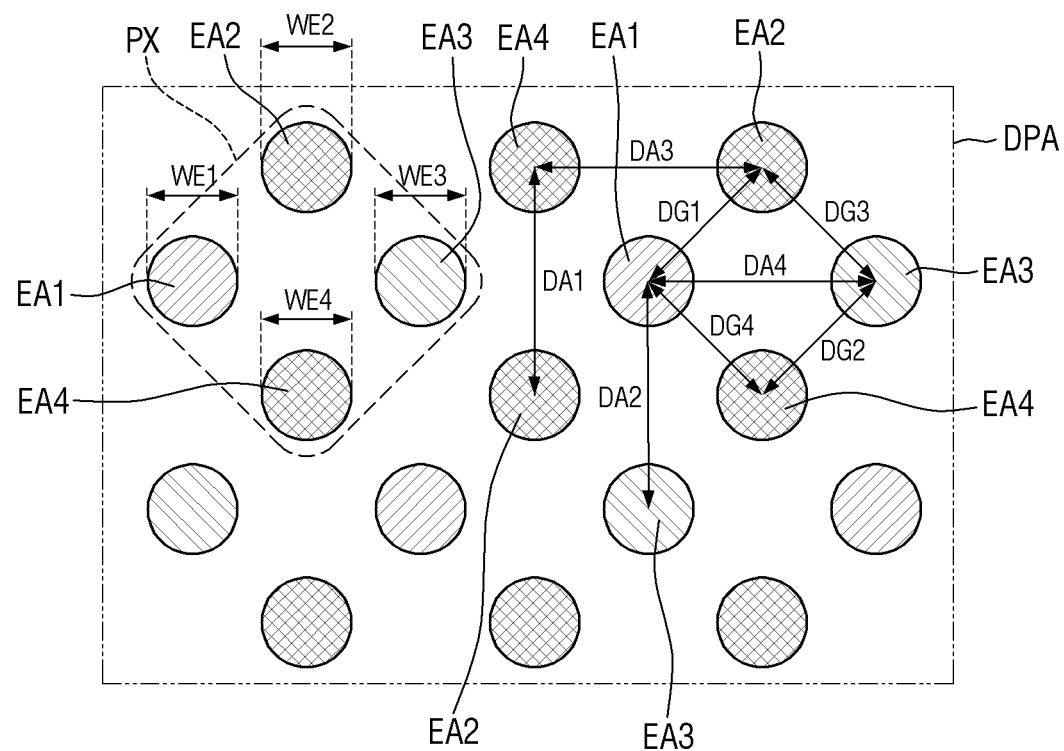
FIG. 38 is a schematic plan view illustrating relative arrangement of emission areas disposed in the display area of a display device according to one embodiment.
Figure 38:
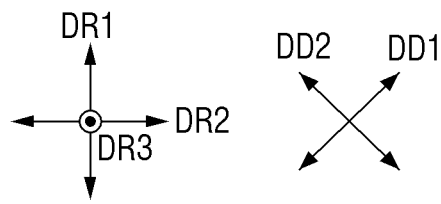

FIG. 38 is a schematic plan view illustrating relative arrangement of emission areas disposed in the display area of a display device according to one embodiment.

Referring to FIG. 38 in addition to FIG. 37, the distances DA1 and DA3 between the center of the second emission area EA2 and the center of the fourth emission area EA4 adjacent to each other may be the same as the distances DA2 and DA4 between the center of the first emission areas EA1 and the center of the third emission area EA3 adjacent to each other. For example, the first distance DA1 between the center of the second emission area EA2 and the center of the fourth emission area EA4 adjacent in the first direction DR1 may be the same as the second distance DA2 between the center of the first emission area EA1 and the center of the third emission area EA3 adjacent in the first direction DR1. The third distance DA3 between the center of the second emission area EA2 and the center of the fourth emission area EA4 adjacent in the second direction DR2 may be the same as the fourth distance DA4 between the center of the first emission area EA1 and the center of the third emission area EA3 adjacent in the second direction DR2. Further, the first diagonal distance DG1 between the center of the first emission area EA1 and the center of the second emission area EA2 adjacent in the first diagonal direction DD1 may be the same as the second diagonal distance DG2 between the center of the third emission area EA3 and the center of the fourth emission area EA4 adjacent in the first diagonal direction DD1. The third diagonal distance DG3 between the center of the second emission area EA2 and the center of the third emission area EA3 adjacent in the second diagonal direction DD2 may be the same as the fourth diagonal distance DG4 between the center of the first emission area EA1 and the center of the fourth emission area EA4 adjacent in the second diagonal direction DD2.

Although the embodiment has described the case in which the distances DA1 to DA4 and DG1 to DG4 between the centers of the emission areas EA1, EA2, EA3, and EA4 are the same, the disclosure is not limited thereto. The distances between the centers of the emission areas EA1, EA2, EA3, and EA4 may also be modified in a similar manner as that described above with reference to the embodiment of FIG. 37.

Figure 39:
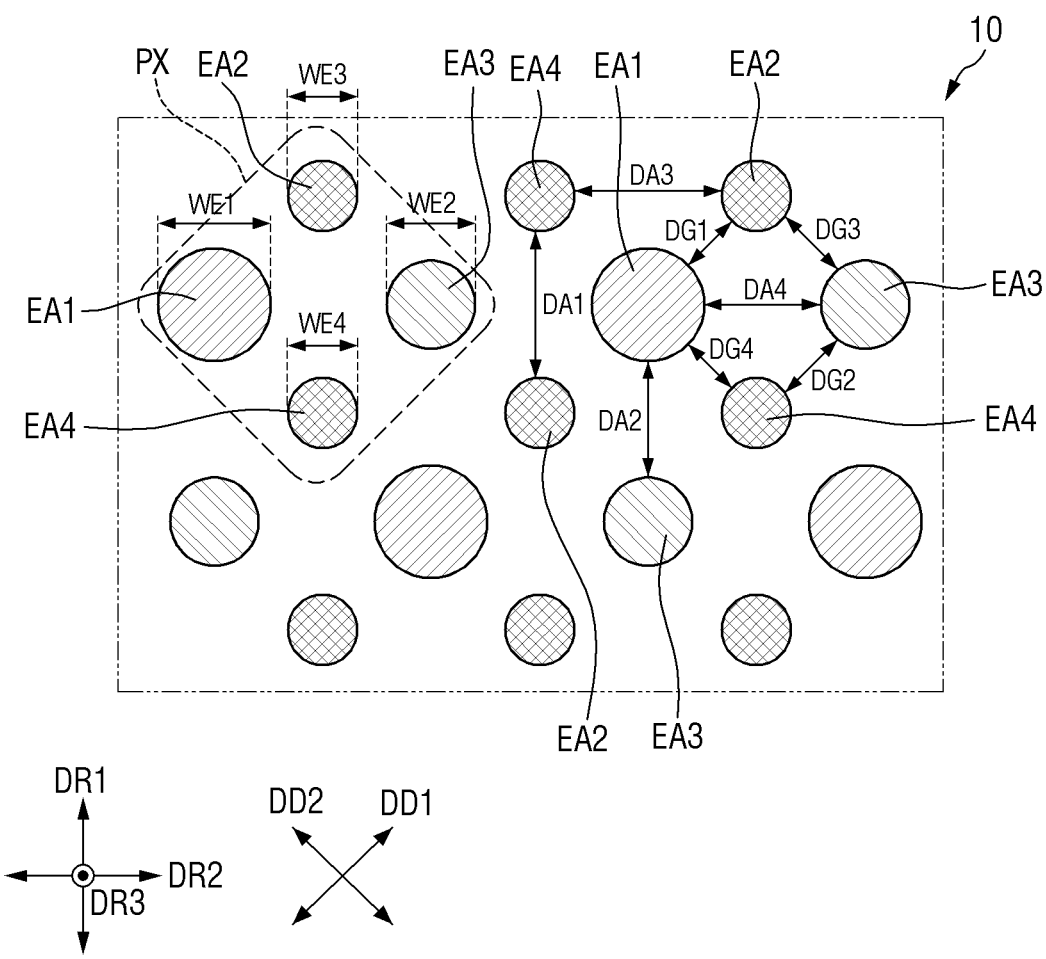
FIGS. 39 and 40 are schematic plan views illustrating relative arrangement of emission areas disposed in the display area of a display device according to one embodiment.
Figure 40:
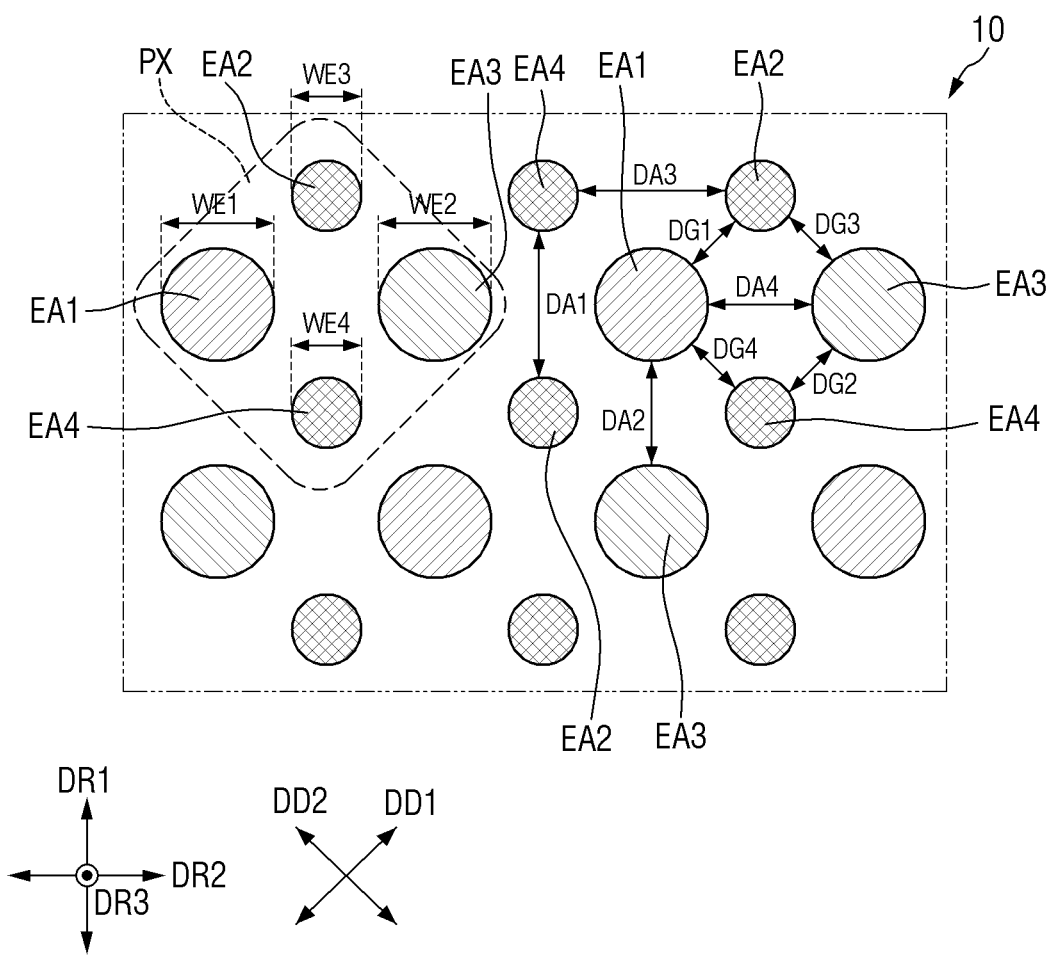

FIGS. 39 and 40 are schematic plan views illustrating relative arrangement of emission areas disposed in the display area of a display device according to one embodiment.

Referring to FIGS. 39 and 40, in the display device 10 according to one embodiment, the emission areas EA1, EA2, EA3, and EA4 may have different sizes. In the display device 10 of FIG. 39, the first diameter WE1 of the first emission area EA1 may be greater than the diameter WE2 of the second emission area EA2, the diameter WE3 of the third emission area EA3, and the diameter WE4 of the fourth emission area EA4, and the third diameter WE3 of the third emission area EA3 may be greater than the diameter WE2 of the second emission area EA2 and the diameter WE4 of and the fourth emission area EA4. The second diameter WE2 of the second emission area EA2 may be the same as the fourth diameter WE4 of the fourth emission area EA4. The embodiment of FIG. 40 is different from the embodiment of FIG. 39 in that the first diameter WE1 of the first emission area EA1 is the same as the third diameter WE3 of the third emission area EA3.

In the manufacturing process of the display device 10, each of the emission areas EA1, EA1, EA2, EA3, and EA4 may have a diameter corresponding to the size of the opening of the bank layer BNL. In the manufacturing process of the display device 10, the size of the opening of the bank layer BNL may be adjusted to be different to adjust the area or diameter of each of the emission areas EA1, EA1, EA2, EA3, and EA4. Accordingly, the distances between the emission areas EA1, EA1, EA2, EA3, and EA4 adjacent to each other may be partially different.

For example, the first distance DA1 between the second emission area EA2 and the fourth emission area EA4 adjacent in the first direction DR1 may be greater than the second distance DA2 between the first emission area EA1 and the third emission area EA3 adjacent in the first direction DR1. The third distance DA3 between the second emission area EA2 and the fourth emission area EA4 adjacent in the second direction DR2 may be greater than the fourth distance DA4 between the first emission area EA1 and the third emission area EA3 adjacent in the second direction DR2. Further, the first diagonal distance DG1 between the first emission area EA1 and the second emission area EA2 adjacent in the first diagonal direction DD1 may be different from the second diagonal distance DG2 between the third emission area EA3 and the fourth emission area EA4 adjacent in the first diagonal direction DD1. The third diagonal distance DG3 between the second emission area EA2 and the third emission area EA3 adjacent in the second diagonal direction DD2 may be different from the fourth diagonal distance DG4 between the first emission area EA1 and the fourth emission area EA4 adjacent in the second diagonal direction DD2.

In the embodiment in which the first diameter WE1 of the first emission area EA1 is greater than the third diameter WE3 of the third emission area EA3, the first diagonal distance DG1 may be smaller than (or less than) the second diagonal distance DG2, and the third diagonal distance DG3 may be greater than the fourth diagonal distance DG4. However, the disclosure is not limited thereto. The distances between the emission areas EA1, EA1, EA2, EA3, and EA4 adjacent to each other may vary depending on the arrangement and diameters of the emission areas EA1, EA1, EA2, EA3, and EA4. For example, in the embodiment in which the first diameter WE1 of the first emission area EA1 is the same as the third diameter WE3 of the third emission area EA3, the first diagonal distance DG1 may be the same as the second diagonal distance DG2, and the third diagonal distance DG3 may be the same as the fourth diagonal distance DG4.

Although it is illustrated in the drawing that the first emission area EA1 and the third emission area EA3 emit red light of the first color and blue light of the third color, respectively, and the second emission area EA2 and the fourth emission area EA4 emit green light of the second color, the disclosure is not limited thereto. Similar to the above-described embodiments, the areas and diameters of the emission areas EA1, EA2, EA3, and EA4, the distances therebetween, and the colors of lights emitted from the emission areas EA1, EA1, EA2, EA3, and EA4 may be variously modified.

Although the distances illustrated with respect to the outer parts of the emission areas EA1, EA2, EA3, and EA4 have been described as the distances DA1 to DA4 and DG1 to DG4 between the emission areas EA1, EA2, EA3, and EA4 in FIGS. 39 and 40, the disclosure is not limited thereto. Similar to the embodiment of FIG. 38, the distances between the emission areas EA1, EA2, EA3, and EA4 described in FIGS. 39 and 40 may be applied in the same manner even in the case of comparing the distances therebetween with respect to the centers of the emission areas EA1, EA2, EA3 and EA4. However, in the embodiment in which the emission areas EA1, EA2, EA3, and EA4 have different diameters, the magnitude relationship between the distances with respect to the outer parts of the emission areas EA1, EA2, and EA3 and the distances with respect to the centers of the emission areas EA1, EA2, EA3, and EA4 may be different. A display device for displaying an image according to one embodiment may be applied to various apparatuses and devices.

Figure 41:
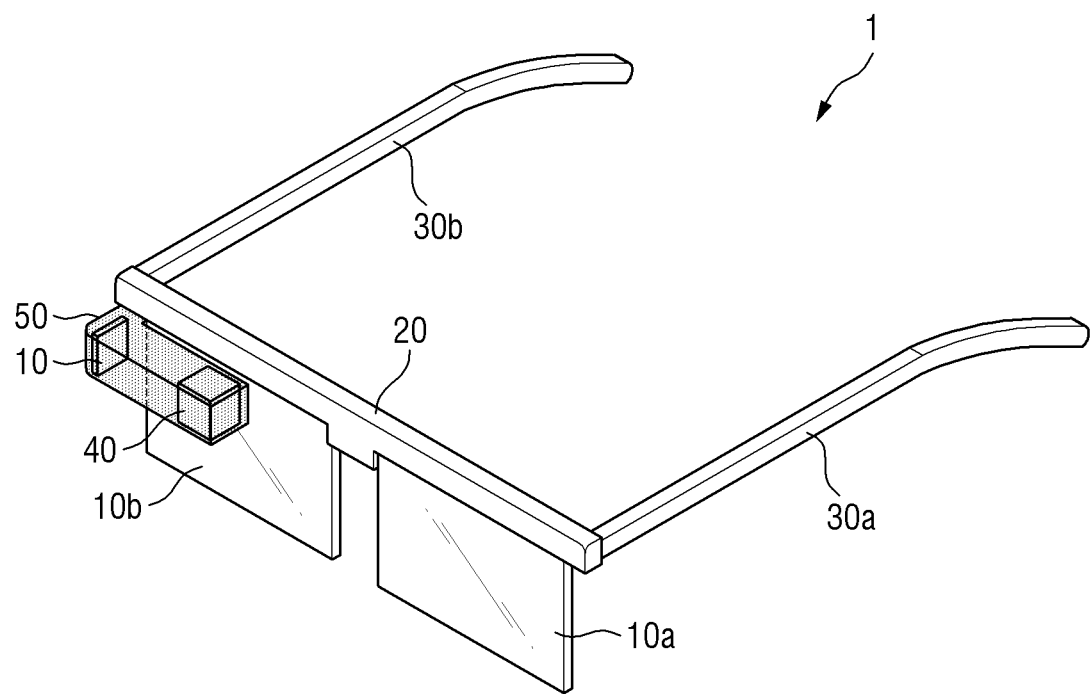
FIGS. 41 to 43 are schematic views showing a device including a display device according to one embodiment.
Figure 42:
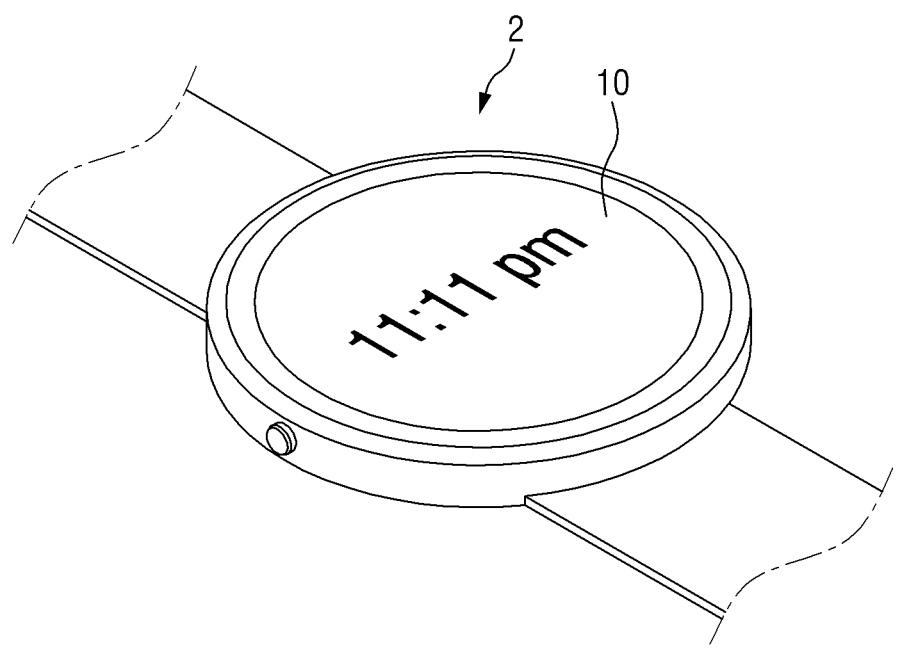
Figure 43:
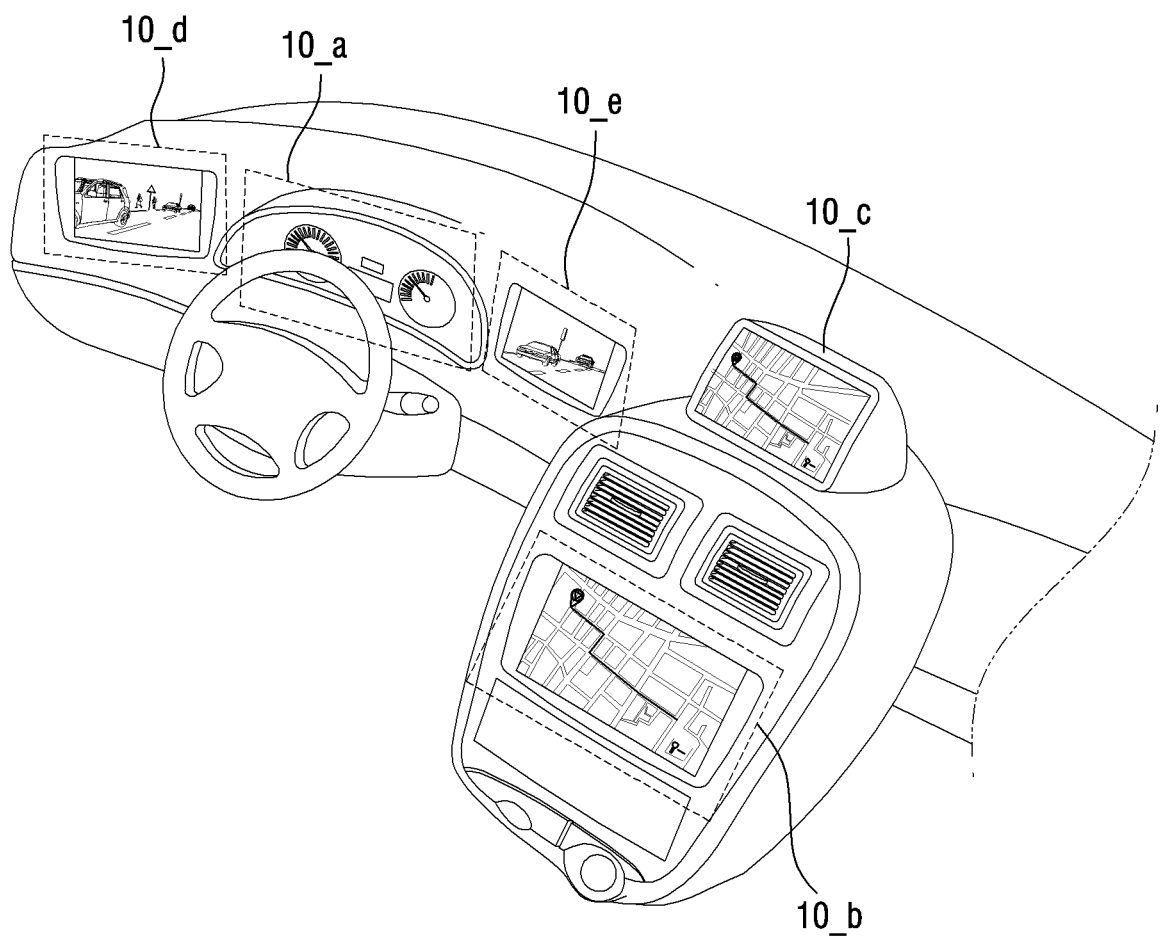

FIGS. 41 to 43 are schematic views showing a device including a display device according to one embodiment.

FIG. 41 shows a virtual reality device 1 to which the display device 10 according to one embodiment is applied, and FIG. 42 shows a smart watch 2 to which the display device 10 according to one embodiment is applied. FIG. 43 shows that display devices 10_a, 10_b, 10_c, 10_d, and 10_e according to one embodiment are applied to the display unit (or display) of an automobile.

Referring to FIG. 41, the virtual reality device 1 according to one embodiment may be a glass-type device. The virtual reality device 1 according to one embodiment may include the display device 10, a left lens 10a, a right lens 10b, a support frame 20, temples 30a and 30b, a reflection member 40, and a display device storage 50.

Although the virtual reality device 1 including the temples 30a and 30b is illustrated, the virtual reality device 1 according to one embodiment may be applied to a head mounted display including a head mounted band that may be worn on a head, instead of the temples 30a and 30b. The virtual reality device 1 according to one embodiment is not limited to the structure shown in the drawing, and may be applied in various forms to various electronic devices.

The display device storage 50 may include the display device 10 and the reflection member 40. The image displayed on the display device 10 may be reflected by the reflection member 40 and provided to a user's right eye through the right lens 10b. Accordingly, the user can view the virtual reality image displayed on the display device 10 through the right eye.

The display device storage 50 may be, but not necessarily, disposed at the right end of the support frame 20. For example, the display device storage 50 may be disposed at the left end of the support frame 20, and the image displayed on the display device 10 may be reflected by the reflection member 40 and provided to a user's left eye through the left lens 10a. Accordingly, the user can view the virtual reality image displayed on the display device 10 through the left eye. As an example, the display device storage 50 may be disposed at both the left end and the right end of the support frame 20. In that case, the user can view the virtual reality image displayed on the display device 10 through both the left eye and the right eye.

Referring to FIG. 42, the display device 10 according to one embodiment may be applied to the smart watch 2 that is one of the smart devices.

Referring to FIG. 43, the display devices 10_a, 10_b, and 10_c according to one embodiment may be applied to the dashboard of the automobile, the center fascia of the automobile, or the center information display (CID) of the dashboard of the automobile. Further, the display devices 10_d, and 10_e according to one embodiment may be applied to a room mirror display instead of side mirrors of the automobile.

Figure 44:
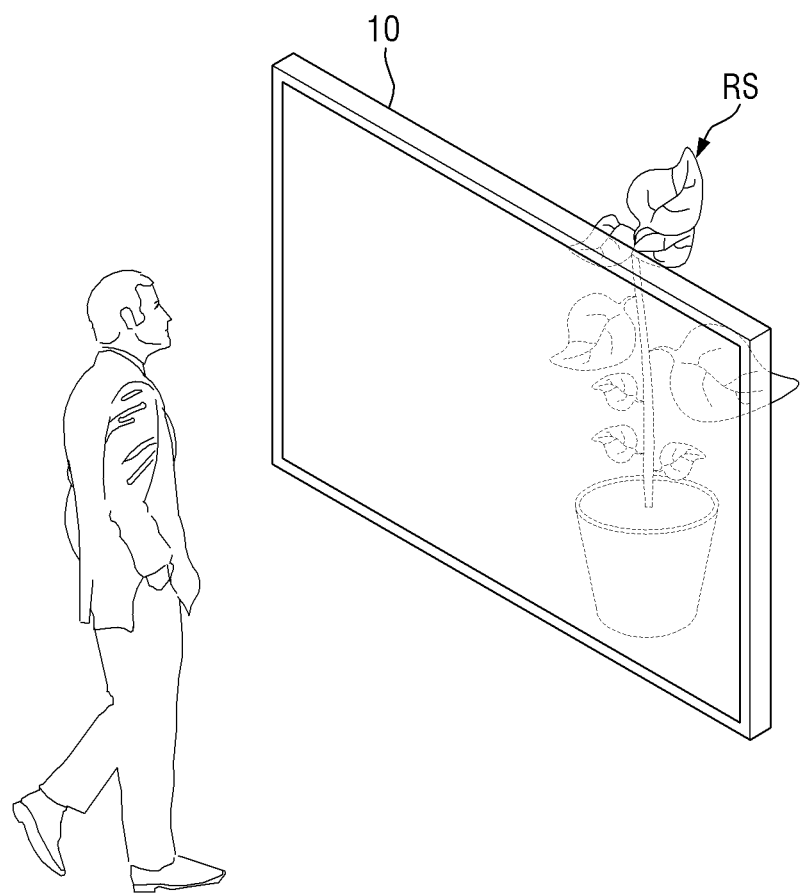
FIGS. 44 and 45 show a transparent display device including a display device according to one embodiment.
Figure 45:
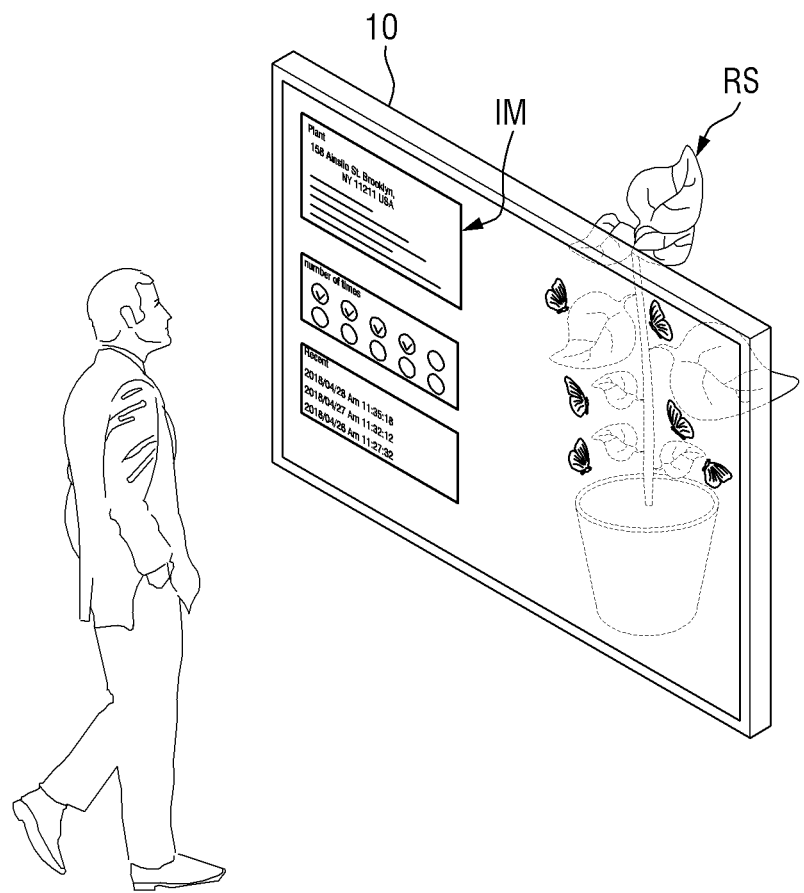

FIGS. 44 and 45 show a transparent display device including a display device according to one embodiment.

Referring to FIGS. 44 and 45, the display device 10 according to one embodiment may be applied to the transparent display device. The transparent display device may display an image IM, and also may transmit light. A user located on the front side of the transparent display device can view an object RS or a background on the rear side of the transparent display device as well as the image IM displayed on the display device 10.

In concluding the detailed description, those skilled in the art will appreciate that many variations and modifications can be made to the disclosed embodiments without substantially departing from the disclosure. Therefore, the disclosed embodiments are used in a generic and descriptive sense only and not for purposes of limitation.

What is claimed is:

1. A display device comprising:
    anode electrodes spaced apart from each other on a substrate;
    light emitting elements disposed on the anode electrodes;
    mask layers disposed on some of the light emitting elements;
    an insulating layer disposed on the substrate and the anode electrodes and surrounding the light emitting elements; and
    a cathode electrode disposed on the insulating layer and contacting some of the light emitting elements and the mask layers, wherein the light emitting elements comprise:
        first light emitting elements disposed on a first anode electrode and emitting light of a first color;
        second light emitting elements disposed on the first anode electrode on which the first light emitting elements are disposed and emitting light of a second color; and
        third light emitting elements disposed on the first anode electrode on which the first light emitting elements and the second light emitting elements are disposed and emitting light of a third color, and
    the mask layers comprise:
        a first mask layer disposed on the second light emitting elements; and
        a second mask layer disposed on the third light emitting elements.

2. The display device of claim 1, wherein
    the first mask layer comprises:
        a first base layer; and
        a first upper layer disposed on the first base layer, and
    the second mask layer comprises:
        a second base layer having a thickness greater than a thickness of the first base layer; and
        a second upper layer disposed on the second base layer.

3. The display device of claim 2, wherein
    the first base layer and the second base layer comprises a same material, and
    the first upper layer and the second upper layer comprises a same material.

4. The display device of claim 3, wherein
    the first base layer and the second base layer comprise at least one of silicon oxide, silicon nitride, and silicon oxynitride, and
    the first upper layer and the second upper layer comprise a metal material.

5. The display device of claim 2, wherein
    the cathode electrode directly contacts the first light emitting elements and does not contact the second light emitting elements and the third light emitting elements, and
    the cathode electrode directly contacts each of the first mask layer and the second mask layer.

6. The display device of claim 2, wherein
    the anode electrodes comprise a second anode electrode spaced apart from the first anode electrode,
    the light emitting elements further comprise:
        fourth light emitting elements disposed on the second anode electrode and emitting light of the first color;
        fifth light emitting elements disposed on the second anode electrode and emitting light of the second color; and
        sixth light emitting elements disposed on the second anode electrode and emitting light of the third color, and
    the mask layers further comprise:
        a third mask layer disposed on the fourth light emitting elements; and
        a fourth mask layer disposed on the sixth light emitting elements.

7. The display device of claim 6, wherein a thickness of the third mask layer is greater than a thickness of the fourth mask layer.

8. The display device of claim 7, wherein the third mask layer, the fourth mask layer, and the first base layer comprise a same material.

9. The display device of claim 6, wherein a thickness of the second base layer is greater than a thickness of the fourth mask layer.

10. The display device of claim 6, wherein an interval between any one of the first light emitting elements and any one of the second light emitting elements is different from an interval between another one of the first light emitting elements and another one of the second light emitting elements.

11. The display device of claim 10, wherein an interval between any one of the fourth light emitting elements and any one of the fifth light emitting elements is different from an interval between another one of the fourth light emitting elements and another one of the fifth light emitting elements, and equal to an interval between any one of the first light emitting elements and any one of the second light emitting elements.

12. The display device of claim 2, wherein
the anode electrodes comprise a third anode electrode spaced apart from the first anode electrode,
the light emitting elements further comprise:
    seventh light emitting elements disposed on the third anode electrode and emitting light of the first color;
    eighth light emitting elements disposed on the third anode electrode and emitting light of the second color; and
    ninth light emitting elements disposed on the third anode electrode and emitting light of the third color, and
the mask layers further comprise:
    a fifth mask layer disposed on the seventh light emitting elements; and
    a sixth mask layer disposed on the eighth light emitting elements.

13. The display device of claim 12, wherein
the sixth mask layer comprises:
    a third base layer having a thickness less than a thickness of the fifth mask layer; and
    a third upper layer disposed on the third base layer, and
the third upper layer and the first upper layer comprise a same material.

14. The display device of claim 13, wherein a thickness of the second base layer is greater than a thickness of the third base layer.

* * * * *